(12) United States Patent
Lim et al.

(10) Patent No.: US 8,395,539 B2
(45) Date of Patent: *Mar. 12, 2013

(54) DOUBLE DATA RATE (DDR) COUNTER, ANALOG-TO-DIGITAL CONVERTER (ADC) USING THE SAME, CMOS IMAGE SENSOR USING THE SAME AND METHODS IN DDR COUNTER, ADC AND CMOS IMAGE SENSOR

(75) Inventors: Yong Lim, Suwon-si (KR); Kyoung-Min Koh, Hwaseong-si (KR); Kyung-Min Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 629 days.

This patent is subject to a terminal disclaimer.

(21) Appl. No.: 12/632,168

(22) Filed: Dec. 7, 2009

(65) Prior Publication Data

US 2010/0225796 A1 Sep. 9, 2010

(30) Foreign Application Priority Data

Mar. 3, 2009 (KR) ........................ 10-2009-0018065

(51) Int. Cl.
*H03M 1/56* (2006.01)

(52) U.S. Cl. .......... 341/169; 341/155; 341/164; 377/52; 377/111; 377/116

(58) Field of Classification Search .................. 341/155, 341/158, 164, 169; 377/52, 111, 116
See application file for complete search history.

(56) References Cited

U.S. PATENT DOCUMENTS

| | | | |
|---|---|---|---|
| 4,521,898 A * | 6/1985 | Akram | 377/116 |
| 4,891,827 A * | 1/1990 | Slater | 377/111 |
| 5,432,830 A * | 7/1995 | Bonnot | 417/41 |
| 5,771,070 A | 6/1998 | Ohzu et al. | |
| 5,877,715 A * | 3/1999 | Gowda et al. | 341/122 |
| 6,677,993 B1 | 1/2004 | Suzuki et al. | |
| 7,088,279 B2 | 8/2006 | Muramatsu et al. | |
| 7,129,883 B2 | 10/2006 | Muramatsu et al. | |
| 7,149,275 B1 * | 12/2006 | Hubbard | 377/47 |
| 7,292,177 B2 * | 11/2007 | Muramatsu et al. | 341/164 |
| 7,495,597 B2 | 2/2009 | Muramatsu et al. | |
| 7,555,094 B2 * | 6/2009 | Shin et al. | 377/54 |

(Continued)

FOREIGN PATENT DOCUMENTS

| | | |
|---|---|---|
| JP | 10-93873 A | 4/1998 |
| JP | 2005-311933 A | 11/2005 |

(Continued)

OTHER PUBLICATIONS

Yoshihara, Satoshi, et al., "A 1/1.8-inch 6.4 MPixel 60 frames/s CMOS Image Sensor With Seamless Mode Change," IEEE Journal of Solid-State Circuits, vol. 41, No. 12, Dec. 2006, pp. 2998-3006.

*Primary Examiner* — Jean B Jeanglaude
(74) *Attorney, Agent, or Firm* — Onello & Mello, LLP

(57) ABSTRACT

In a double data rate (DDR) counter and counting method used in, for example, an analog-to-digital conversion in, for example, a CMOS image sensor and method, a first stage of the counter generates a least significant bit (LSB) of the value in the counter. The counter includes at least one second stage for generating another bit of the value in the counter. An input clock signal is applied to a data input of the first stage and a clock input of the second stage.

30 Claims, 42 Drawing Sheets

U.S. PATENT DOCUMENTS

| | | |
|---|---|---|
| 2005/0195304 A1 | 9/2005 | Nitta et al. |
| 2005/0242849 A1 | 11/2005 | Muramatsu et al. |
| 2008/0019472 A1 | 1/2008 | Muramatsu et al. |
| 2008/0111059 A1 | 5/2008 | Lee et al. |

FOREIGN PATENT DOCUMENTS

| | | |
|---|---|---|
| JP | 2005-323331 A | 11/2005 |
| KR | 10-2006-0045836 A | 5/2006 |

* cited by examiner

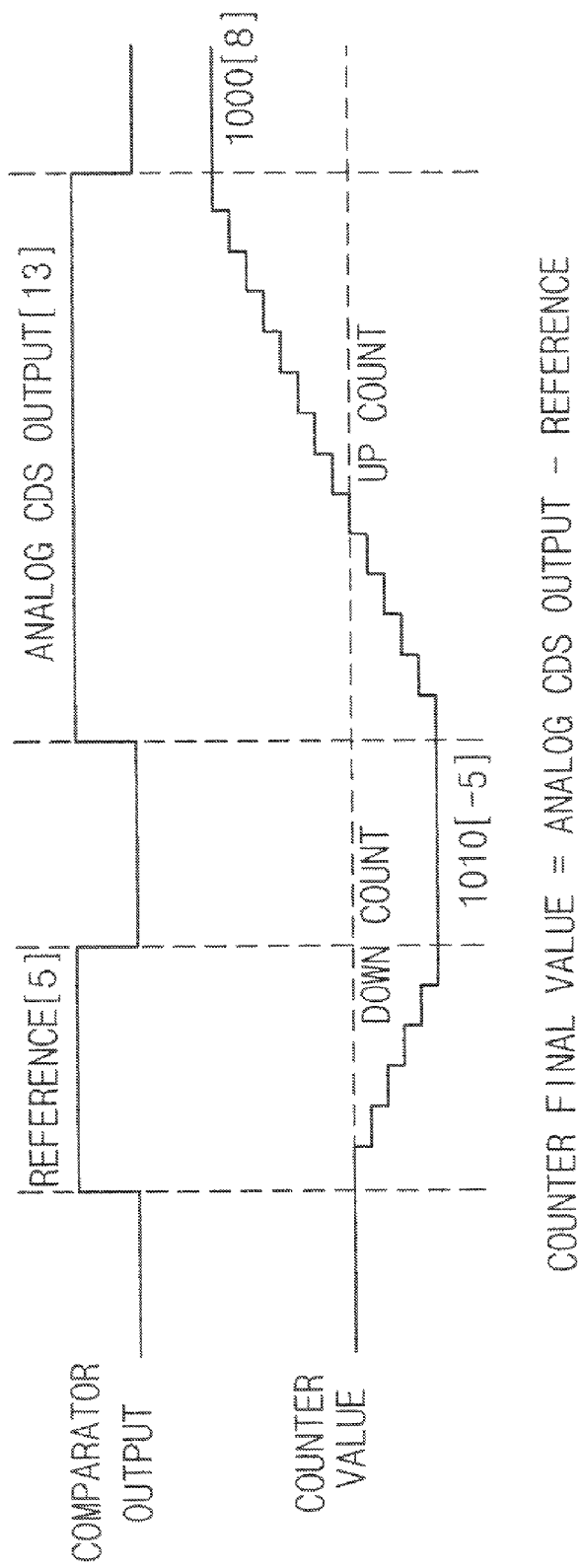

|  | D[0](LSB) | D[1] | D[2] | D[3](MSB) |
|---|---|---|---|---|
| NUMBER OF TOGGLING[#] | 63 | 31 | 15 | 1 |
| POWER CONSUMPTION[%] | 57.27% | 28.18% | 13.64% | 0.91% |

POWER CONSUMTION OF 4BIT COUNTER

| TOGGLING NUMBER | CD[0] 15 | CD[1] 7 | CD[2] 3 | CD[3] 1 | TOTAL 26 |
|---|---|---|---|---|---|
| | D[0] 1 | D[1] 7 | D[2] 3 | D[3] 1 | TOTAL 12 |

FIG. 16D

| D[1] | D[0] |
|---|---|
| 0 | 0 |
| 0 | 1 |
| 1 | 0 |
| 1 | 1 |

FIG. 16E

| D[1] | D[0] |
|---|---|
| 1 | 1 |
| 1 | 0 |
| 0 | 1 |
| 0 | 0 |

FIG. 16F

| D[1] | D[0] |
|---|---|
| 0 | 0 |
| 1 | 1 |
| 1 | 0 |
| 0 | 1 |

FIG. 16G

| D[1] | D[0] |
|---|---|
| 0 | 1 |
| 0 | 0 |
| 1 | 1 |
| 1 | 0 |

FIG. 17D

| D[1] | D[0] |
|---|---|
| 0 | 0 |
| 1 | 1 |
| 1 | 0 |
| 0 | 1 |

FIG. 17E

| D[1] | D[0] |
|---|---|
| 0 | 1 |
| 0 | 0 |
| 1 | 1 |
| 1 | 0 |

| D[1] | D[0] |
|---|---|
| 1 | 0 |
| 1 | 1 |
| 0 | 0 |
| 0 | 1 |

DOUBLE DATA RATE (DDR) COUNTER, ANALOG-TO-DIGITAL CONVERTER (ADC) USING THE SAME, CMOS IMAGE SENSOR USING THE SAME AND METHODS IN DDR COUNTER, ADC AND CMOS IMAGE SENSOR

RELATED APPLICATION

This application relies for priority under 35 U.S.C. 119(a) on Korean Patent Application number 10-2009-0018065, filed in the Korean Intellectual Property Office on Mar. 3, 2009, the entire contents of which are incorporated herein by reference.

BACKGROUND

1. Field of the Invention

This application relates to image sensors and analog-to-digital converters (ADCs) and counters for image sensors and, more particularly, to a counter and an ADC and methods in a CMOS image sensor.

2. Description of the Related Art

Complementary metal-oxide-semiconductor (CMOS) image sensors (CISs), which are widely used in digital cameras, capture optical signals and convert the optical signals into electrical signals. The CMOS image sensor has an active pixel sensor (APS) array that includes multiple pixels arranged in rows and columns. Each pixel typically includes a photodiode and a processing or read-out circuit. The photodiode generates electrical charge using absorbed light, converts the generated electrical charge into an analog voltage or current, and delivers the analog voltage or current to the read-out circuit. The read-out circuit converts the analog signal into a digital signal and outputs the digital signal.

An analog-to-digital converter (ADC) processes received pixel data, for example, data associated with all columns in a selected row of the APS array. In the analog-to-digital conversion process, a comparator receives an analog voltage and compares the analog voltage with a ramp voltage and uses a counter to count until the ramp voltage is greater than the analog voltage. Conventionally, when the ramp voltage exceeds the analog voltage, the count value in the counter is digital data corresponding to the analog voltage. That is, the count value is the digital data into which the analog voltage has been converted.

Such an ADC can include a correlated double sampling (CDS) circuit. CDS is a technique for measuring electrical values such as voltages or currents that allows for removal of an undesired offset, and is used frequently when measuring sensor outputs such as those in a CMOS image sensor. In CDS, the output of the sensor is measured twice—once in a known or reference condition and once in an unknown condition. The value measured from the known condition is then subtracted from the unknown condition to generate a value with a known relation to the physical quantity being measured. In dual CDS operation in a CMOS image sensor, an output node is reset to a predetermined reference value, a pixel charge (signal value) is transferred to the output node, and the final value of charge assigned to the pixel is the difference between the reset and signal values. The CDS circuit may also amplify the received reset and signal values.

High-speed counters, such as ripple counters, used in CDS consume a large amount of power. One particular cause of the power consumption in such counters is the frequent toggling of the least significant bit (LSB) in the counter. It is desirable to reduce the power consumption of the counter to reduce the overall power consumption in the ADC and in the CMOS image sensor.

SUMMARY

According to a first aspect, the inventive concept is directed to a double data rate (DDR) counter. The counter includes a first stage for generating a least significant bit (LSB) of a plurality of bits of the counter. The counter also includes at least one second stage for generating another bit of the plurality of bits of the counter. An input clock signal is applied to a data input of the first stage and a clock input of the second stage.

In some embodiments, the stages of the counter are edge-triggered on one of the rising edge and the falling edge of a signal applied to respective clock inputs of the stages. In some embodiments, the stages are positive edge-triggered. In some embodiments, the stages are negative edge-triggered.

In some embodiments, the counter further includes a plurality of second stages for generating a plurality of other bits of the counter.

In some embodiments, the counter further includes a circuit for determining a value of a count in the counter and selecting one of a plurality of clock signals for a second counting process of the counter. In some embodiments, the plurality of clock signals includes an inverted clock signal and a non-inverted clock signal.

In some embodiments, the counter is a ripple counter.

In some embodiments, the counter further includes a count stop circuit for stopping counting of the counter. In some embodiments, the count stop circuit comprises a multiplexer for selecting one of the positive and negative outputs of the second stage to be used in generating the LSB of the plurality of bits. In some embodiments, the selection by the multiplexer is made in response to an input signal. In some embodiments, the input signal can have one of two possible states, the selection by the multiplexer being made in response to the input signal changing states.

In some embodiments, the counter is one of a bit-wise inversion counter and an up/down counter. In some embodiments, the counter comprises a storage circuit for storing a status of the LSB of the plurality of bits.

According to another aspect, the inventive concept is directed to an analog-to-digital converter (ADC) using correlated double sampling. The ADC includes an input for receiving an input signal and a double data rate (DDR) counter. The DDR counter includes a first stage for generating a least significant bit (LSB) of a plurality of bits of the counter and at least one second stage for generating another bit of the plurality of bits of the counter. An input clock signal is applied to a data input of the first stage and a clock input of the second stage. A value in the DDR counter is related to an analog-to-digital conversion of the input signal.

In some embodiments, the stages of the counter are edge-triggered on one of the rising edge and the falling edge of a signal applied to respective clock inputs of the stages. In some embodiments, the stages are positive edge-triggered. In some embodiments, the stages are negative edge-triggered.

In some embodiments, the counter further includes a plurality of second stages for generating a plurality of other bits of the counter.

In some embodiments, the counter further includes a circuit for determining a value of a count in the counter and selecting one of a plurality of clock signals for a second counting process of the counter. In some embodiments, the plurality of clock signals includes an inverted clock signal and a non-inverted clock signal.

In some embodiments, the counter is a ripple counter.

In some embodiments, the counter further includes a count stop circuit for stopping counting of the counter. In some embodiments, the count stop circuit comprises a multiplexer for selecting one of the positive and negative outputs of the second stage to be used in generating the LSB of the plurality of bits. In some embodiments, the selection by the multiplexer is made in response to an input signal. In some embodiments, the input signal can have one of two possible states, the selection by the multiplexer being made in response to the input signal changing states.

In some embodiments, the counter is one of a bit-wise inversion counter and an up/down counter. In some embodiments, the counter comprises a storage circuit for storing a status of the LSB of the plurality of bits.

According to another aspect, the inventive concept is directed to a CMOS image sensor. The CMOS image sensor includes a pixel array and an analog-to-digital converter (ADC) comprising a double data rate (DDR) counter. The DDR counter includes a first stage for generating a least significant bit (LSB) of a plurality of bits of the counter and at least one second stage for generating another bit of the plurality of bits of the counter. An input clock signal is applied to a data input of the first stage and a clock input of the second stage.

In some embodiments, the stages of the counter are edge-triggered on one of the rising edge and the falling edge of a signal applied to respective clock inputs of the stages. In some embodiments, the stages are positive edge-triggered. In some embodiments, the stages are negative edge-triggered.

In some embodiments, the counter further includes a plurality of second stages for generating a plurality of other bits of the counter.

In some embodiments, the counter further includes a circuit for determining a value of a count in the counter and selecting one of a plurality of clock signals for a second counting process of the counter. In some embodiments, the plurality of clock signals includes an inverted clock signal and a non-inverted clock signal.

In some embodiments, the counter is a ripple counter.

In some embodiments, the counter further includes a count stop circuit for stopping counting of the counter. In some embodiments, the count stop circuit comprises a multiplexer for selecting one of the positive and negative outputs of the second stage to be used in generating the LSB of the plurality of bits. In some embodiments, the selection by the multiplexer is made in response to an input signal. In some embodiments, the input signal can have one of two possible states, the selection by the multiplexer being made in response to the input signal changing states.

In some embodiments, the counter is one of a bit-wise inversion counter and an up/down counter. In some embodiments, the counter comprises a storage circuit for storing a status of the LSB of the plurality of bits.

According to another aspect, the inventive concept is directed to a method of counting in a double data rate (DDR) counter. The method includes generating a least significant bit (LSB) of a plurality of bits of the counter in a first stage of the counter and generating another bit of the plurality of bits of the counter in at least one second stage of the counter. An input clock signal is applied to a data input of the first stage and a clock input of the second stage.

In some embodiments, the stages of the counter are edge-triggered on one of the rising edge and the falling edge of a signal applied to respective clock inputs of the stages. In some embodiments, the stages are positive edge-triggered. In some embodiments, the stages are negative edge-triggered.

In some embodiments, the method further comprises generating a plurality of other bits of the counter in a plurality of second stages of the counter.

In some embodiments, the method further comprises determining a value of a count in the counter and selecting one of a plurality of clock signals for a second counting process of the counter. In some embodiments, the plurality of clock signals includes an inverted clock signal and a non-inverted clock signal.

In some embodiments, the counter is a ripple counter.

In some embodiments, the method further comprises stopping counting of the counter with a count stop circuit. In some embodiments, the method further comprises, using a multiplexer of the count stop circuit, selecting one of the positive and negative outputs of the second stage to be used in generating the LSB of the plurality of bits. In some embodiments, the selection by the multiplexer is made in response to an input signal. In some embodiments, the input signal can have one of two possible states, the selection by the multiplexer being made in response to the input signal changing states.

In some embodiments, the counter is one of a bit-wise inversion counter and an up/down counter. In some embodiments, the method further comprises storing a status of the LSB of the plurality of bits using a storage circuit of the counter.

In some embodiments, the method further comprises filtering a glitch.

According to another aspect, the inventive concept is directed to a method of analog-to-digital conversion using correlated double sampling (CDS) using a double data rate (DDR) counter. The method includes receiving an input signal. The method further includes generating a least significant bit (LSB) of a plurality of bits of the counter in a first stage of the counter and generating another bit of the plurality of bits of the counter in at least one second stage of the counter. An input clock signal is applied to a data input of the first stage and a clock input of the second stage. A value in the counter is related to an analog-to-digital conversion of the input signal.

In some embodiments, the stages of the counter are edge-triggered on one of the rising edge and the falling edge of a signal applied to respective clock inputs of the stages. In some embodiments, the stages are positive edge-triggered. In some embodiments, the stages are negative edge-triggered.

In some embodiments, the method further comprises generating a plurality of other bits of the counter in a plurality of second stages of the counter.

In some embodiments, the method further comprises determining a value of a count in the counter and selecting one of a plurality of clock signals for a second counting process of the counter. In some embodiments, the plurality of clock signals includes an inverted clock signal and a non-inverted clock signal.

In some embodiments, the counter is a ripple counter.

In some embodiments, the method further comprises stopping counting of the counter with a count stop circuit. In some embodiments, the method further comprises, using a multiplexer of the count stop circuit, selecting one of the positive and negative outputs of the second stage to be used in generating the LSB of the plurality of bits. In some embodiments, the selection by the multiplexer is made in response to an input signal. In some embodiments, the input signal can have one of two possible states, the selection by the multiplexer being made in response to the input signal changing states.

In some embodiments, the counter is one of a bit-wise inversion counter and an up/down counter. In some embodiments, the method further comprises storing a status of the LSB of the plurality of bits using a storage circuit of the counter.

In some embodiments, the method further comprises filtering a glitch.

According to another aspect, the inventive concept is directed to a method of processing an image in a CMOS image sensor. The method includes providing a pixel array and counting in a double data rate (DDR) counter for an analog-to-digital converter (ADC) for a double data rate (DDR) dual correlated double sampler (CDS). The counting includes generating a least significant bit (LSB) of a plurality of bits of the counter in a first stage of the counter and generating another bit of the plurality of bits of the counter in at least one second stage of the counter. An input clock signal is applied to a data input of the first stage and a clock input of the second stage.

In some embodiments, the stages of the counter are edge-triggered on one of the rising edge and the falling edge of a signal applied to respective clock inputs of the stages. In some embodiments, the stages are positive edge-triggered. In some embodiments, the stages are negative edge-triggered.

In some embodiments, the method further comprises generating a plurality of other bits of the counter in a plurality of second stages of the counter.

In some embodiments, the method further comprises determining a value of a count in the counter and selecting one of a plurality of clock signals for a second counting process of the counter. In some embodiments, the plurality of clock signals includes an inverted clock signal and a non-inverted clock signal.

In some embodiments, the counter is a ripple counter.

In some embodiments, the method further comprises stopping counting of the counter with a count stop circuit. In some embodiments, the method further comprises, using a multiplexer of the count stop circuit, selecting one of the positive and negative outputs of the second stage to be used in generating the LSB of the plurality of bits. In some embodiments, the selection by the multiplexer is made in response to an input signal. In some embodiments, the input signal can have one of two possible states, the selection by the multiplexer being made in response to the input signal changing states.

In some embodiments, the counter is one of a bit-wise inversion counter and an up/down counter. In some embodiments, the method further comprises storing a status of the LSB of the plurality of bits using a storage circuit of the counter.

In some embodiments, the method further comprises filtering a glitch.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept.

FIGS. 6A-6D illustrate an up/down counter used in conventional approaches to CDS. Specifically, FIG. 6A is a schematic block diagram of an up/down counter. FIG. 6B is a block diagram illustrating operation of a one-bit up/down counter to illustrate the operation of the up/down counter of FIG. 6A. FIG. 6C is a timing diagram illustrating the operation of the up/down count and hold control of the one-bit counter of FIG. 6B. FIG. 6D is a diagram illustrating operation of CDS using the up/down counter of FIG. 6A.

FIG. 7A is a schematic block diagram of a BWI counter. FIG. 7B is a block diagram illustrating operation of a one-bit inversion counter to illustrate the operation of the BWI counter of FIG. 7A. FIG. 7C is a timing diagram illustrating the operation of the BWI control of the one-bit BWI counter of FIG. 7B. FIGS. 7D and 7E are timing diagrams illustrating operation of the BWI counter. FIG. 7F is a timing diagram illustrating operation of dual CDS using the BWI counter of FIG. 7A.

FIG. 8B is a timing diagram illustrating the toggling of data bits of the counter of FIG. 8A during counting. FIG. 8C is a table illustrating the relative frequency of bit toggling and relative power consumption for the bits in the ripple counter of FIG. 8A during counting.

FIG. 9A is a schematic block diagram of a ripple counter with an additional glitch filter circuit used to eliminate the glitch. FIG. 9B is a timing diagram illustrating the glitch using the conventional ripple counter of FIG. 8A. FIG. 9C is a timing diagram illustrating the elimination of the glitch using the glitch filter with the ripple counter.

FIGS. 16D-16G are truth tables illustrating the counting process in the counter of FIG. 16A.

FIGS. 17D-17F are truth tables illustrating the counting process in the counter of FIG. 17A.

FIG. 18 contains a flow chart illustrating a process of counting in a DDR counter, according to one embodiment of the inventive concept.

DETAILED DESCRIPTION

Figure 1:
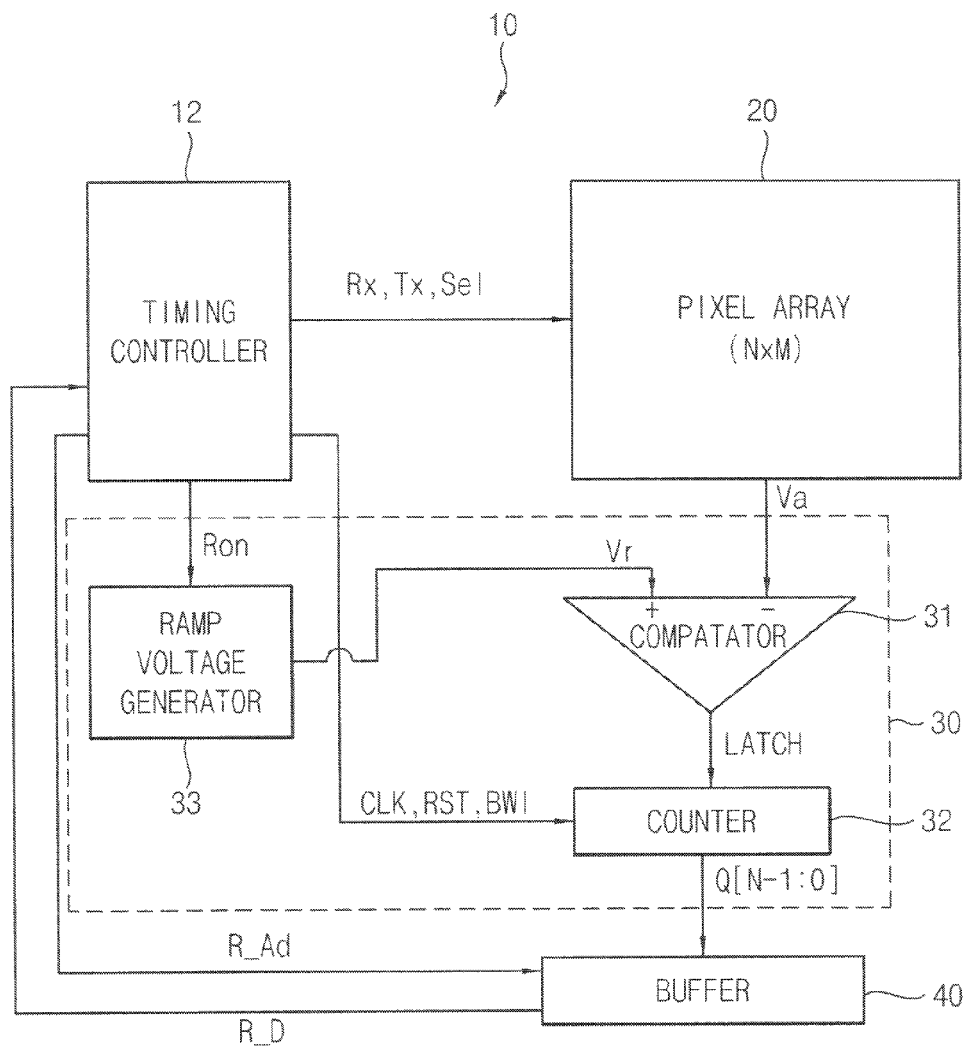
FIG. 1 includes a schematic block diagram of a general CMOS image sensor (CIS).

FIG. 1 includes a schematic block diagram of a general CMOS image sensor (CIS) 10. The CIS 10 may be used, for example, in a digital still camera. Referring to FIG. 1, the CIS 10, which converts external image data into digital data and stores the digital data, includes a timing controller 12, an active pixel sensor array (APS), or, simply, a pixel array 20, an analog-to-digital converter (ADC) 30, and a buffer 40.

The pixel array 20 receives external image data, i.e., from outside the CMOS image sensor 10, and outputs an analog signal Va to ADC 30 in response to control signals Rx, Tx and Sel received from the timing controller 12. The analog signal Va may also be referred to as a "pixel signal" or "data signal" or "image signal" or "input signal" or the like. The ADC 30 includes a comparator 31, a counter 32 and a ramp voltage generator 33. The comparator 31 receives the analog signal Va and receives a ramp signal Vr from ramp voltage generator 33. A "ramp signal" is a signal, such as ramp signal Vr, in which the voltage level of the signal increases or decreases over time, i.e., in proportion to time. The ramp signal Vr may also be referred to herein as ramp voltage or ramp voltage signal Vr. The voltage level of ramp signal Vr may, for example, increase or decrease at a constant rate. In the exemplary illustration of FIG. 1, the ramp voltage signal Vr increases with time. The counter 32 receives a clock signal CLK, a control signal RST and a control signal BWI. Control signal RST may be referred to herein as a reset signal RST and control signal BWI may be referred to herein as inversion signal BWI. In addition, counter 32 counts in response to clock signal CLK while analog signal Va is compared with ramp signal Vr. Comparator 31 compares analog signal Va with ramp signal Vr, and outputs a comparison signal LATCH to counter 32 in response to detecting a defined voltage difference between analog signal Va and ramp signal Vr. When the ramp voltage signal Vr and the analog signal Va "crossover," i.e., when the ramp voltage Vr becomes larger than the analog signal Va in this illustration, the LATCH signal becomes active, and, in response, the counter 32 stops the counting. When the counter 32 stops counting in response to clock signal CLK stopping, a count value stored in counter 32 is digital data that corresponds to analog signal Va. The digital data that has been converted from analog signal Va is stored in buffer 40. In addition, timing controller 12 transmits a control signal RA_d to buffer 40 to receive a data signal R_D from buffer 40.

The foregoing description relates to conventional analog-to-digital conversion in a CMOS image sensor.

Figure 2:
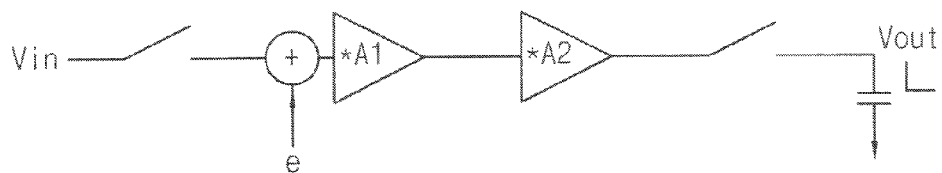
FIG. 2 is a schematic top-level block diagram of conventional sampling of an input signal for analog-to-digital conversion.

FIG. 2 is a schematic top-level block diagram of conventional sampling of an input signal for analog-to-digital conversion. Referring to FIG. 2, an input voltage Vin is applied at an input to the CDS system. An error factor e, representative of such sources of error as input offset of amplifiers, 1/f noise, switching noise, etc., is summed with the input signal Vin at summing node 21. A first amplifier having gain A1 receives the summed signal and amplifies the summed signal and applies the amplified summed signal to the input of a second amplifier having gain A2. The output Vout is taken across a load L. The output Vout can be expressed by Vout=Vin*A1*A2+e*A1*A2. Thus, the error e is amplified by A1 and A2 and can be a significant factor in the output signal Vout.

Correlated double sampling is used to reduce or eliminate the error term e. CDS is described in detail in, for example, U.S. Pat. Nos. 5,771,070 and 6,677,993, the contents of which patents are incorporated herein in their entirety by reference.

Figure 3:
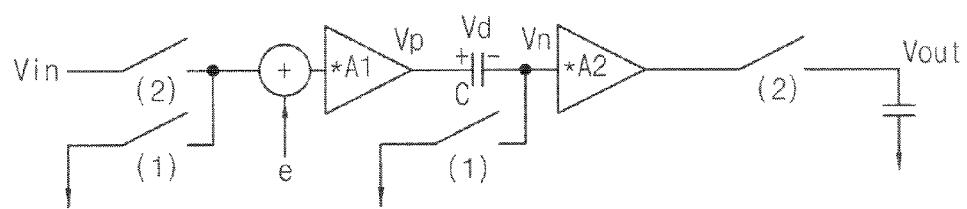
FIG. 3 is a schematic top-level block diagram of the process of correlated double sampling (CDS).

FIG. 3 is a schematic top-level block diagram of the process of CDS. Referring to FIG. 3, an error cancelling capacitor C is inserted between the amplifiers A1 and A2, such that a voltage Vp−Vn is developed across the capacitor C. In CDS, two sampling procedures are performed. First, indicated by (1), a reference signal Vref is sampled. Then, indicated by (2), the input signal Vin is sampled. In the first sampling process (1), $Vd=Vp-Vn=(0*A1+e*A1)-0=e*A1$ $Vout=0.$ In the second sampling process (2), $Vd=Vp-Vn=(Vin*A1+e*A1)-(Vin*A1)=e*A1$ $Vout=Vin*A1*A2.$ Hence, using CDS, the error term e is eliminated.

Figure 4:
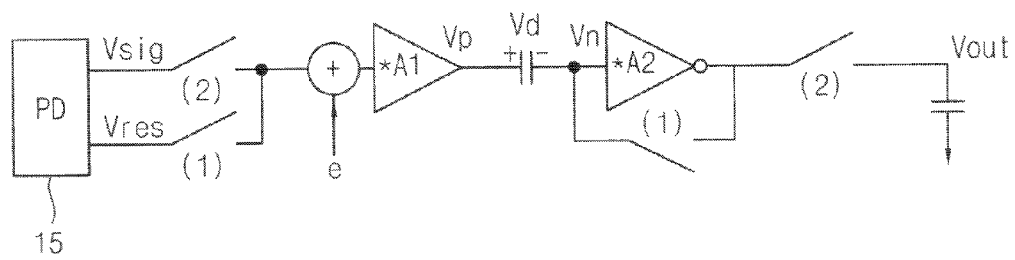
FIG. 4 is a schematic block diagram of CDS applied to a CMOS image sensor.

FIG. 4 is a schematic block diagram of CDS applied to a CMOS image sensor. Referring to FIG. 4, a photodiode (PD)

15 of the CMOS image sensor provides two signals, Vsig, which is the pixel image signal based on light incident on the pixel, and Vres, which is the reference signal or reset or "dark" level of the pixel. During the first sampling (1), $$Vd=Vp-Vn=(Vres*A1+e*A1)-Vdd/2$$

$$Vout=Vdd/2$$

$$Vd=Vp-Vn=(Vsig*A1+e*A1)-[Vdd/2-(Vres-Vsig)*A1].$$

During the second sampling (2), $$Vout=(Vres-Vsig)*A1*A2.$$

Hence, as noted above, using CDS, the error term e is eliminated.

Figure 5A:
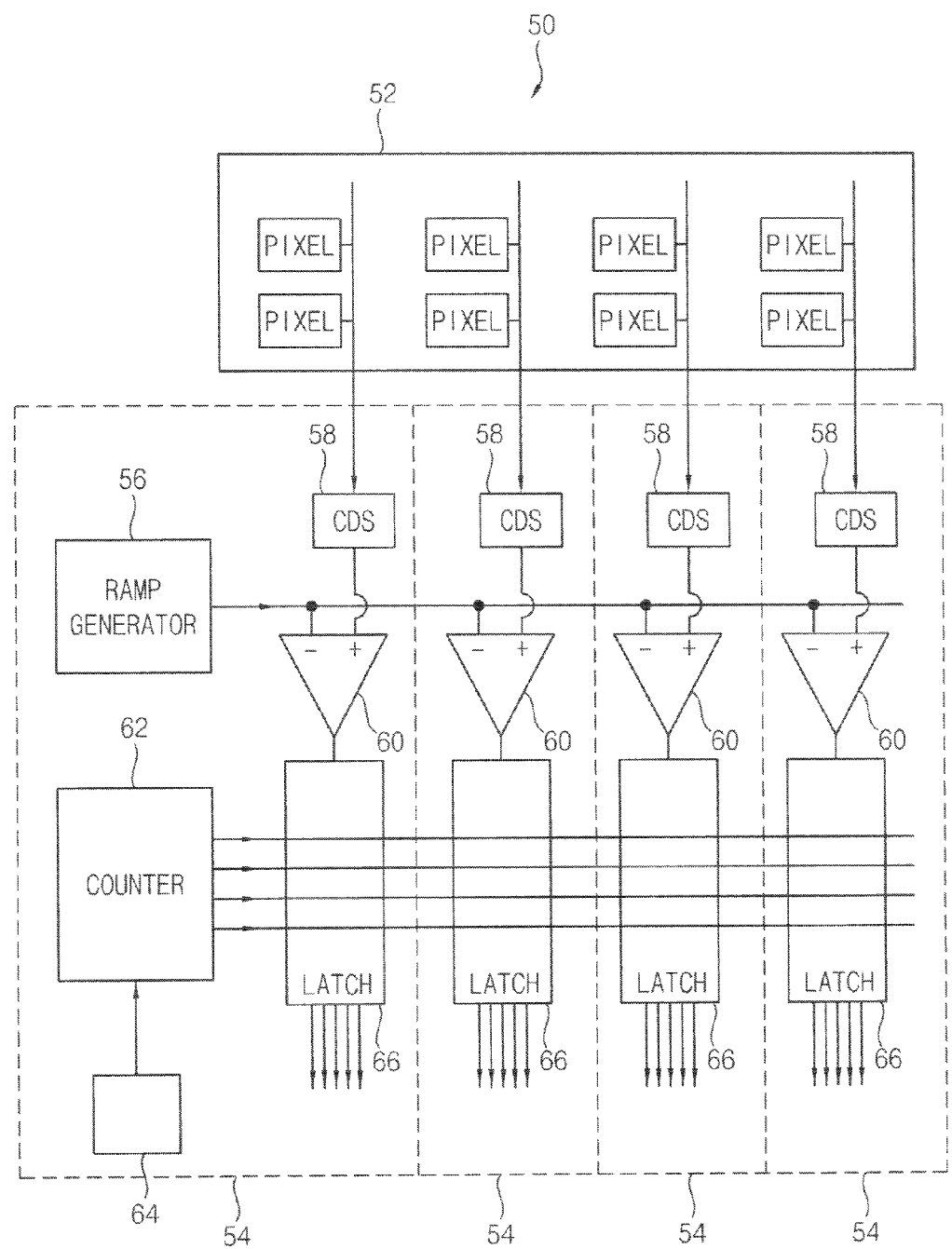
FIG. 5A is a schematic block diagram illustrating an embodiment of analog-to-digital conversion using CDS in a CMOS image sensor, according to the inventive concept.
Figure 5B:
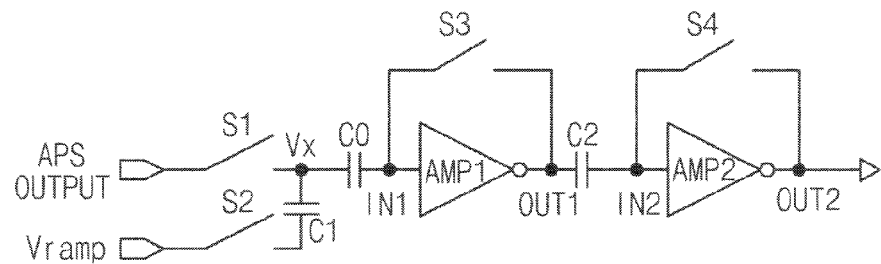
FIG. 5B is a schematic functional block diagram of the sampling performed in the CDS process.
Figure 5C:
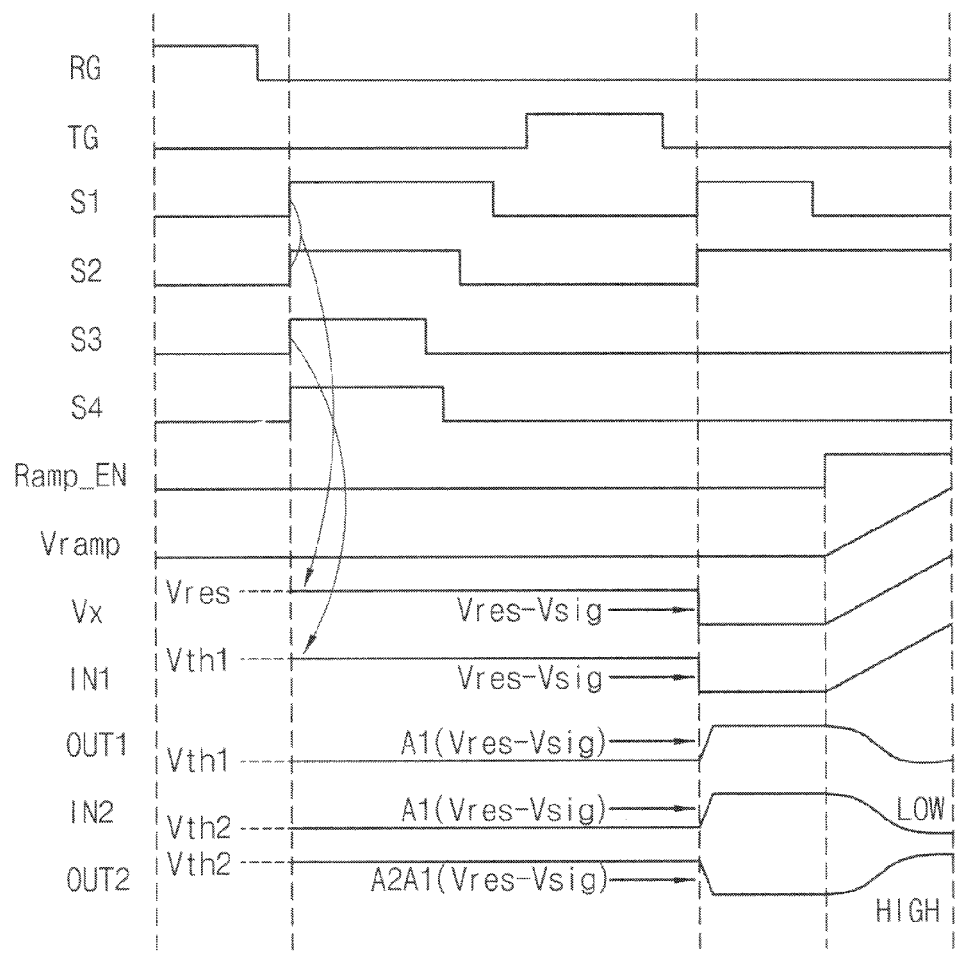
FIG. 5C is a timing diagram illustrating the timing of the CDS process.

FIG. 5A is a schematic block diagram illustrating an embodiment of analog-to-digital conversion using analog CDS in a CMOS image sensor. FIG. 5B is a schematic functional block diagram of the sampling performed in the analog CDS process. FIG. 5C is a timing diagram illustrating the timing of the analog CDS process. Referring to FIGS. 5A-5C, the CMOS image sensor 50 includes a pixel array 52 which provides pixel analog outputs to analog-to-digital converters (ADCs) 54. It is noted that in this embodiment, column analog-to-digital conversion is performed. That is, each column of the pixel array is connected to a column ADC 54. The details of only one column ADC circuit 54 is shown in FIG. 5A for clarity of illustration.

The pixel array columns output their respective analog signal outputs to their respective column ADCs 54. Each ADC 54 includes a CDS block 58 for carrying out analog CDS on the pixel signal outputs and generating outputs to be analog-to-digital converted. The CDS output signal is applied to a noninverting input of a respective comparator 60. A ramp generator 56 in the ADC 54 generates the ramp voltage signal and applies the signal to the inverting input of the comparator 60. The comparator output controls latching of data from counter 62 into the latches 66.

When a pixel signal is received from the pixel array 52, the CDS begins in the CDS block 58. The CDS begins with the sampling as described above. The counter enable block 64 starts the first counting for the sampling in the counter 62, and the analog-to-digital conversion sampling is carried out in the CDS block 58. The ramp generator 56 applies the ramp voltage signal to the comparator 60. When the counting and sampling are complete, the OUT2 signal toggles from low to high, and the counter value is stored in the latch 66 and output from the ADC 54 as the digital-converted version of the input signal. It is noted that each column ADC 54 includes its own CDS block 58, comparator 60, latches 66 and counter 62.

Another approach to analog-to-digital conversion involves the use of dual CDS. Under dual CDS, two counting and sampling processes are performed. In conventional dual CDS, an up/down counter is typically used. When a pixel signal is received from the pixel array, the dual CDS begins with the first sampling process as described above. Using FIG. 5A as a reference, under dual CDS, the counter enable block starts the first counting for the first sampling in the up/down counter, and the analog-to-digital conversion first sampling is carried out in the CDS block. The ramp generator applies the ramp voltage signal to the comparator. When the first counting and first sampling are complete, the second sampling begins in the CDS block. The counter performs a second counting during the second sampling. When the second sampling is completed, the counter value is stored in a latch and output from the ADC as the digital-converted version of the input signal.

In some ADCs using dual CDS, one type of up/down counter is used as the ADC column counter. In such approaches, during the first sampling, the counter counts down. When the first sampling is complete, the counter begins counting up for the second sampling. An example of an up/down counter used in CDS for an ADC is described in, for example, U.S. Pat. Nos. 7,129,883 and 7,088,279, both of which are incorporated herein in their entirety by reference.

Figure 6A:
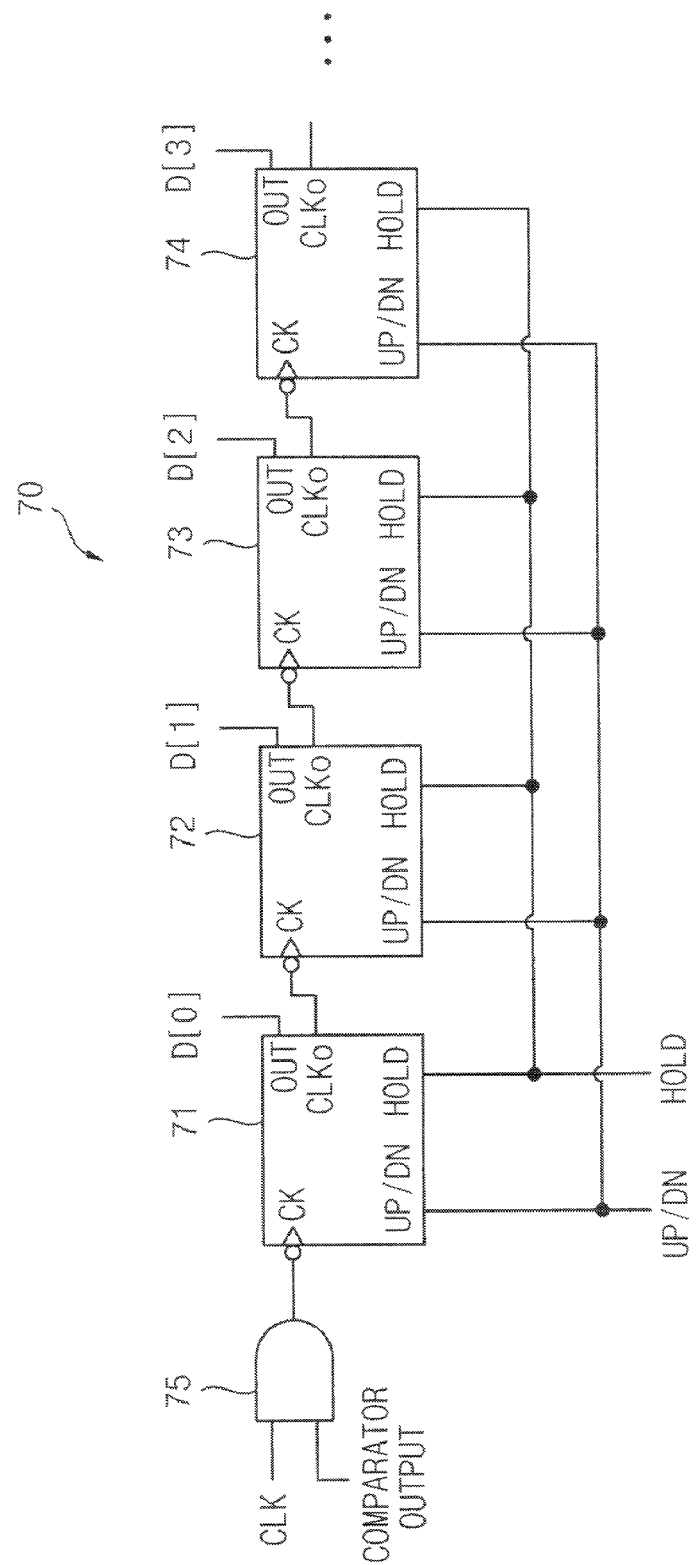
Figure 6B:
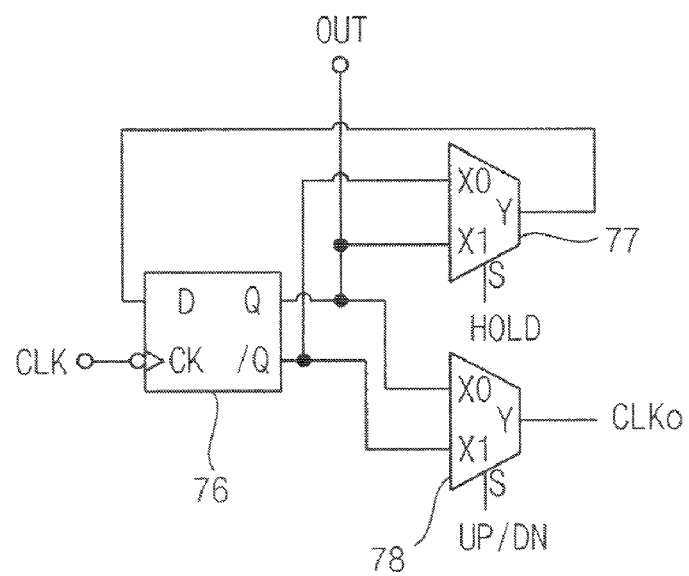
Figure 6C:
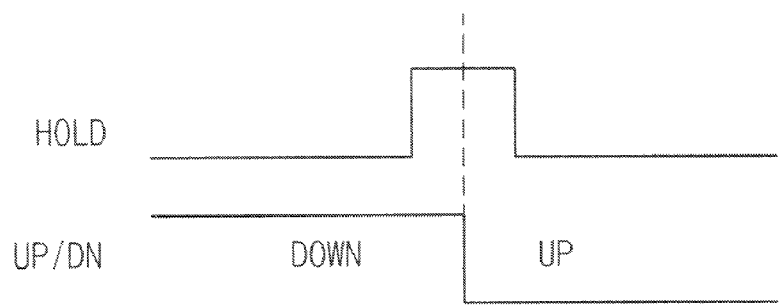

FIGS. 6A-6D illustrate an up/down counter used in conventional approaches to dual CDS. Specifically, FIG. 6A is a schematic block diagram of the up/down counter 70. FIG. 6B is a block diagram illustrating operation of a one-bit up/down counter to illustrate the operation of the up/down counter 70 of FIG. 6A. FIG. 6C is a timing diagram illustrating the operation of the up/down count and hold control of the one-bit counter of FIG. 6B. FIG. 6D is a diagram illustrating operation of dual CDS using the up/down counter 70.

Referring to FIGS. 6A and 6D, the up/down counter 70 includes, for example, four stages 71-74 configured using, for example, four D flip-flops. Each stage includes an edge-triggered clock input CLK and an output clock CLKo connected to the clock input CLK of the next stage. Each stage also includes a data output OUT representing bits D[0], D[1], D[2] and Dm of the value in the counter 70. It is noted that D[0] represents the least significant bit (LSB) of the value in the counter 70. An UP/DN input to each stage controls the up or down counting direction of the stage. A HOLD input is used to temporarily stop the counting of each stage. An input clock signal CLK is applied along with the output of the ADC comparator to an AND gate 75 to generate the clock signal that is input to the edge-triggered clock inputs of the counter first stage 71.

During dual CDS using the up/down counter 70 of FIGS. 6A-6D, the counter 70 counts in the down direction during the first sampling, i.e., the sampling of the reference signal. When the first sampling is complete, i.e., when the comparator outputs a signal indicating the crossover of the ramp voltage signal and the reference signal, the counter is temporarily held, i.e., stopped, by the HOLD control signal transitioning to an active high state applied at the HOLD inputs of the stages. Then, upon initiation of the second sampling, i.e., the sampling of the analog input image data signal, the counter 70 is released by the HOLD signal transitioning back to the inactive low state and begins counting up from the previously down-counted value. When the comparator output signal indicates the crossover of the ramp voltage signal and the analog input image data signal, the counter output is the difference between the analog-to-digital converted value of the reference signal and that of the analog input image data signal, which is used as the dual CDS analog-to-digital conversion of the image data, with the error/noise contribution removed.

FIG. 6B contains a detailed schematic block diagram of one of the up/down counting stages 71, 72, 73, 74 of the up/down counter 70 of FIG. 6A. FIG. 6C contains a timing diagram of the up/down and hold control used to control the counter during dual CDS. Referring to FIGS. 6B and 6C, each stage includes a D flip-flop 76 and two selection circuits 77, 78, e.g., multiplexers. As shown in FIG. 6B, the multiplexer 77 selects, under control of the HOLD signal, one of the Q and /Q outputs of the flip-flop 76 to be fed back and applied to the D input of the flip-flop 76. When the HOLD signal is inactive low, the /Q output is applied back to the D input, and the counter 70 counts. When the HOLD signal is active high, the Q output is applied back to the D input, and the counting stops.

The multiplexer 78 selects, under control of the UP/DN control signal, one of the Q and /Q outputs to be the CLKo output signal of the stage applied as the CLK signal to the next stage. When the UP/DN signal is active high, the /Q output is selected, and the counter counts down. When the UP/DN signal is inactive low, the Q output is selected, and the counter counts up. During the down counting of the first sampling, the UP/DN signal is active high. Upon completion of the first counting, after the HOLD signal transitions to active high to hold the counting, the UP/DN signal transitions to low to change the counting mode from down to up. Next, the HOLD signal transitions back to inactive low to start the second counting in the up direction.

Figure 7A:
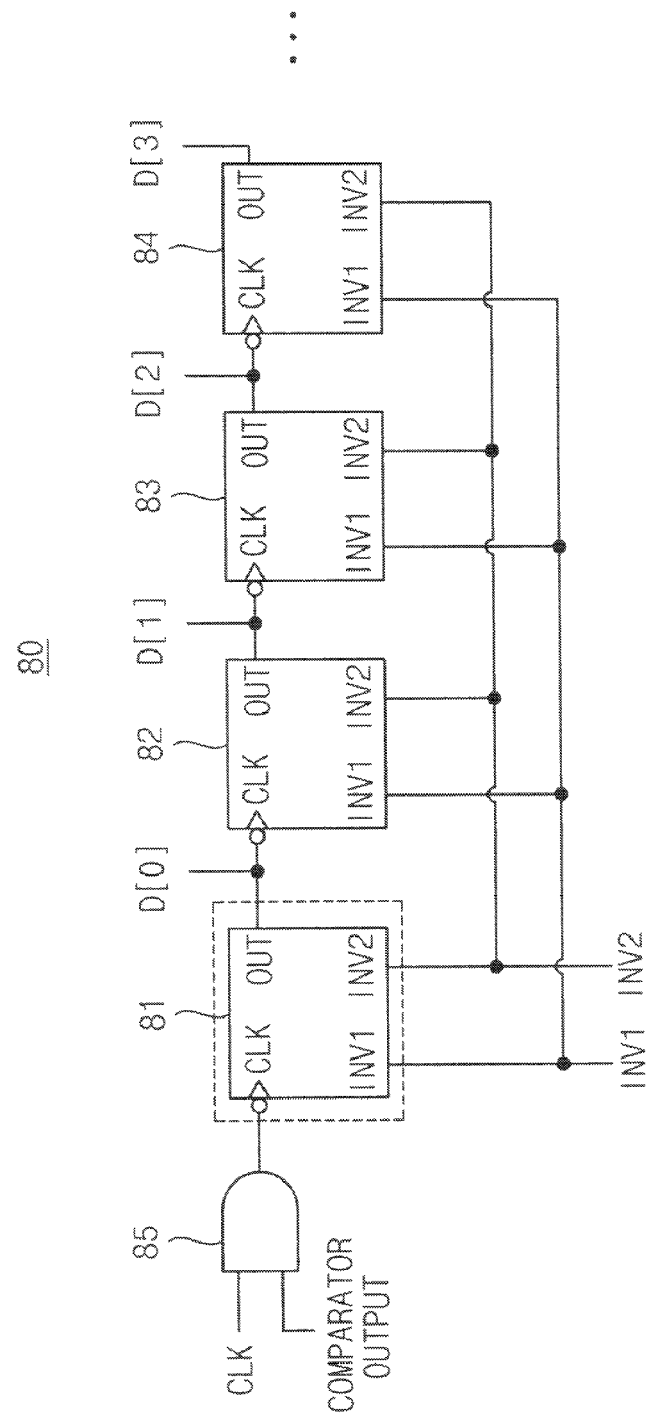
FIGS. 7A-7F illustrate a bitwise inversion (BWI) counter used in conventional approaches to dual CDS. Specifically.
Figure 7B:
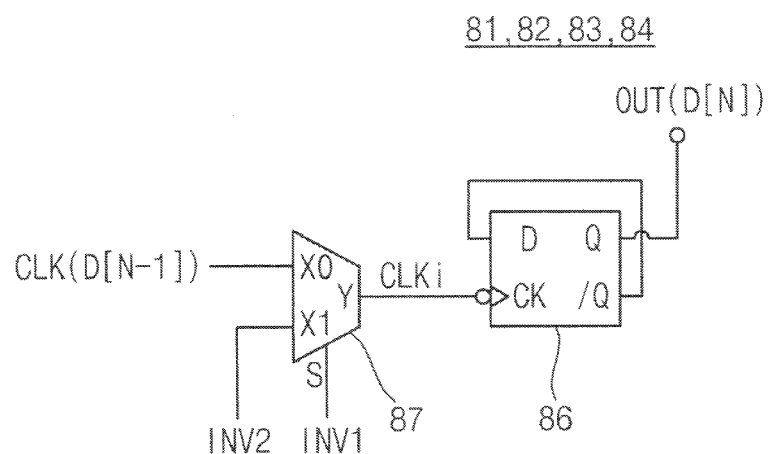
Figure 7C:
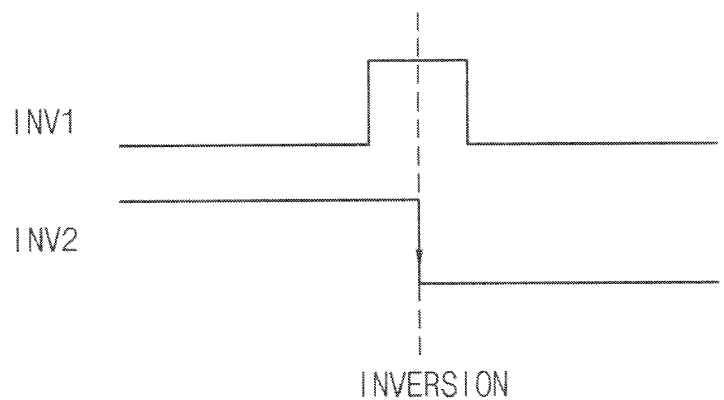
Figure 7D:
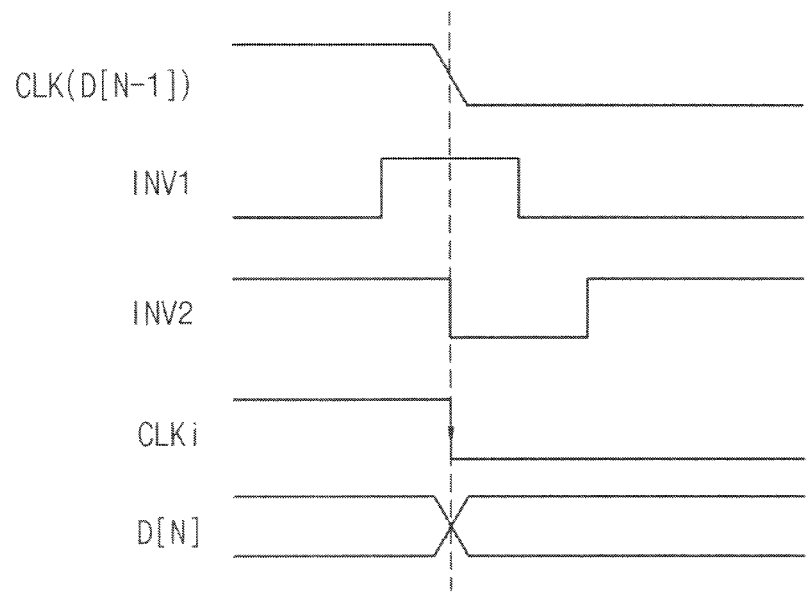
Figure 7E:
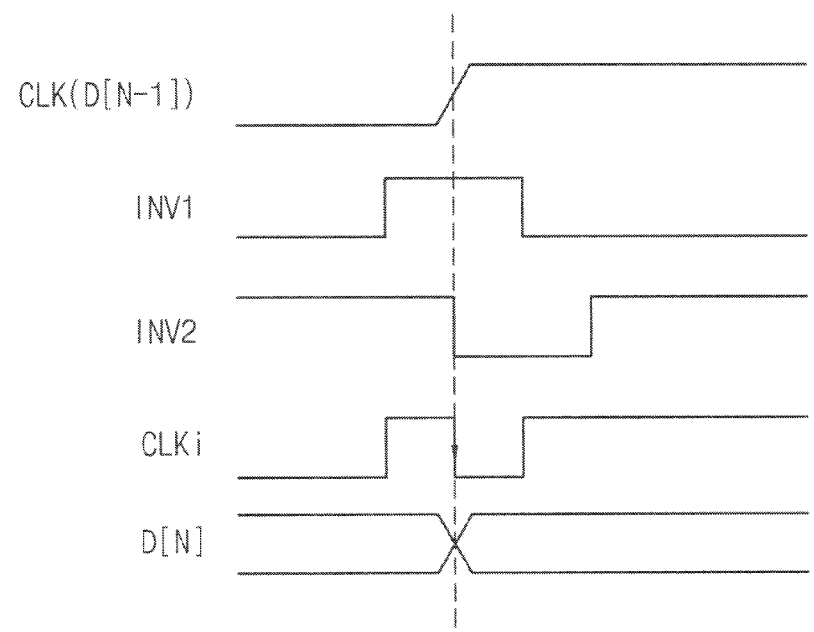
Figure 7F:
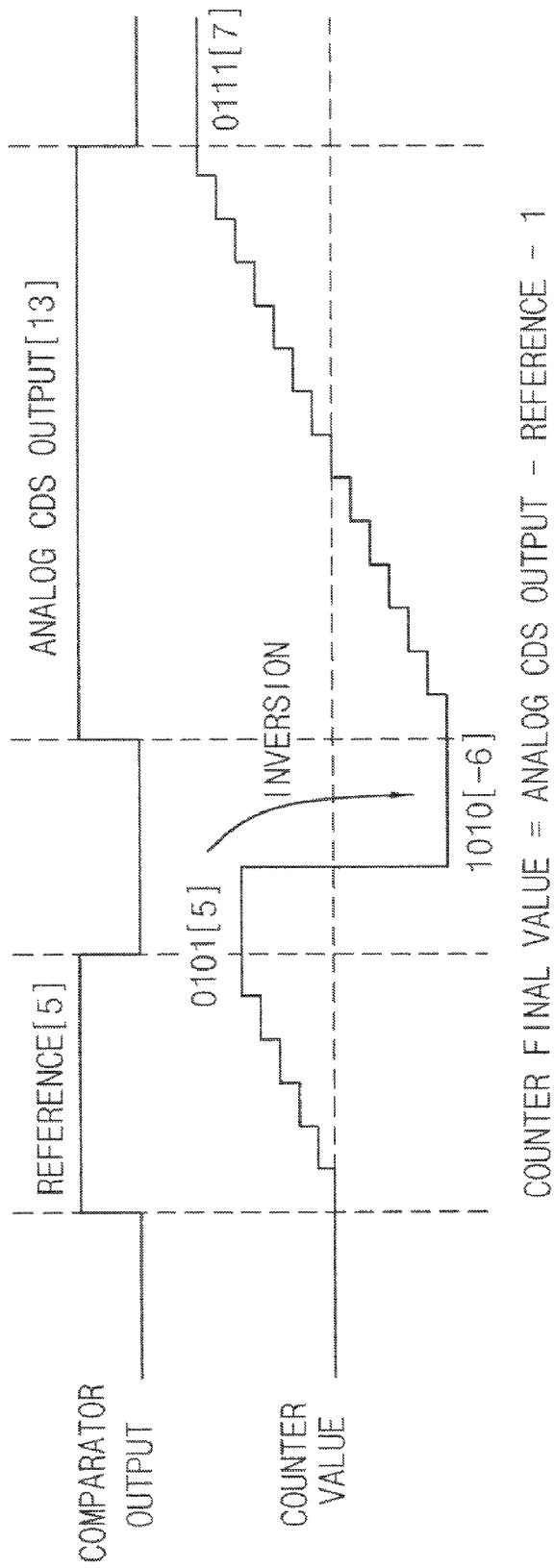

In other dual CDS approaches, a bit-wise inversion (BWI) counter is used as the ADC counter instead of the up/down counter described above. CDS using one type of BWI counter is described in, for example, United States Patent Application Publication number US 2008/0111059, the entire contents of which are incorporated herein by reference. FIGS. 7A-7F illustrate a BWI counter used in conventional approaches to dual CDS. Specifically, FIG. 7A is a schematic block diagram of a BWI counter 80. FIG. 7B is a block diagram illustrating operation of a one-bit inversion counter to illustrate the operation of the BWI counter 80 of FIG. 7A. FIG. 7C is a timing diagram illustrating the operation of the BWI control of the one-bit BWI counter of FIG. 7B. FIGS. 7D and 7E are timing diagrams illustrating operation of the BWI counter 80. FIG. 7F is a timing diagram illustrating operation of dual CDS using the BWI counter 80.

Referring to FIGS. 7A and 7F, the BWI counter 80 includes, for example, four stages 81, 82, 83, 84 implemented using, for example, four D flip-flops. Each stage includes an edge-triggered clock input CLK and a data output signal OUT representing data D of the stage. The four data output signals D[0], D[1], D[2], D[3] represent the data contents of the counter 80. It is noted that data signal D[0] represents the LSB of the value in the counter 80. Two inversion signals INV1 and INV2 control the inversion of the bits in the stages of the counter 80. An input clock signal CLK is applied along with the output of the ADC comparator to an AND gate 85 to generate the clock signal that is applied to the edge-triggered clock input CLK of the first stage 81. The D output signal from each stage serves as the clock signal for the immediately following stage and is applied to the edge-triggered CLK input of the immediately following stage.

Referring to FIG. 7F, during dual CDS using the BWI counter 80, the counter 80 counts in the up direction during the first sampling, i.e., the sampling of the reference signal. When the first sampling is complete, i.e., when the comparator outputs a signal indicating the crossover of the ramp voltage signal and the reference signal, the counter 80 carries out the inversion under the control of the two inversion signals INV1 and INV2. The second sampling, i.e., the sampling of the analog input image data signal, is then initiated, starting at the inverted value stored in the counter 80. During the second sampling, the counter 80 again counts in the up direction. When the comparator indicates the crossover of the ramp voltage signal and the analog input image data signal, the counter output is the difference between the analog-to-digital converted value of the reference signal and that of the analog input image data signal, which is used as the CDS analog-to-digital conversion of the image data, with the error/noise contribution removed.

FIG. 7B contains a detailed schematic block diagram of one of the BWI counting stages 81, 82, 83, 84 of the BWI counter 80 of FIG. 7A. FIG. 7C contains a timing diagram of the operation of the inversion control signals INV1 and INV2 during the dual CDS process in the one-bit inversion counter of FIG. 7B. Referring to FIGS. 7B and 7C, the counting stage 81, 82, 83, 84 includes a D flip-flop 86 and a selection circuit such as multiplexer 87. As shown, the control signals are used to apply the clock signal CLKi to the CK input of the D flip-flop 86 during inversion to invert the value of the data bit stored in the flip-flop 86. Specifically, during counting, the INV1 signal is inactive low, such that the multiplexer 87 applies the clock signal CLK [D(N−1)], i.e., the data output D of the previous stage, to the edge-triggered CK input of the flip-flop 86 via the output signal CLKi from the multiplexer 87. When the inversion is to be carried out, the inversion signal INV1 transitions to the active high state, such that the multiplexer 87 applies the second inversion signal INV2 to the CK input of the flip-flop 86 via the multiplexer output signal CLKi. When the second inversion control signal INV2 transitions from high to low, the signal CLKi also transitions from high to low, and the flip-flop 86 is triggered to invert its data contents.

FIGS. 7D and 7E contain timing diagrams illustrating the one-bit inversion operation in detail. FIG. 7D illustrates the case in which the first inversion control signal INV1 transitions to the active high state while the input clock signal CLK [D(N−1)] is in the high state, and FIG. 7E illustrates the case in which the first inversion control signal transitions to the active high state while the input clock signal CLK [D(N−1)] is in the low state. As shown in FIGS. 7D and 7E, regardless of the state of the input clock signal CLK [D(N−1)], the data D in the flip-flop is inverted when the second inversion control signal transitions from high to low.

Figure 8A:
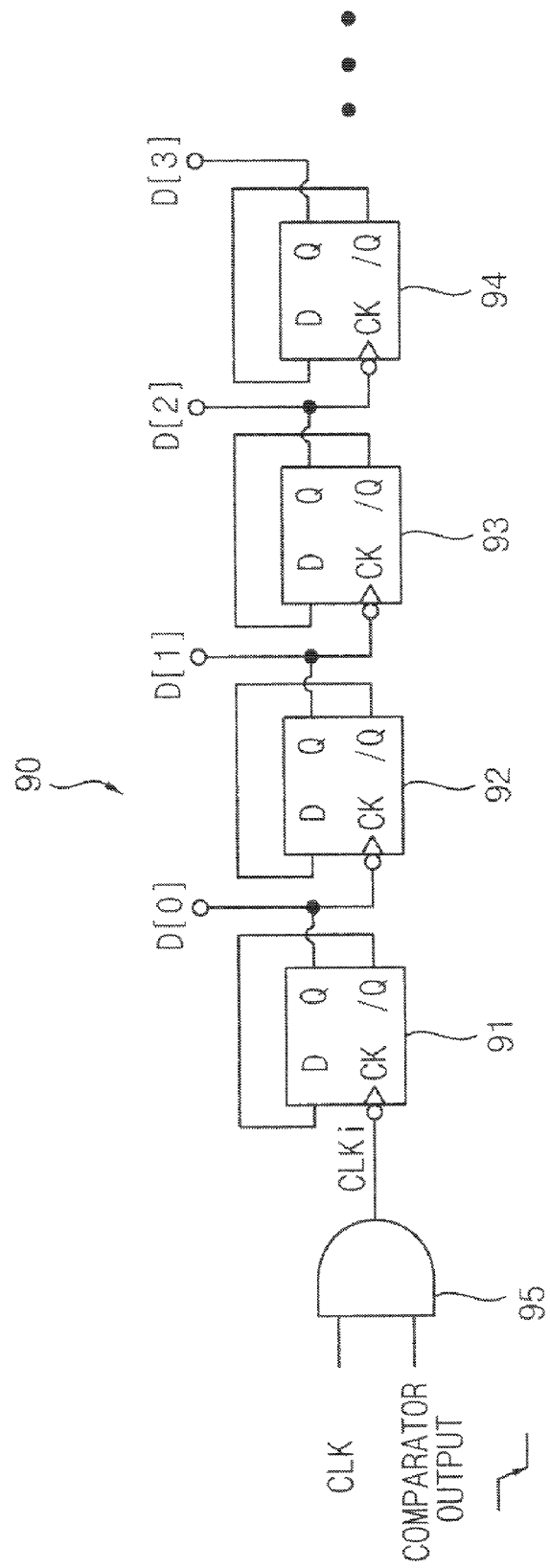
FIGS. 8A-8C illustrate a ripple counter used in conventional approaches to dual CDS. Specifically, FIG. 8A contains a schematic block diagram of a ripple counter.
Figures 8B, 8C:
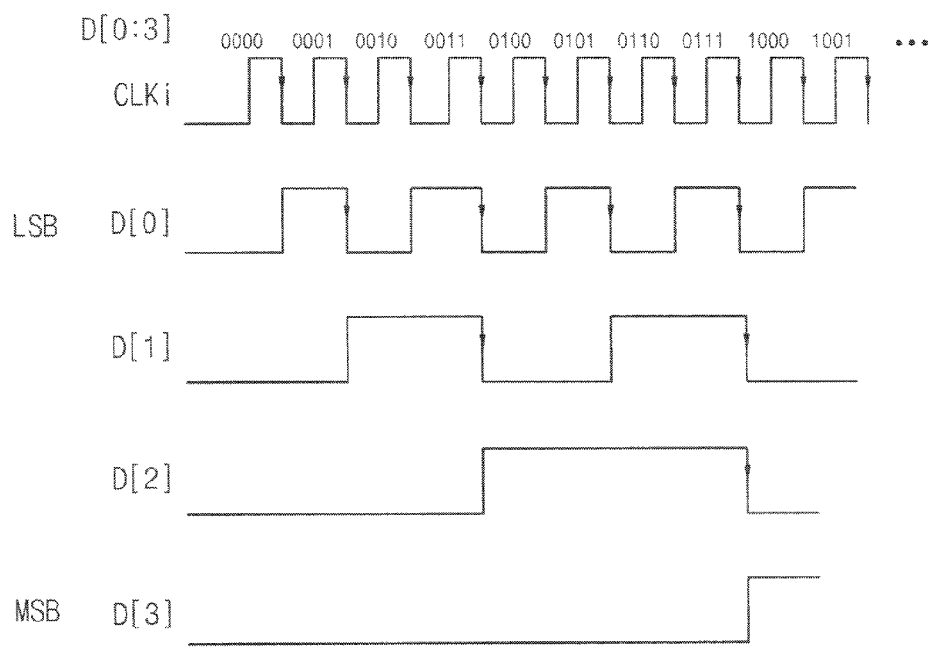

In column parallel single slope ADC approaches, a ripple counter has been commonly used as the ADC counter. FIGS. 8A-8C illustrate a ripple counter used in conventional approaches to column parallel single slope ADC. Specifically, FIG. 8A contains a schematic block diagram of a ripple counter 90. FIG. 8B is a timing diagram illustrating the toggling of data bits of the counter 90 during counting. FIG. 8C is a table illustrating the relative frequency of bit toggling and relative power consumption for the bits in a ripple counter during counting. In single slope ADC, the counter is a global counter and column latch. When the comparator of each column toggles, the column latch of the toggled column catches the output of the global counter at the moment the comparator toggles. This is done for each column.

Referring to FIG. 8A, the ripple counter 90 is illustrated as including four stages, each of which includes a D flip-flop 91, 92, 93, 94. Each stage includes an edge-triggered clock input CK and a data output signal Q representing data D of the stage. The four illustrated data output signals D[0], D[1], D[2], D[3] represent the data contents of the counter 90. It is noted that data signal D[0] represents the LSB of the value in the counter 90. Data signal D[3] represents the most significant bit (MSB) of the value in the counter 90. An input clock signal CLK is applied along with the output of the ADC comparator to an AND gate 95 to generate the clock signal CLKi that is applied to the edge-triggered clock input CK of the first stage 91. The D output signal from each stage serves as the clock signal for the immediately following stage and is applied to the edge-triggered CK input of the immediately following stage.

Referring to FIGS. 8B and 8C, it is noted that during counting in the conventional ripple counter 90 illustrated in FIG. 8A, the count in the counter 90 is updated on each trailing edge of the input clock signal CLK. The LSB of the value in the counter D[0] toggles in every count update. The bit D[1] toggles half as frequently, the bit D[2] toggles half again as frequently, and the MSB D[3] toggles the least frequently. The relative power consumption contributed by the toggling of each bit is also tabulated in the table of FIG. 8C. It is noted that the toggling of the LSB D[0] is responsible for more than half of the total power consumption due to bit toggling.

Figure 9A:
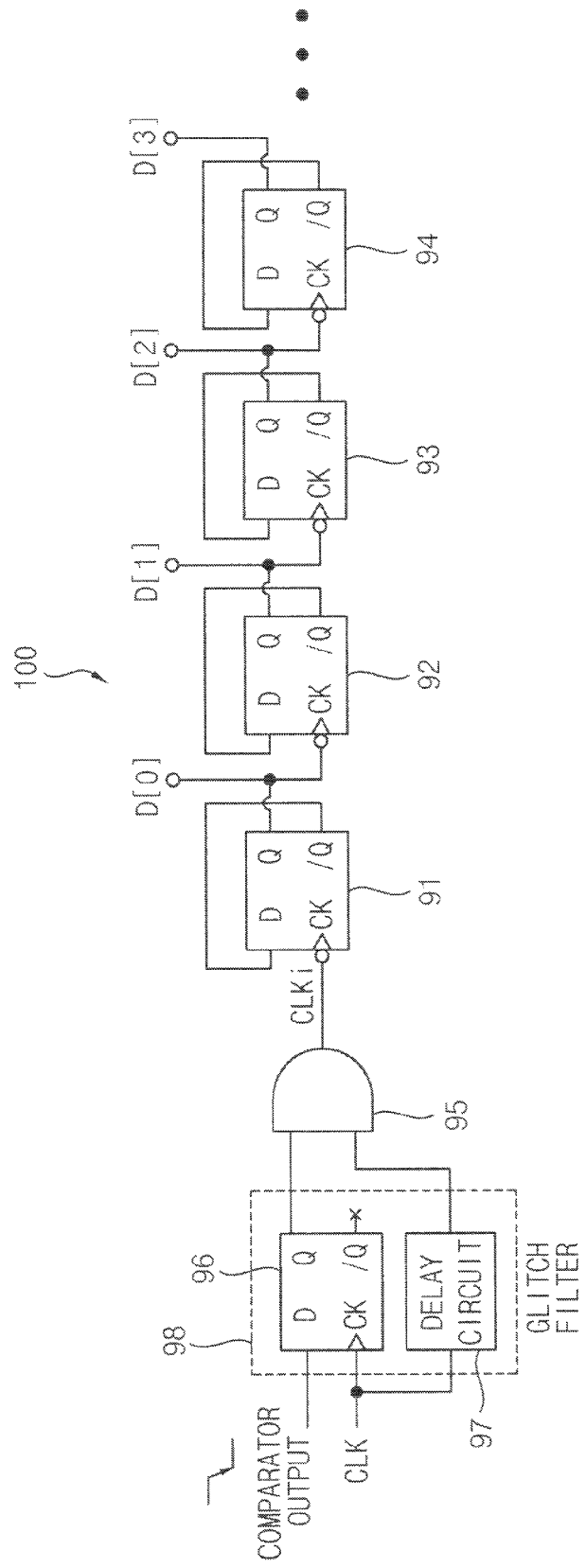
FIGS. 9A-9C illustrate the existence of a glitch in the conventional column ADC ripple counter illustrated in FIG. 8A. Specifically.
Figure 9B:
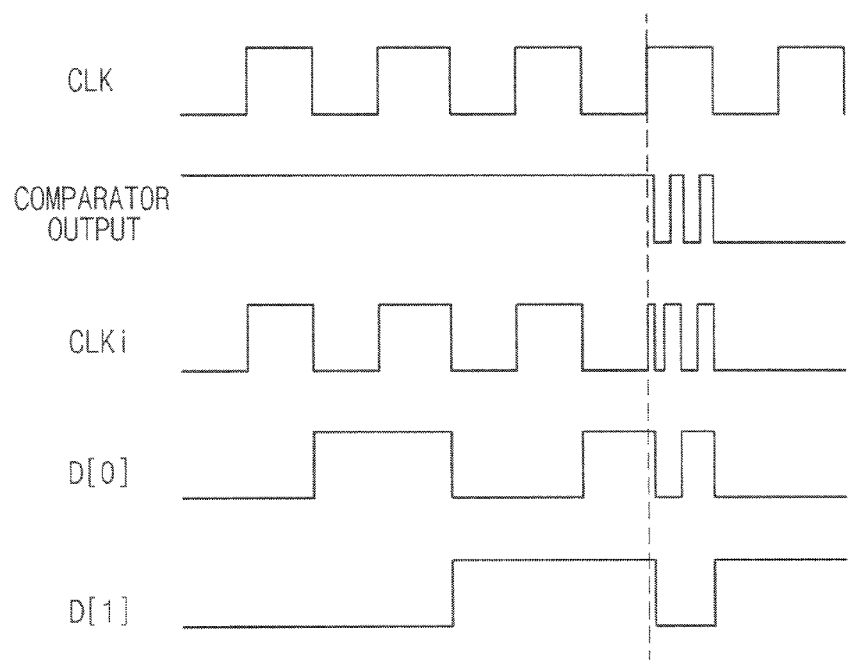
Figure 9C:
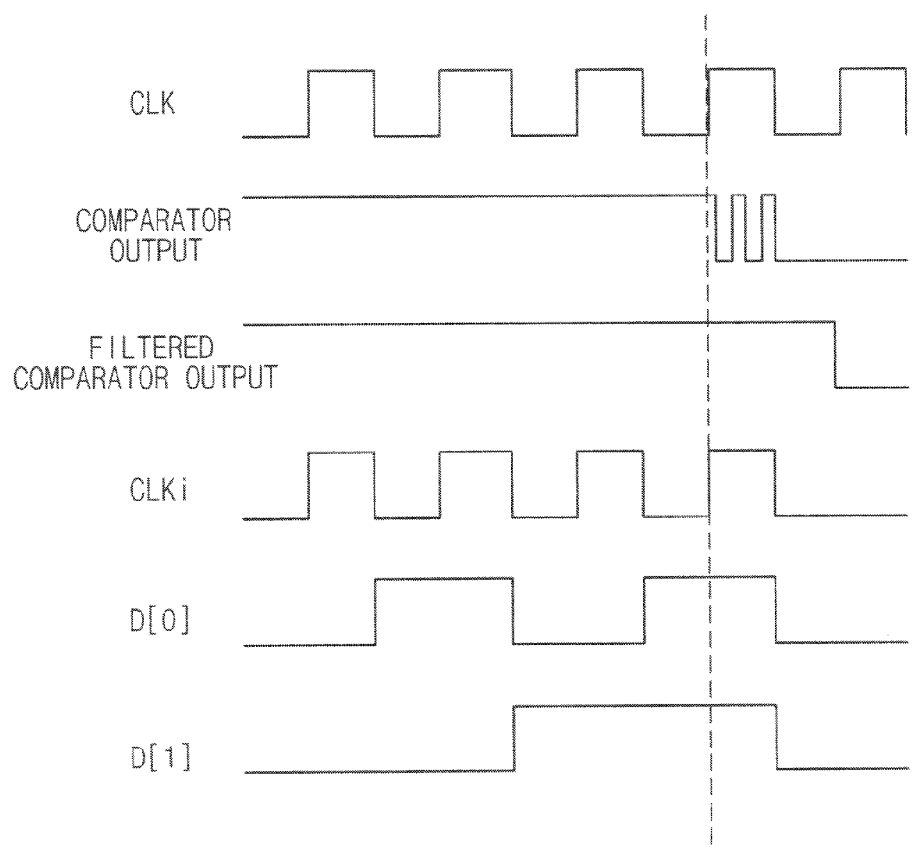

FIGS. 9A-9C illustrate the existence of a "glitch" in the conventional column ADC ripple counter 90 illustrated in FIG. 8A. Specifically, FIG. 9A is a schematic block diagram of a ripple counter 100 with an additional glitch filter circuit 98 used to eliminate the glitch. FIG. 9B is a timing diagram illustrating the glitch using the conventional ripple counter 90. FIG. 9C is a timing diagram illustrating the elimination of the glitch using the glitch filter 98 with the ripple counter 100.

Referring to FIG. 9A, the glitch filter 98 includes a D flip-flop 96 and a delay circuit 97. The comparator output from the ADC is applied to the D input of the D flip-flop 96. The clock input CLK is applied to the CK input of the flip-flop 96. The clock input CLK is also applied to the input of the delay circuit 97, and a delayed version of the clock, delayed by the delay circuit 97, is applied to one of the inputs of the AND gate 95. A filtered version of the comparator output, generated by the D flip-flop 96, appears at the Q output of the flip-flop 96 and is applied to the other input of the AND gate 95. The output of the AND gate 95 is applied to the CK input of the first stage 91 of the ripple counter 100 as the input clock signal CLKi.

FIG. 9B illustrates the glitch in the ripple counter 90 of FIG. 8A. Referring to FIGS. 8A and 9B, if the comparator output oscillates, i.e., repeatedly changes states, before settling, then the clock input signal CLKi applied to the CK input of the first stage 91 may also oscillate, i.e., change states. These oscillations in the CLKi signal cause undesired counting in the ripple counter 90. That is, as noted in the timing diagram of FIG. 9B, the bits of the counter D[0] and D[1] may change states as the counter 90 carries out the undesired additional counting caused by the glitch. As a result, the value of the count in the counter 90 is inaccurate.

The glitch filter circuit 98 of FIG. 9A eliminates this problem by introducing sampling i.e. filtering the comparator output at the positive edge of the CLK. Referring to FIG. 9C, which shows the timing of signals in the ripple counter 100 with the glitch filter circuit 98, oscillations in the comparator output as it settles at its new state do not result in oscillations in the input clock signal CLKi applied at the CK input of the first stage 91. Thus, the additional undesired counting caused by the glitch is eliminated, resulting in an accurate value in the counter 100.

It is noted that in the conventional column ADC ripple counter, as illustrated in FIGS. 8A and 9A, the input clock frequency is the same as the operating frequency of the counter. This poses a restriction on the operational frequency of the counter. This together with the high power consumption in the toggling of the LSB of the counter results in significant drawbacks in the conventional column ADC counter.

In high-speed circuits, such as the counter used in column ADC of CMOS image sensors, is it desirable to operate at high frequency and to control power consumption. Double data rate (DDR) counters have been widely used to provide circuits which operate at higher frequencies than conventional counters. Generally, DDR counters count on both edges, i.e., rising edge and falling edge, of the input clock signal, instead of on only the rising edge or falling edge of the input clock signal. As a result, DDR counters operate at twice the frequency of the input clock frequency.

According to the inventive concept, a DDR counter is provided in which the counter provides a count at twice the input clock frequency, while the frequency of toggling of the LSB of the counter is reduced. This results in a high-speed DDR counter, which can be used, for example, in column ADC performing CDS in a CMOS image sensor, with substantially reduced power consumption, due to the reduction in toggling of the LSB.

Figure 10:
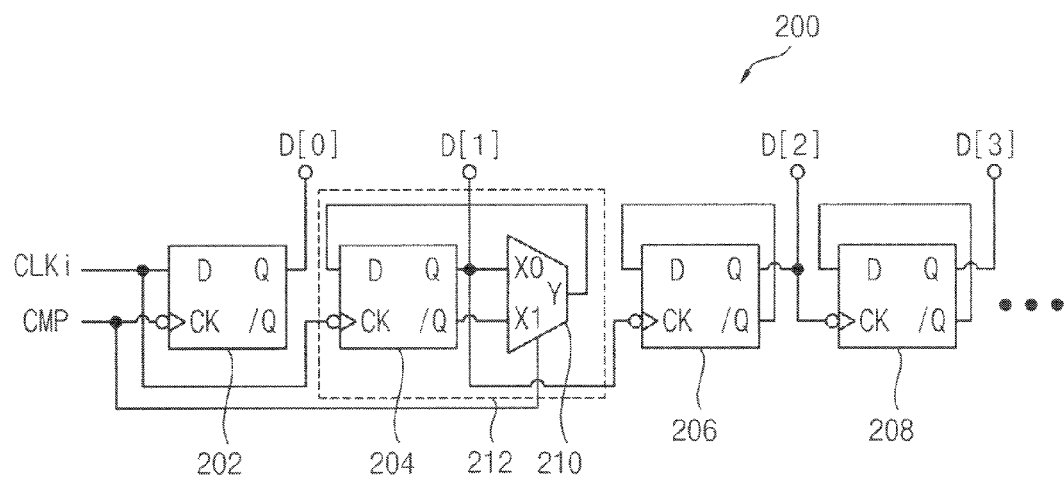
FIG. 10 is a schematic block diagram of a DDR counter which reduces the amount of toggling in the LSB to reduce overall power consumption, in accordance with one embodiment of the present inventive concept.

FIG. 10 contains a schematic block diagram of a DDR counter 200 which reduces the amount of toggling in the LSB to reduce overall power consumption, in accordance with one embodiment of the present inventive concept. The DDR counter 200 can be used in, for example, column ADC using CDS in a CMOS image sensor.

Referring to FIG. 10, the counter 200 is shown to include four stages 202, 204, 206, 208, each of which includes a D flip-flop. The counter stages 202, 204, 206, 208 generate the data outputs D[0], D[1], D[2] and D[3], respectively, such that the value in the counter 200 includes data bits D[0], D[1], D[2], D[3], where D[0] is the LSB and D[3] is the MSB.

Each of the flip-flops includes a data input D, data outputs Q and /Q and an edge-triggered clock input CK. The /Q outputs of the second and third stages 206, 208 are connected back to the data inputs D of their own respective flip-flop stages. The Q and /Q outputs of the second stage 204 are selectively connected back to the D input of the second stage 204 via a multiplexer circuit 210. The second stage flip-flop 204 and the multiplexer 210 form a count stop circuit 212 for the second stage 204, i.e., data bit D[1] of the value in the counter 200. The counter input clock signal CLKi is applied to the data input D of the first-stage flip-flop 202 and the negative-edge-triggered clock input CK of the second-stage flip-flop 204. The Q output of each of the second and third stages 204, 206 is applied to the negative-edge-triggered clock input CK of the next stage. In the embodiment of the counter 200 of the inventive concept in FIG. 10, the clock inputs CK of all of the stages are negative-edge-triggered.

The counter 200 also acts as a glitch filtering circuit for the comparator output signal CMP, as described above in connection with FIGS. 9A-9C. That is, the counter 200 eliminates any possible negative effects, such as undesired counting, which could result from oscillation or repeated state change of the comparator output signal before it settles at a new state. Since the counting is stopped when the comparator output signal is low, undesired counting is eliminated.

The output signal CMP, which indicates the comparison of the ADC ramp voltage signal and the input analog signal, is applied to the negative-edge triggered clock input CK of the first stage 202. It is noted that in the descriptions herein of all of the embodiments of DDR counters of the inventive concept, the CMP signal may also be referred to as the output signal CDS_OUT from the dual CDS according to the inventive concept. The CMP (or CDS_OUT) signal is also applied to the selection control input of the multiplexer 210. When the comparator output signal CMP is in a high state, the multiplexer 210 selects the /Q output of the second-stage flip-flop 204 to be fed back to the D input of the flip-flop 204 such that, while the comparator output signal CMP is high, the counter 200 counts. In contrast, when the comparator output signal CMP is low, the multiplexer 210 selects the Q output of flip-flop 204 to be fed back to the D input of flip-flop 204, such that the flip-flop 204 does not change states when it is clocked. That is, when the comparator output signal CMP is low, the counting is stopped.

Figure 11A:
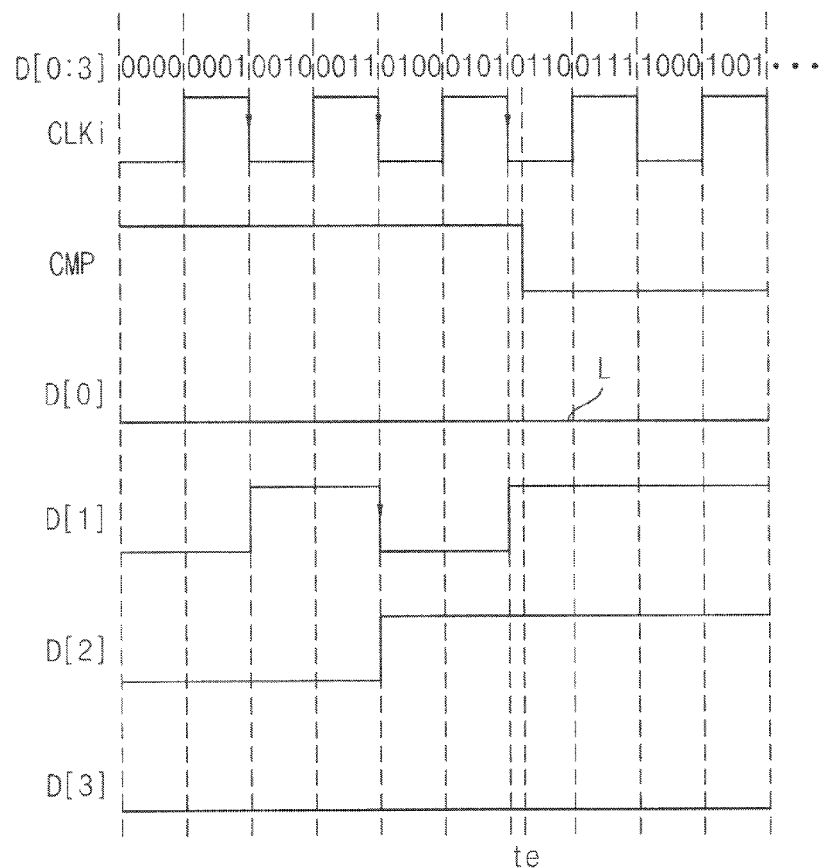
FIGS. 11A and 11B are timing diagrams of two cases of the operation of the counter illustrated in FIG. 10.
Figure 11B:
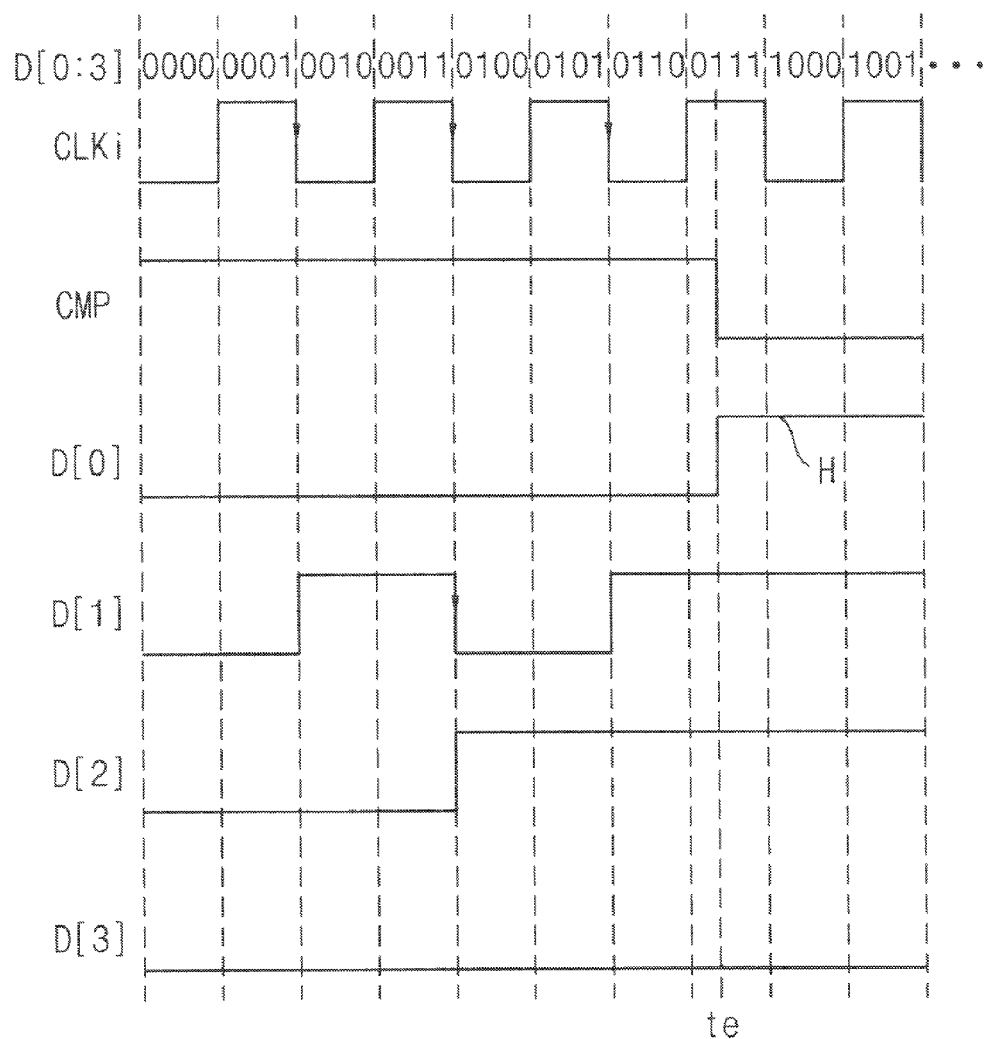

FIGS. 11A and 11B are timing diagrams illustrating operation of the counter 200 illustrated in FIG. 10. The timing diagrams of FIGS. 11A and 11B illustrate the signals for the input clock signal CLKi, the comparator output signal CMP and the four data bits D[0], D[1], D[2], D[3] of the value stored in the counter 200. The timing diagram of FIG. 11A illustrates the case in which the comparator output signal CMP transitions from high to low, to indicate the crossover of the ramp voltage signal and the input analog image data signal, when the input clock signal CLKi is low; and the timing diagram of FIG. 11B illustrates the case in which the comparator output signal CMP transitions from high to low when the input clock signal CLKi is high. As shown in FIGS. 11A and 11B, when the CMP signal is high, the second, third and fourth stages 204, 206, 208 count normally; however, the LSB D[0] does not toggle while the CMP signal is active high and counting is being performed. According to the inventive concept, the LSB need not toggle during counting, as long as the status or state of the input clock signal CLKi at the time the signal CMP transitions from high to low is checked and stored when the first counting stops. To that end, when the CMP signal transitions from high to low, the negative edge of the CMP signal clocks the value of the input clock signal CLKi, which is applied at the D input of the flip-flop 202, to the Q output of the flip-flop 202, and, therefore, the LSB D[0] of the value in the counter 200. Referring to FIG. 11A, if the value of the clock signal CLKi is low at that moment, then the value of D[0] remains low. Referring to FIG. 11B, if the value of CLKi is high at that moment, then the value of D[0] toggles to high.

Thus, in the counter 200, at the end of the first counting, an accurate count value is stored in the counter 200. However, during the counting, the LSB flip-flop 202 was not required to toggle. Also, because the status of the clock signal CLKi is checked and accounted for in the counter value at the end of the counting, the counter 200 acts as a DDR counter. That is, the counter 200 effectively operates to provide a count value at twice the frequency of the input clock signal CLKi. As a result of the reduction in flip-flop toggling in the first stage 202, a DDR counter with reduced power consumption is realized.

Figure 12A:
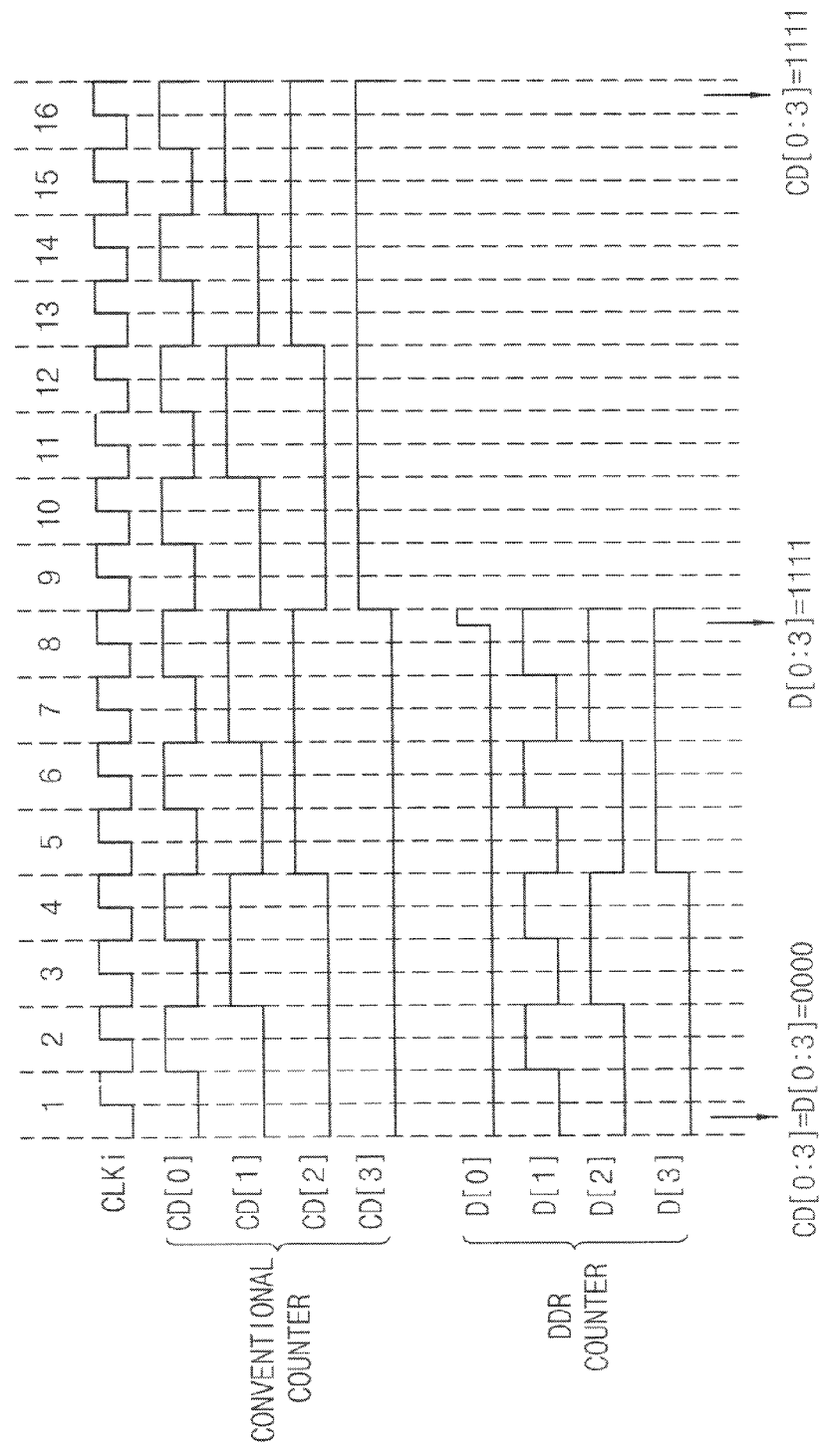
FIG. 12A is a timing diagram comparing the counting of the DDR counter of FIG. 10 with the counting of a conventional counter.
Figures 12B, 13:
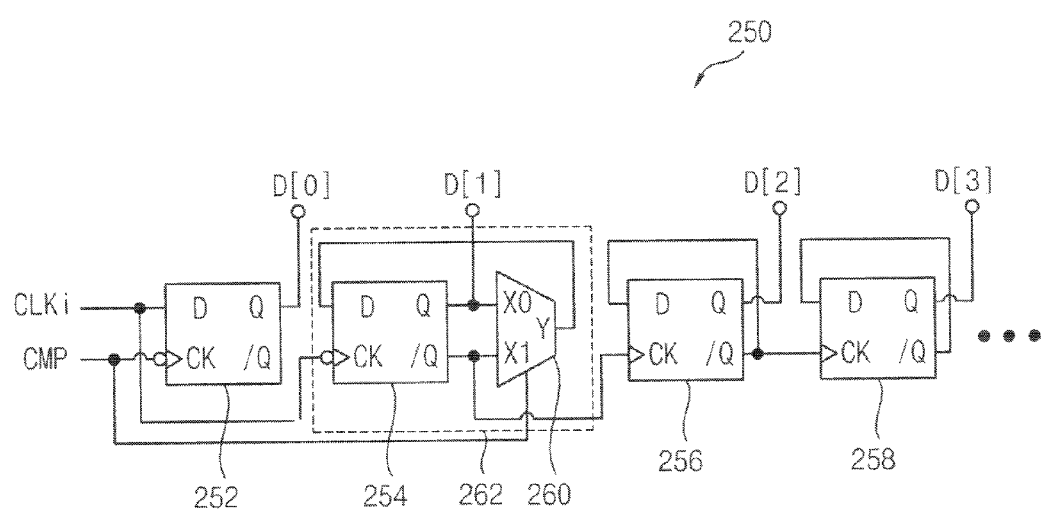
FIG. 12B is a table comparing bit toggling in the counter of FIG. 10 with bit toggling in a conventional counter.
FIG. 13 is a schematic block diagram of another embodiment of a DDR counter according to the inventive concept.

FIG. 12A contains a timing diagram which compares the counting in the counter 200 of FIG. 10 with that of a conventional counter. The data bits values of the conventional counter are CD[0], CD[1], CD[2], CD[3], with CD[0] being the LSB. Sixteen periods of the clock signal CLKi are illustrated. It is noted that, in the conventional counter, the value of the counter increases on each period of the clock CLKi such that, at the end of the sixteen periods, the conventional counter has counted from $0000_2$ to $1111_2$. In contrast, the counter 200 counts from $0000_2$ to $1111_2$ in half the time as the conventional counter, i.e., eight periods of the clock CLKi. FIG. 12B contains a table comparing the bit toggling of the conventional counter with the DDR counter 200 illustrated in FIG. 10. Referring to FIG. 12B, during the counting shown in the timing diagram of FIG. 12A, i.e., counting from $0000_2$ to $1111_2$, in the conventional counter, there are 26 total bit toggles, with the LSB toggling 15 times. In the DDR counter 200 according to the inventive concept, the total number of bit toggles is reduced to 12, and the number of toggles of the LSB is 1. With this substantial reduction in toggling, power consumption in the counter 200 is substantially less than that in a conventional counter.

FIG. 13 is a schematic block diagram of another embodiment of a DDR counter 250 according to the inventive concept. The embodiment of FIG. 13 is similar to the embodiment of FIG. 10. However, in the embodiment of FIG. 13, the first stage D flip-flop 252 and the second stage flip-flop 254 are negative-triggered by the comparator output signal CMP and the input clock signal CLKi, respectively. The third and fourth-stage D flip-flops 256, 258 are both positive-edge-triggered. Also, the second and third-stage /Q outputs are used as the clock inputs for their respective next stages, in contrast to the embodiment of FIG. 10, in which the Q outputs of the second and third stages clock their respective next stages. The count stop circuit 262, including the second-stage flip-flop 254 and the multiplexer 260, functions as the count stop circuit 212 described above in connection with FIG. 10.

Figure 14:
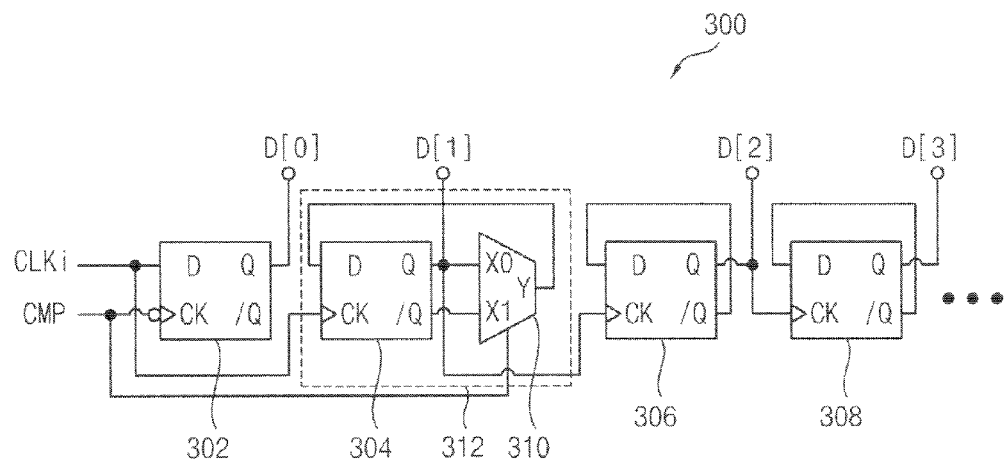
FIG. 14 is a schematic block diagram of another embodiment of a DDR down counter according to the inventive concept.

FIG. 14 is a schematic block diagram of another embodiment of a DDR counter 300 according to the inventive concept. The embodiment of FIG. 14 is similar to the embodiments of FIGS. 10 and 13, except that the counter 300 of FIG. 14 is a down counter. The first stage D flip-flop 302 is negative-edge-triggered by the comparator output signal CMP. The second stage D flip-flop 304 is positive-edge-triggered by the input clock signal CLKi. The third and fourth-stage D flip-flops 306, 308 are both positive-edge-triggered by the Q outputs of their immediately preceding stages. The count stop circuit 312, including the second-stage flip-flop 304 and the multiplexer 310, functions as the count stop circuit 212 described above in connection with FIG. 10.

Figure 15:
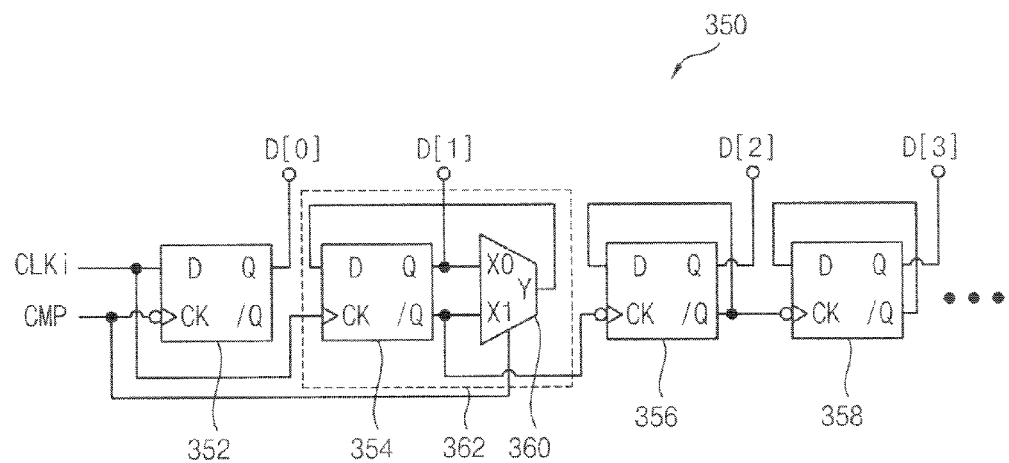
FIG. 15 is a schematic block diagram of another embodiment of a DDR down counter according to the inventive concept.

FIG. 15 is a schematic block diagram of another embodiment of a DDR counter 350 according to the inventive concept. The embodiment of FIG. 15 is similar to the embodiment of FIGS. 10, 13 and 14, and, like the counter 300 of FIG. 14, is a down counter. The first stage D flip-flop 352 is negative-edge-triggered by the comparator output signal CMP. The second stage D flip-flop 354 is positive-edge-triggered by the input clock signal CLKi. The third and fourth-stage D flip-flops 356, 358 are both negative-edge-triggered by the /Q outputs of their respective immediately preceding stages. The count stop circuit 362, including the second-stage flip-flop 354 and the multiplexer 360, functions as the count stop circuit 212 described above in connection with FIG. 10.

In each of the DDR counters of FIGS. 13, 14 and 15, the LSB of the value in the counter does not toggle during the counting. Accordingly, the DDR counters of FIGS. 13, 14 and 15 provide substantially reduced power consumption due to the reduction in bit toggling during counting.

Figure 16A:
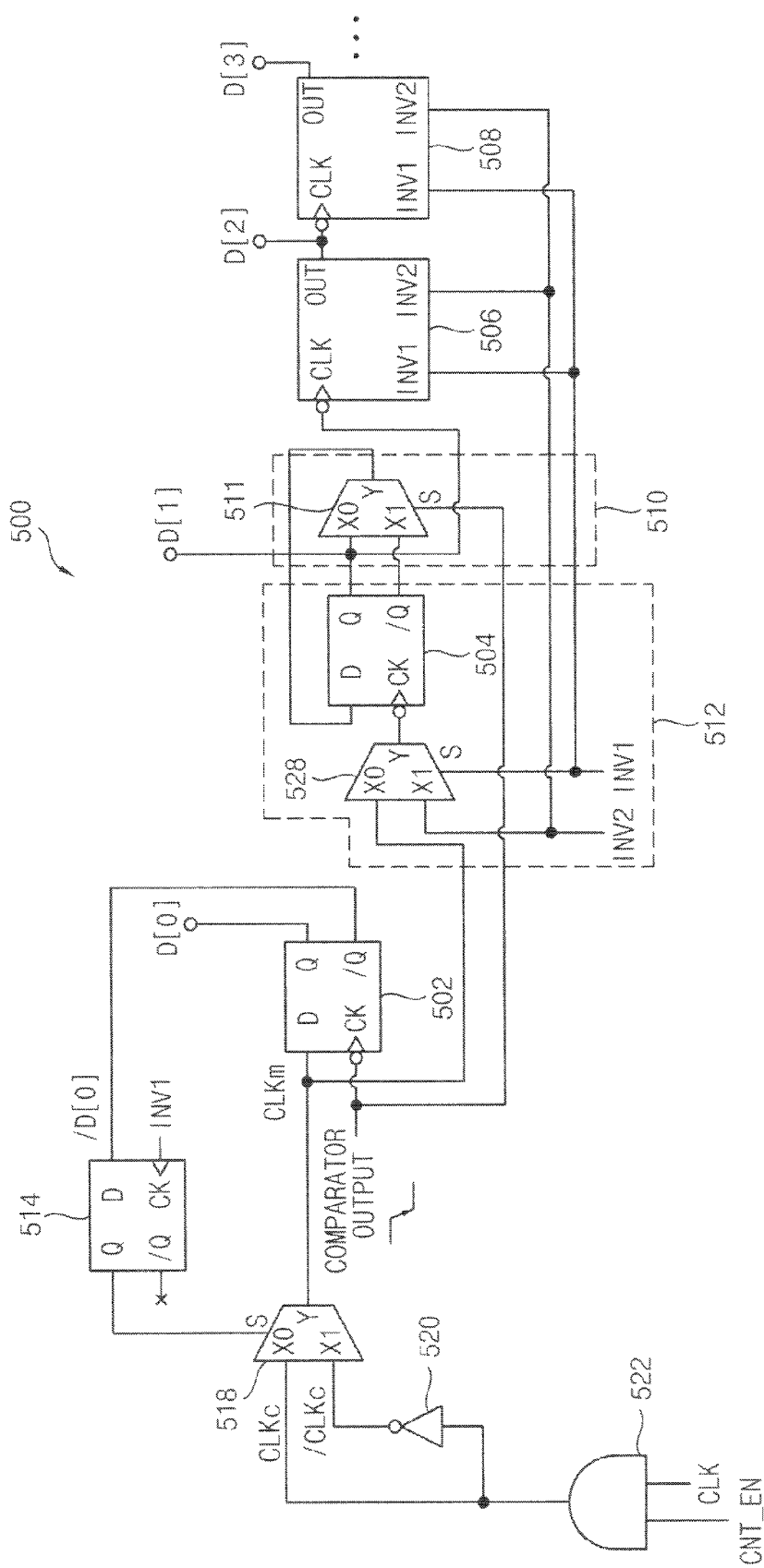
FIG. 16A is a schematic block diagram of another embodiment of a DDR counter according to the inventive concept.

FIG. 16A is a schematic block diagram of another embodiment of a DDR counter 500 according to the inventive concept. As with the other embodiments of DDR counters described herein, the DDR counter 500 of FIG. 16A reduces the amount of toggling in the LSB to reduce overall power consumption. The DDR counter 500 can be used in, for example, column ADC using CDS in a CMOS image sensor.

Referring to FIG. 16A, the DDR counter 500 is an inversion counter, i.e., a BWI counter of the type described above in connection with FIG. 7A. However, the BWI counter 500 of the inventive concept includes several improvements over and variations on the BWI counter of FIG. 7A.

As described above, during operation, the BWI counter counts up until the comparator output signal indicates the crossover of the ramp signal and the analog input image data signal. Then, an inversion is carried out on the bits stored in the counter, and the second sampling proceeds with the counter counting up from the inverted value stored in the counter after the inversion. When the comparator output signal indicates the second crossover during the second sampling, the analog-to-digital conversion value stored in the counter is the difference between the two counting values generated during the two sampling procedures.

The DDR counter 500 of FIG. 16A is shown to include, for example, four stages 502, 504, 506, 508, which are configured using D flip-flops. The third and fourth stages 506 and 508 are implemented as one-bit inversion counters of the type described above in connection with FIG. 7B. The value in the counter 500, represented by data bits D[0], D[1], D[2], D[3], is generated by the first through fourth stages, 502, 504, 506, 508, respectively.

The DDR counter 500 of FIG. 16A includes a count stop circuit 510, which includes a multiplexer 511. The multiplexer 511 selects between the Q and /Q outputs of the second-stage flip-flop 504 to be fed back to the D input of the second-stage flip-flop 504.

The DDR counter 500 of FIG. 16A also includes a clock MUX circuit which includes multiplexer 518. The external clock signal CLK and a count enable control signal CNT_EN, generated in, for example, a counter controller external to the counter 500, are applied to an AND gate 522, which may also be in the external counter controller. When counting is enabled by the CNT_EN signal, the CLK signal is passed through the AND gate 522 to generate the clock signal CLKc. The clock signal CLKc is applied to an inverter 520 to generate the inverted clock signal /CLKc. The clock signal CLKc and the inverted clock signal /CLKc are applied to the X0 and X1 inputs, respectively, of the clock MUX multiplexer 518. The selection performed by the multiplexer 518 is controlled by the signal ST from the flip-flop 514. When the ST signal is in a high state, the inverted clock signal /CLKc is selected, and, when the ST signal is in a low state, the noninverted clock signal CLKc is selected. Based on this selection, the multiplexer 518 outputs either the noninverted clock signal CLKc or the inverted clock signal /CLKc as the clock signal CLKm.

The clock signal CLKm is applied to the D input of the first-stage flip-flop 502 and to the X0 input of the multiplexer 528 of a BWI circuit 512 of the counter 500. Two inversion control signals INV1 and INV2 control the inversion operation of the counter 500. The comparator output signal CMP is applied to the negative-edge-triggered clock input CK of the first-stage flip-flop 502. The comparator output signal CMP is also applied to the selection control input S of the multiplexer 511 in the count stop circuit 510. Hence, the comparator output signal CMP selects which of the Q and /Q outputs of the second-stage flip-flop 504 is fed back to the D input of the flip-flop 504 to effect the count stop process. Specifically, when the comparator output signal CMP is in a high state, the /Q output is fed back to the D input such that counting takes place, and, when the comparator output signal CMP is in a low state, the Q output is fed back to the D input to hold or stop the counting.

During counting, the INV1 signal is inactive low and the INV2 signal is active high, such that the multiplexer 528 applies the clock signal CLKm to the negative-edge-triggered CK input of the second-stage flip-flop 504 via the output signal from the multiplexer 528. When the inversion is to be carried out, the inversion signal INV1 transitions to the active high state, such that the multiplexer 528 applies the second inversion signal INV2 to the CK input of the flip-flop 504. When the second inversion control signal INV2 transitions from high to low, the flip-flop 504 is triggered. The inversion control signals INV1 and INV2 also operate to invert the contents of the third and fourth stages 506, 508 in accordance with the description above in connection with FIGS. 7B and 7C.

The DDR counter 500 of FIG. 16A also includes a flip-flop 514 used to check and store the state or status of the LSB D[0], or, similarly, /D[0], at the time of the inversion. During counting, when the first inversion control signal INV1 is inactive low, the flip-flop is not clocked and, therefore, does not change states. After inversion occurs and the second sampling and counting begin, it is important to ensure that the counter starts at the correct value to ensure an accurate second count. To that end, the value of data bit D[0] must be set to a particular value and data bit D[1] must be toggled on either the next positive or negative edge of the clock signal CLKm as the second counting begins. These are determined by the state of the LSB D[0] when inversion takes place. Specifically, if the value in the counter 500 is even at the time of inversion, i.e., D[0]=0,D[1] should be toggled on the next positive edge of the clock signal CLKm, and D[0] should start at the value 1. On the other hand, if the value in the counter 500 is odd at the time of inversion, i.e., D[0]=1, then D[1] should be toggled on the next negative edge of CLKm, and D[0] should start at the value 0. This is accomplished by using the ST signal, which indicates the state of /D[0] at the time of inversion, to control the selection of either the clock signal CLKc or the inverted clock signal /CLKc via the multiplexer 518 in the clock MUX circuit. Specifically, if the value of D[0]=0 at the time of inversion, then /D[0]=1 such that ST=1, and the inverted clock signal /CLKc is selected as the CLKm signal. If, on the other hand, D[0]=1 at the time of the inversion, then /D[0]=0 such that ST=0, and the noninverted clock signal CLKc is selected as the CLKm signal.

Figure 16B:
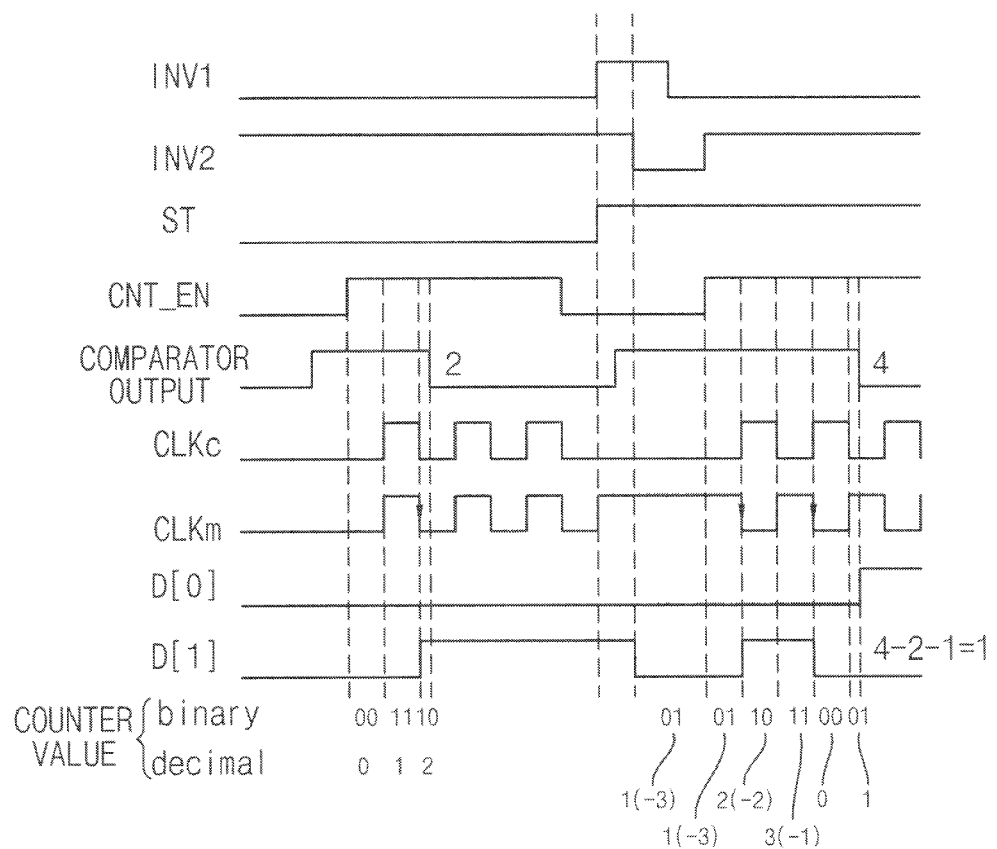
FIGS. 16B and 16C contain timing diagrams illustrating the operation of the counter of FIG. 16A through counting and inversion for the case in which the value in the counter at the time of inversion is an even number and the case in which the value in the counter at the time of inversion is an odd number, respectively.
Figure 16C:
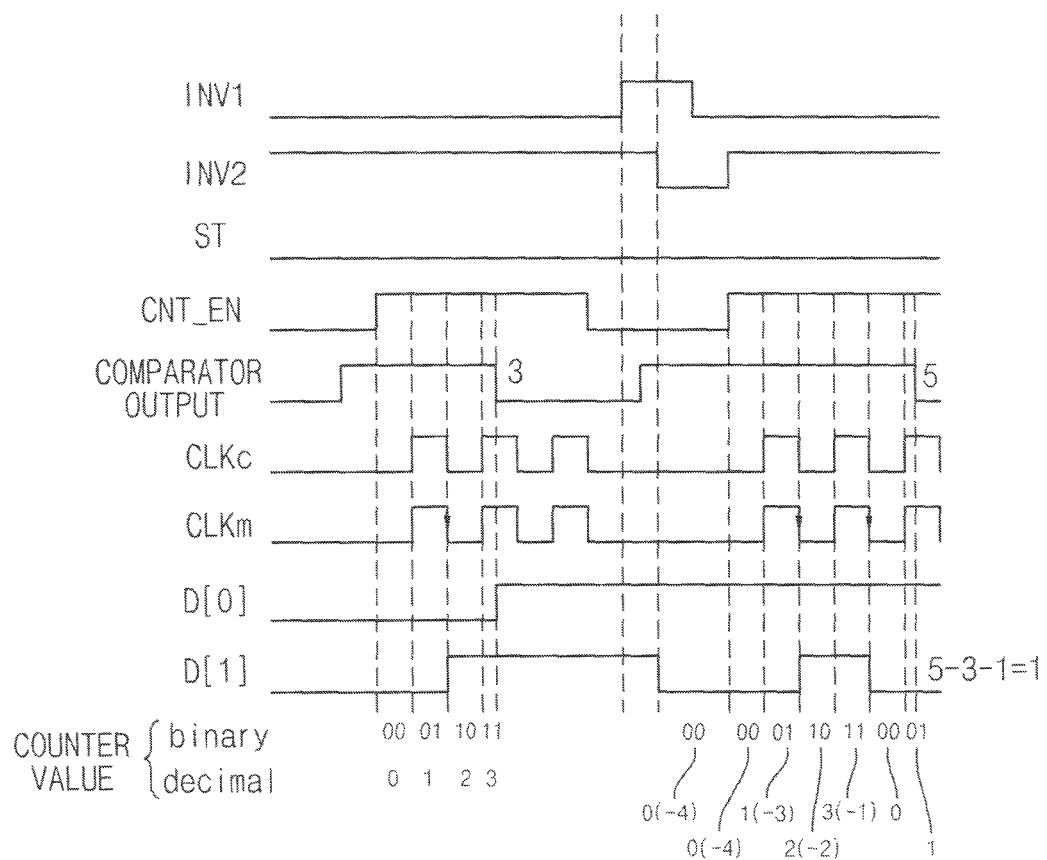

FIGS. 16B and 16C contain timing diagrams illustrating the operation of the counter 500 through counting and inversion for both cases. Specifically, FIG. 16B illustrates the case in which the value in the counter 500 at the time of inversion is an even number, i.e., D[0]=0; and FIG. 16C illustrates the case in which the value in the counter 500 at the time of inversion is an odd number, i.e., D[0]=1. FIGS. 16D-16G are truth tables illustrating the process.

Referring to FIG. 16A-16G, when the comparator output signal and the CLK_EN signal are both high, the counter 500 counts under the clocking of clock signal CLKm. In the exemplary illustration in the timing diagram of FIG. 16B, the comparator output signal CMP transitions to inactive low to indicate crossover after the counter has reached the value decimal $2_{10}$, i.e., binary $10_2$. Specifically, at the end of the first counting, D[0]=0, and D[1]=1. That is, the value in the counter 500 is an even number. It is noted that even though the counting has ended, the clock signals CLKc and /CLKc continue to run because the CNT_EN signal remains active high for a time. When the counting stops, because D[0]=0, the signal ST transitions from low to high and takes the value 1 when the first inversion control signal INV1 transitions to a high state to begin the bit inversion process and clocks the value of /D[0]=1 through the flip-flop 514. The first inversion control signal INV1 is used as the clock for the positive-edge-triggered CK input of the flip-flop 514.

When the signal ST=1 is applied to the multiplexer 518 in the clock MUX circuit, the inverted clock signal /CLKc is selected as the CLKm signal applied to the D input of the first-stage flip-flop 502 and the X0 input of multiplexer 528. The bits of the counter 500 are inverted when the second inversion control signal INV2 transitions to a low state. The second counting begins since the comparator output signal has transitioned back to the high state. When this occurs, when the CNT_EN signal returns to active high, the clock signal CLKm begins clocking again with the inverted clock signal /CLKc being selected. On the first positive edge of the clock signal CLKc, i.e., a negative edge of CLKm, which is /CLKc, the bit D[1] generated in the second stage flip-flop 504 is toggled. The bit D[0] stays low, i.e., does not toggle, until the second high-to-low transition of the comparator output signal. At that point, the value of D[0] is set to the value appropriate for the intended counter value at that point.

The timing diagram of FIG. 16C illustrates the situation in which the value in the counter 500 at the time of crossover, i.e., inversion, is an odd number. In this particular exemplary illustration, the value in the counter is decimal $3_{10}$, i.e., binary 11$_2$. As shown in the timing diagram of FIG. 16C, when the value in the counter is odd, the noninverted clock signal CLKc is selected. After inversion and the second count begins, the value of D[1] in the second-stage flip-flop 504 is toggled on the next negative edge of the clock signal CLKm using the noninverted clock signal CLKc. The bit D[0] stays high, i.e., does not toggle, until the second high-to-low transition of the comparator output signal. At that point, the value of D[0] is set to the value appropriate for the intended counter value at that point.

Referring to the truth tables of FIGS. 16D-16G, FIG. 16D shows the possible states of D[0] and D[1] after the first counting. FIG. 16E shows the states of the bits after inversion. FIG. 16F shows the states of the bits after the first clock positive edge of CLKc of the second counting process. FIG. 16G shows the states of the bits after the first negative clock edge of CLKc of the second counting process. It is noted that the values of FIGS. 16E, 16F and 16G are intended counter values, and not necessarily the actual bit values, since, as noted above, during the second counting, bit D[0] toggles only after the second high-to-low transition of the comparator output signal. As shown in the truth tables, when the value in the counter at the end of the first counting is even, D[1] is toggled on the first positive edge of the clock, i.e., CLKc. If the value in the counter at the end of the second counting is odd, D[1] is toggled on the first negative edge of the clock, i.e., CLKc.

The counter 500 of FIGS. 16A-16G also acts as a glitch filtering circuit for the comparator output signal CMP, as described above in connection with FIGS. 9A-9C. That is, the counter 500 eliminates any possible negative effects, such as undesired counting, which could result from oscillation or repeated state change of the comparator output signal before it settles at a new state. Since the counting is stopped when the comparator output signal is low, undesired counting is eliminated.

Figure 17A:
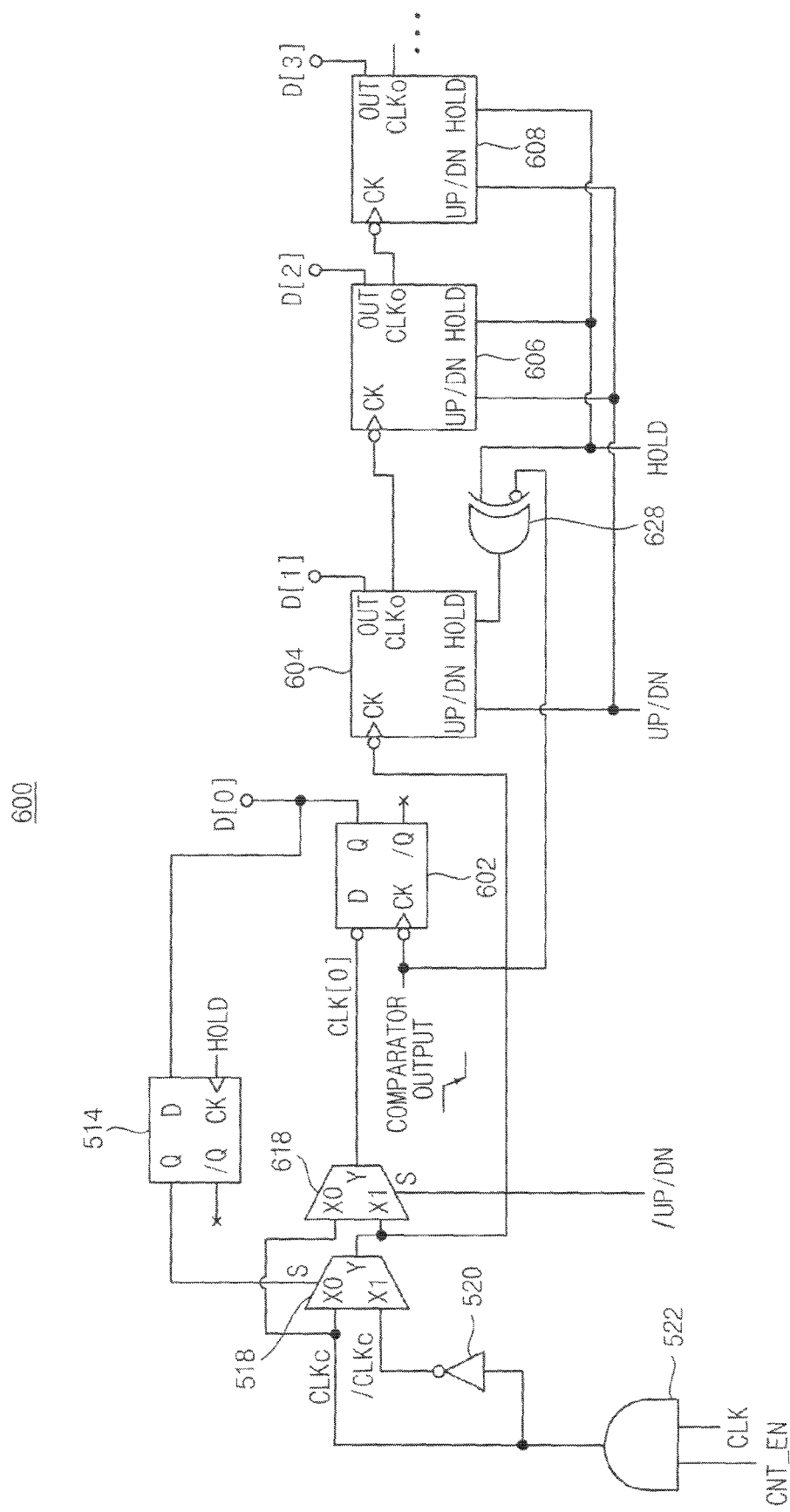
FIG. 17A is a schematic block diagram of another embodiment of a DDR counter according to the inventive concept.

FIG. 17A is a schematic block diagram of another embodiment of a DDR counter 600 according to the inventive concept. As with the other embodiments of DDR counters described herein, the DDR counter 600 of FIG. 17A reduces the amount of toggling in the LSB to reduce overall power consumption. The DDR counter 600 can be used in, for example, column ADC using CDS in a CMOS image sensor.

Referring to FIG. 17A, the DDR counter 600 is an up/down counter of the type described above in connection with FIG. 6A. However, the DDR up/down counter 600 of the inventive concept includes several improvements over and variations on the up/down counter of FIG. 6A.

As described above, during operation, the up/down counter 600 counts down until the comparator output signal CMP indicates the crossover of the ramp signal and the analog input image data signal. Then, the counting is held momentarily before the second counting begins. During the second counting, the counter 600 counts in the up direction. When the comparator output signal CMP indicates the second crossover during the second sampling, the analog-to-digital conversion value stored in the counter 600 is the difference between the two counting values generated during the two sampling procedures.

The DDR up/down counter 600 of FIG. 17A includes many features analogous to those of the BWI counter 500 described above in connection with FIGS. 16A-16G. For example, the clock circuitry and the clock MUX circuitry including multiplexer 518 are similar to those of the DDR counter 500. Also, the flip-flop 514, which stores the state or status of the counter LSB D[0] (or /D[0]) and generates the signal ST is similar to that of the counter 500, except that the flip-flop 514 of the counter 600 is clocked by the HOLD control signal rather than an inversion control signal.

The DDR counter 600 of FIG. 17A is shown to include, for example, four stages 602, 604, 606, 608, which are configured using D flip-flops. The third and fourth stages 606 and 608 are implemented as one-bit up/down counters of the type described above in connection with FIG. 6B. The value in the counter, represented by data bits D[0], D[1], D[2], D[3], is generated by the first through fourth stages, 602, 604, 606, 608, respectively, with D[0] being the LSB and D[3] being the MSB.

The DDR counter 600 of FIG. 17A also includes a clock MUX circuit which includes multiplexers 518 and 618. The external clock signal CLK and a count enable control signal CNT_EN, generated in, for example, a counter controller external to the counter 600, are applied to an AND gate 522, which may also be in the external counter controller. When counting is enabled by the CNT_EN signal, the CLK signal is passed through the AND gate 522 to generate the clock signal CLKc. The clock signal CLKc is applied to an inverter 520 to generate the inverted clock signal /CLKc. The clock signal CLKc and the inverted clock signal /CLKc are applied to the X0 and X1 inputs, respectively, of the clock MUX multiplexer 518. The selection performed by the multiplexer 518 is controlled by the signal ST from the flip-flop 514. When the ST signal is in a high state, the inverted clock signal /CLKc is selected, and, when the ST signal is in a low state, the noninverted clock signal CLKc is selected. Based on this selection, the multiplexer 518 outputs either the noninverted clock signal CLKc or the inverted clock signal /CLKc as the clock signal CLKm.

The clock signal CLKm is applied to the X1 input of the multiplexer 618. The clock signal CLKc is applied to the X0 input of the multiplexer 618. One of the clock signals CLKc and CLKm is selected by the multiplexer 618 to be applied as signal CLK[0] to the D input of the first-stage flip-flop 602. This selection is made according to the state of the /UP/DN, i.e. inverted UP/DN, control signal applied to the selection control input S of the multiplexer 618. During down counting, such as during the first sampling and counting process, the /UP/DN control signal is in the low state, such that the noninverted clock signal CLKc signal is selected by the multiplexer 618 as the CLK[0] signal applied to the D input of the first-stage flip-flop 602. During up counting, such as during the second sampling and counting process, the /UP/DN control signal is in the high state, such that one of the CLKc and /CLKc signals is selected by the multiplexer 618, i.e. CLKm, as the CLK[0] signal applied to the D input of the first-stage flip-flop 602, depending on the state of the ST signal applied at the selection control input of the multiplexer 518. That is, during up counting, the D flip-flop 602 of the first stage D[0] samples CLKm under the clocking of the comparator output signal CMP, and, during down counting, D[0] samples CLKc under the clocking of the comparator output signal CMP.

The comparator output signal CMP is applied to the negative-edge-triggered clock input CK of the first-stage flip-flop 602. An inverted version of the comparator output signal is applied along with the HOLD control signal to an OR gate 628. If either the HOLD control signal or the inverted version of the comparator output signal CMP is high, counting in the second stage is held by the output of the OR gate 628 via the HOLD input of the second stage 604.

The two control signals, namely, the UP/DN control signal and the HOLD control signal, control the up and down counting operations of the counter 600. The HOLD control signal is used to hold or stop the counting temporarily, via the HOLD inputs of the stages.

During counting, the HOLD signal is inactive low to allow counting, and, during the first sampling and counting process, the UP/DN signal is active high, such that the counting proceeds in the down direction. When the comparator output signal CMP transitions to the inactive low state, indicating the crossover of the ramp voltage signal and the analog input image data signal, the counting stops. The CNT_EN signal then transitions to inactive low. Then, the HOLD signal transitions to active high to hold the counting. The transition of the HOLD signal clocks the D flip-flop 514 such that it outputs the value of the bit D[0] at its Q output as the signal ST. The UP/DN control signal transitions to inactive low to change the direction or mode of counting to the up direction. Then, the HOLD control signal transitions to inactive low to release the counter 600 for the second counting in the up direction. Then, the comparator output signal CMP transitions back to active high, and then the CNT_EN signal also transitions back to active high such that counting in the up direction begins on the next negative edge of the CLKm signal.

As noted above, the DDR counter 600 of FIG. 17A also includes a flip-flop 514 used to check and store the state or status of the LSB D[0], or, similarly, /D[0], at the time of the hold and counting mode change, i.e., down counting to up counting. When the HOLD signal transitions to active high, the value of D[0] is clocked through the flip-flop 514 to the Q output as signal ST. When the first down counting begins, the signal ST is initially in the active high stated, such that the inverted clock signal /CLKc is selected as the CLKm signal for the down counting.

After the hold and counting mode change occur and the second sampling and counting begins, it is important to ensure that the counter 600 starts at the correct value to ensure an accurate second count. To that end, the data bit D[1] must be toggled on either the first negative edge of the clock, i.e., CLKc, using the input clock CLKc, or on the first positive edge of the clock, i.e., CLKc, using the inverted input clock /CLKc. These are determined by the state of the LSB D[0] when hold and counting mode change take place. Specifically, if the value in the counter 600 is even at the time of hold and mode change, i.e., D[0]=0, D[1] should be toggled on the first negative edge of the clock, i.e., CLKc, when the up count begins. On the other hand, if the value in the counter 600 is odd at the time of hold and mode change, i.e., D[0]=1, then D[1] should be toggled on the first positive edge of the clock, i.e., CLKc, when the up count begins.

The ST signal determines whether the clock signal CLKc or the inverted clock signal /CLKc will be used as the CLKm signal and, therefore, the edge on which the data bit D[1] will be toggled at the beginning of the up counting. Specifically, if D[0]=0 (even), then ST will be inactive low after the HOLD signal transitions to high. As a result, the multiplexer 518 will select the noninverted clock signal CLKc as CLKm for the up counting, and bit D[1] will toggle on the first negative edge of the clock, i.e., CLKc. On the other hand, if D[0]=1 (odd), then ST will be active high after the HOLD signal transitions to high. As a result, the multiplexer 518 will select the inverted clock signal /CLKc as CLKm for the up counting, and bit D[1] will toggle on the first positive edge of the clock, i.e., CLKc.

Figure 17B:
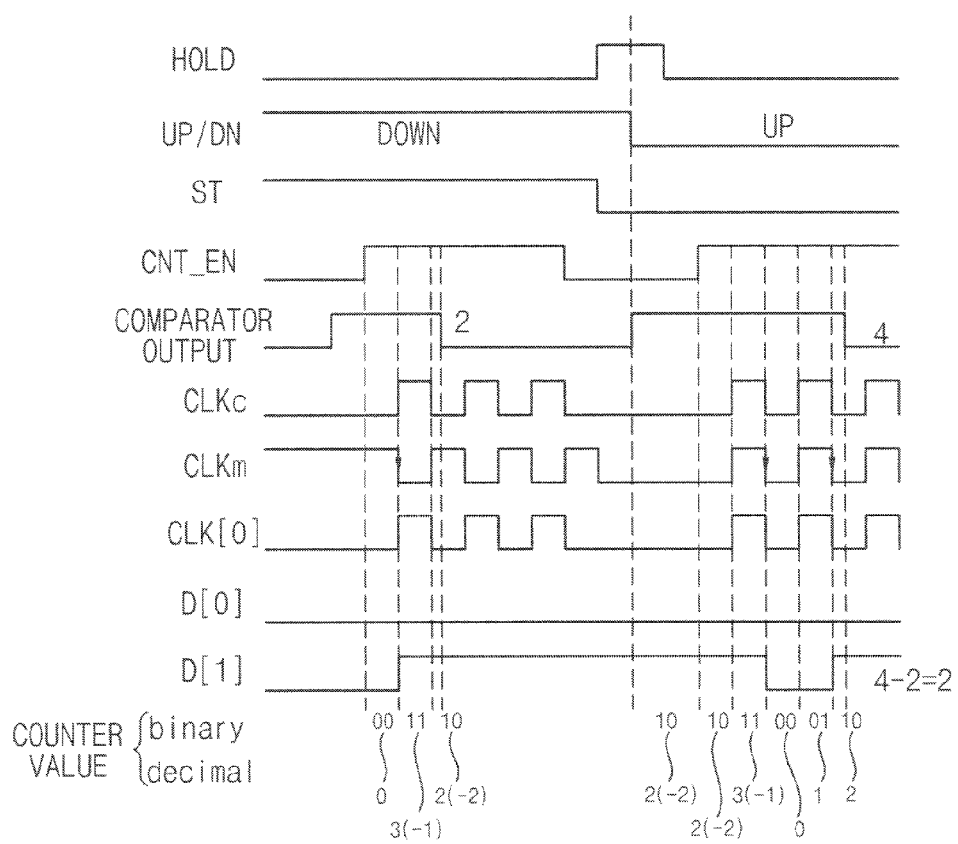
FIGS. 17B and 17C contain timing diagrams illustrating the operation of the counter of FIG. 17A through counting, hold and counting mode change for the case in which the value in the counter at the time of hold and mode change is an even number and the case in which the value in the counter at the time of hold and mode change is an odd number, respectively.
Figure 17C:
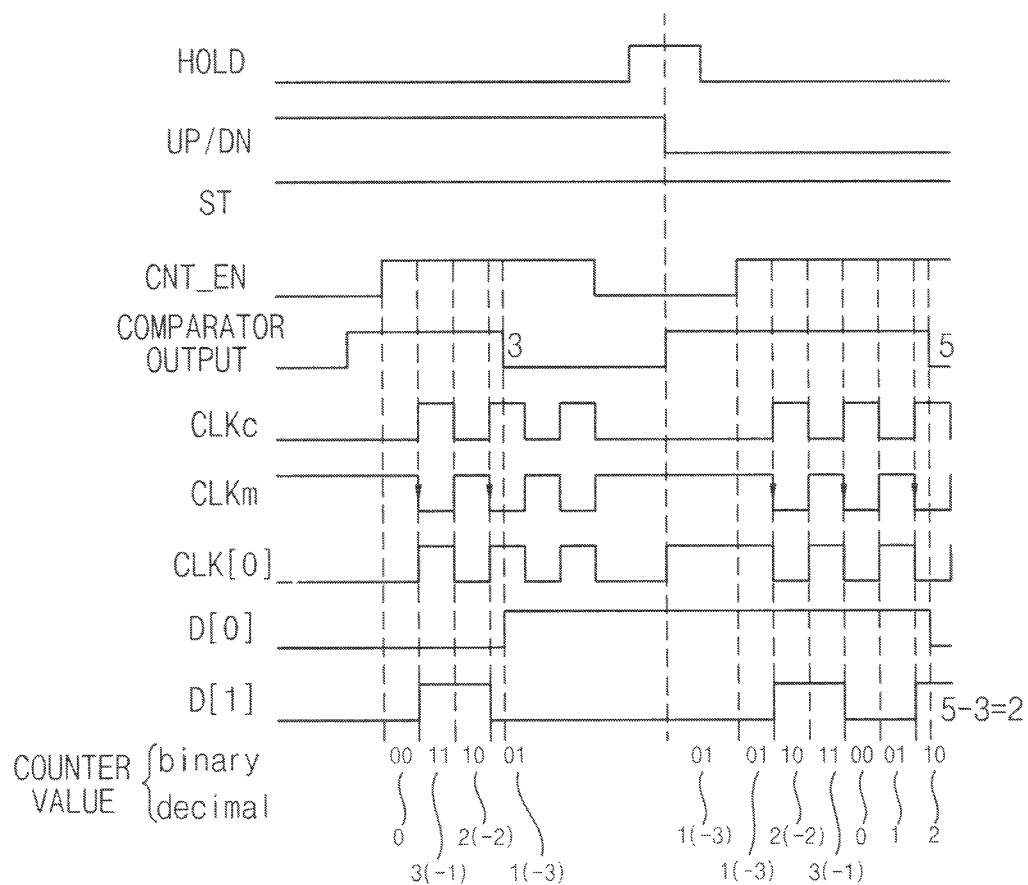
Figures 17F, 18:
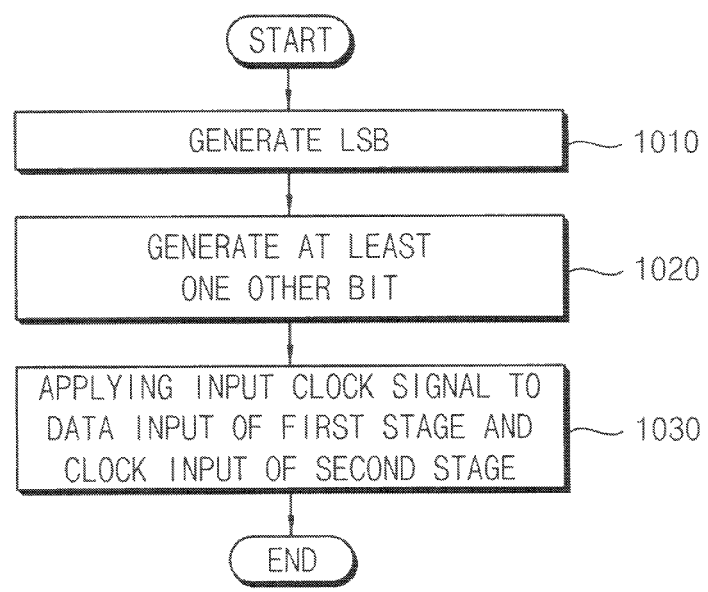

FIGS. 17B and 17C contain timing diagrams illustrating the operation of the counter 600 through counting, hold and counting mode change for both cases. Specifically, FIG. 17B illustrates the case in which the value in the counter 600 at the time of hold and mode change is an even number, i.e., D[0]=0; and FIG. 17C illustrates the case in which the value in the counter 600 at the time of hold and mode change is an odd number, i.e., D[0]=1. FIGS. 17D-17F are truth tables illustrating the process.

Referring to FIG. 17A-17E, when the comparator output signal CMP and the CNT_EN signal are both high and the UP/DN control signal and the ST signal are both initially high, the counter 600 counts down under the clocking of clock signal CLKm, which is the inverted clock signal /CLKc. As shown in the exemplary illustration in the timing diagram of FIG. 17B, the comparator output signal transitions to inactive low to indicate crossover after the counter has reached the value decimal $2_{10}$, i.e., binary $10_2$. Specifically, at the end of the first counting, D[0]=0, and D[1]=1. That is, the value in the counter 600 is an even number. It is noted that even though the counting has ended, the clock signals CLKc and /CLKc continue to run because the CNT_EN signal remains active high for a time. When the HOLD control signal changes state from low to high, because D[0]=0 the signal ST changes state to active low to select the noninverted clock signal CLKc as the clock signal CLKm for the second counting via the multiplexer 518. Next, the UP/DN control signal transitions from high to low to change the counting mode of the second counting to up counting, and the comparator output signal CMP transitions from low to high. Next, the HOLD control signal transitions from high to low to release the counter 600 for the second counting. Next, the CNT_EN signal transitions from low to high to begin the second counting. When the second counting begins, the CLKm clock signal is selected by the multiplexer 618 to be the signal CLK[0] applied to the D input of the first-stage flip-flop 602. The noninverted clock signal CLKc is selected as the clock signal CLKm applied to the clock input of the second stage 604. As shown in FIG. 17B, because the value in the counter at the time of the hold and mode change is even, CLKm is inverted at the positive edge of the HOLD control signal. As a result, data bit D[1] is toggled at the first negative edge of the clock CLKc, and D[0] starts at the value 0. The LSB D[0] samples CLK[0] at the negative edge of the comparator output signal CMP. The signal CLK[0] is CLKc in the down count mode and CLKm in the up count mode.

The timing diagram of FIG. 17C illustrates the situation in which the value in the counter 600 at the time of crossover, i.e., hold and counting mode change, is an odd number. In this particular exemplary illustration, the value in the counter is decimal $3_{10}$, i.e., binary $11_2$. It is noted that even though the counting has ended, the clock signals CLKc and /CLKc continue to run because the CNT_EN signal remains active high for a time. When the HOLD control signal changes state from low to high, because D[0]=1 the signal ST remains in an active high state to select the inverted clock signal /CLKc as the clock signal CLKm for the second counting via the multiplexer 518. Next, the UP/DN control signal transitions from high to low to change the counting mode of the second counting to up counting, and the comparator output signal CMP transitions from low to high. Next, the HOLD control signal transitions from high to low to release the counter 600 for the second counting. Next, the CNT_EN signal transitions from low to high to begin the second counting. When the second counting begins, the value of D[1] is toggled on the first positive edge of the up counting clock signal CLKc, and the value of D[0] starts at 1. In this case, because the down counting ended at an odd number, CLKm is not inverted at the positive edge of the HOLD control signal. The LSB D[0] samples CLK[0] at the negative edge of the comparator output signal CMP. As noted above, CLK[0] is CLKc in the down count mode and CLKm in the up count mode.

Referring to the truth tables of FIGS. 17D-17F, FIG. 17D shows the possible states of D[0] and D[1] after the first counting. FIG. 17E shows the states of the bits after the down-to-up counting mode change and the first count of the up count after the first positive clock edge of the up count clock CLKc. FIG. 17F shows the states of the bits after the second clock edge of the up counting, after the first negative edge of the up count clock CLKc. As shown in the truth tables, when the value in the counter at the end of the first counting is even, the first negative edge of the clock during the second counting toggles the D[1] bit, using the noninverted input clock CLKc; and, when the value in the counter at the end of the first counting is odd, the first positive edge of the clock during the second counting toggles the D[1] bit, using the inverted clock signal /CLKc.

The counter 600 of FIGS. 17A-17F also acts as a glitch filtering circuit for the comparator output signal CMP, as described above in connection with FIGS. 9A-9C. That is, the counter 600 eliminates any possible negative effects, such as undesired counting, which could result from oscillation or repeated state change of the comparator output signal before it settles at a new state. Since the counting is stopped when the comparator output signal is low, undesired counting is eliminated.

FIG. 18 contains a flow chart illustrating a process of counting in a DDR counter, according to one embodiment of the inventive concept. Referring to FIG. 18, the process of DDR counting includes generating an LSB of a count value in a first stage of a DDR counter, as shown in step 1010. At least one other bit, e.g., a more significant bit of the count value in the DDR counter, is generated in a second stage of the counter in step 1020. An input clock signal is applied to a data input of the first stage and a clock input of the second stage, as shown in step 1030.

Figure 19:
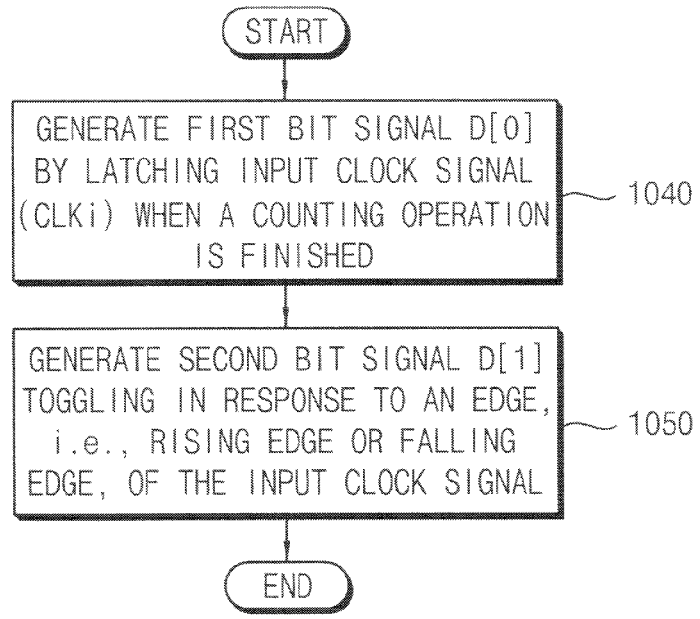
FIG. 19 contains a flow chart illustrating a process of counting in a DDR counter, according to another embodiment of the inventive concept.

FIG. 19 contains a flow chart illustrating a process of counting in a DDR counter, according to another embodiment of the inventive concept. Referring to FIG. 19, a first bit signal, e.g., bit signal D[0], is generated by latching an input clock signal, e.g., clock signal CLKi, when a counting operation is finished, as shown in step 1040. In step 1050, a second bit signal, e.g., bit signal D[1], is generated. The second bit signal toggles in response to an edge, i.e., a rising edge or a falling edge, of the input clock signal.

Figure 20:
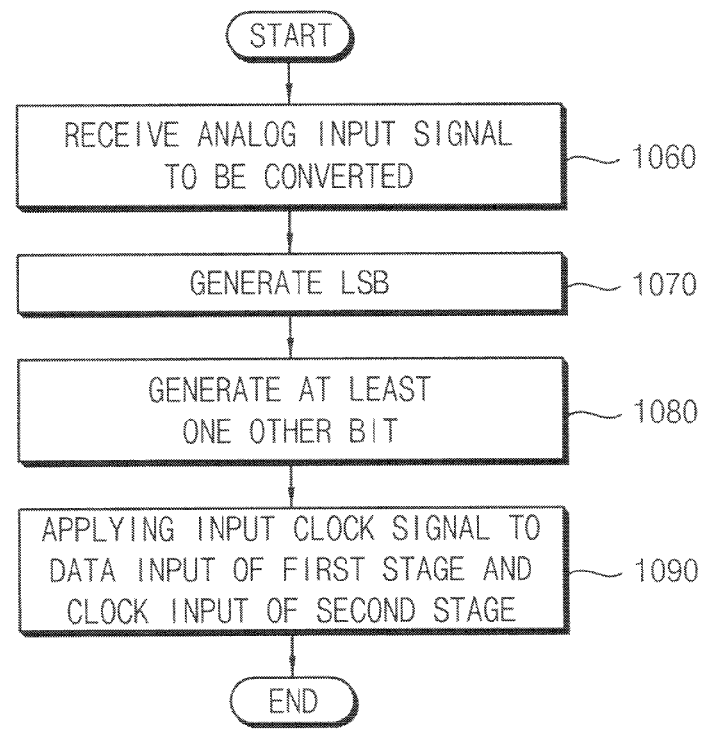
FIG. 20 contains a flow chart illustrating a process of analog-to-digital conversion, according to an embodiment of the inventive concept.

FIG. 20 contains a flow chart illustrating a process of analog-to-digital conversion, according to an embodiment of the inventive concept. Referring to FIG. 20, an analog input signal to be converted to digital is received in step 1060. An LSB is generated in a DDR counter in step 1070. At least one other bit is generated in the DDR counter in step 1080. In step 1090, an input clock signal is applied to a data input of a first stage of the DDR counter, i.e., the stage containing the LSB; and the input clock signal is applied to a clock input of the second stage of the DDR counter, i.e., the stage containing the other bit of the DDR counter.

Figure 21:
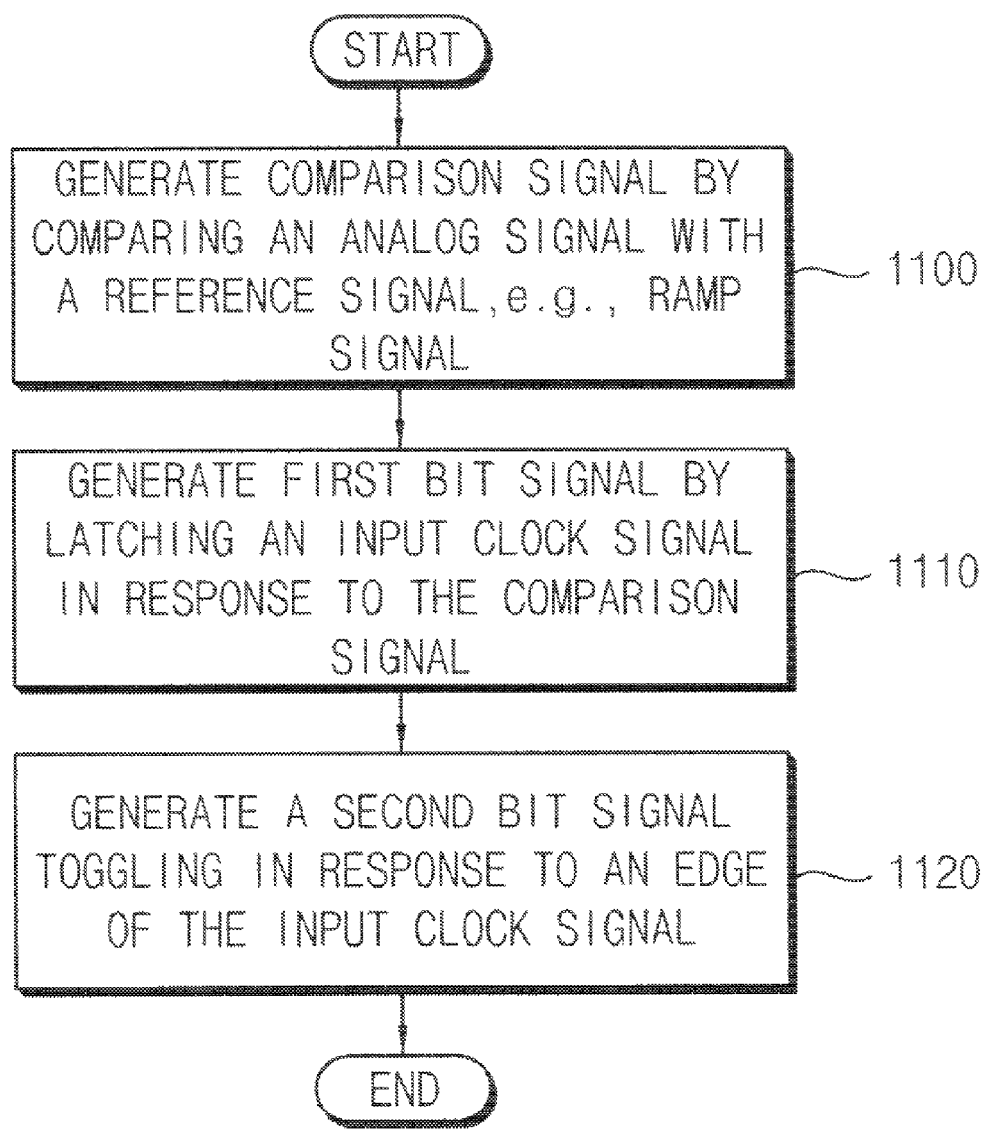
FIG. 21 contains a flow chart illustrating a process of analog-to-digital conversion, according to another embodiment of the inventive concept.

FIG. 21 contains a flow chart illustrating a process of analog-to-digital conversion, according to another embodiment of the inventive concept. Referring to FIG. 21, a comparison signal is generated by comparing an analog signal to be converted with a reference signal, e.g., the ramp signal, in step 1100. A first bit signal is generated by latching an input clock signal in response to the comparison signal, in step 1110. A second bit signal is generated in step 1120. The second bit signal toggles in response to an edge of the input clock signal.

Figure 22:
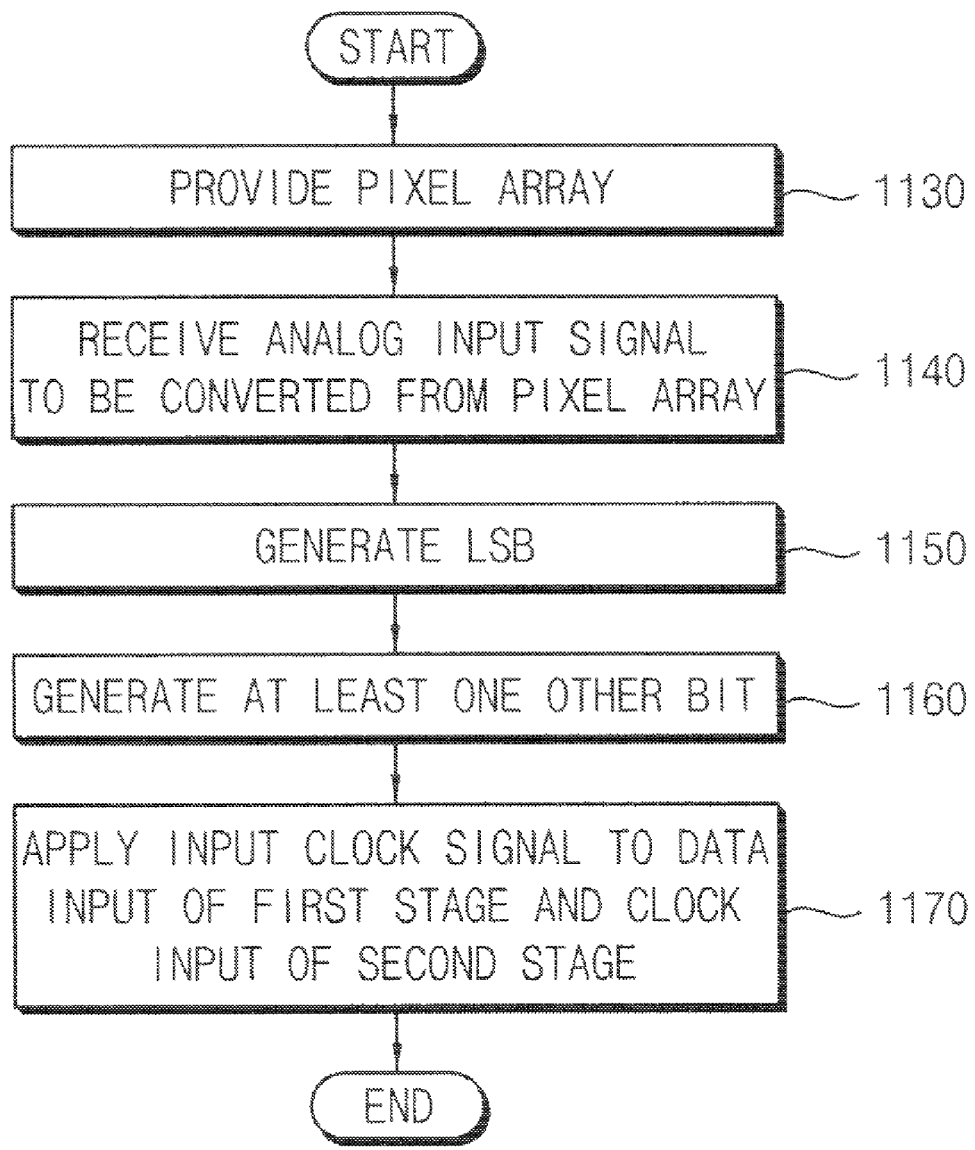
FIG. 22 contains a flow chart illustrating a process of processing an image in a CMOS image sensor, according to an embodiment of the inventive concept.

FIG. 22 contains a flow chart illustrating a process of processing an image in a CMOS image sensor according to an embodiment of the inventive concept. Referring to FIG. 22, a pixel array is provided in step 1130. An analog input signal to be processed, including analog-to-digital converted, is received from the pixel array in step 1140. An LSB of a count value is generated in a first stage of a DDR counter used in the analog-to-digital conversion in step 1150. At least one other bit, e.g., a more significant bit of the count value in the DDR counter, is generated in a second stage of the DDR counter in step 1160. In step 1170, an input clock signal is applied to a data input of the first stage of the DDR counter and a clock input of the second stage of the DDR counter.

Figure 23:
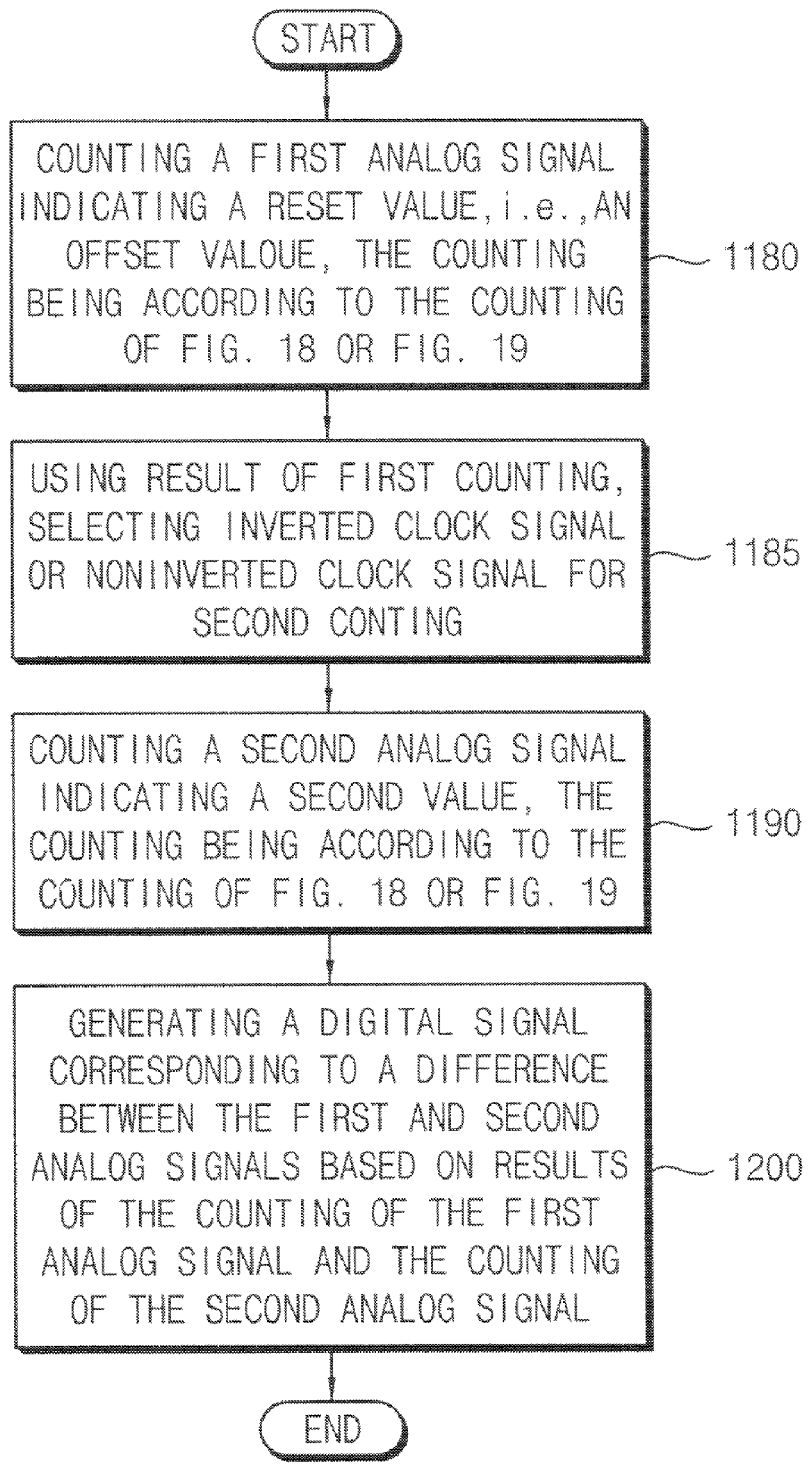
FIG. 23 contains a flow chart illustrating a process of correlated double sampling (CDS), which can be carried out, for example, in a CMOS image sensor, according to an embodiment of the inventive concept.

FIG. 23 contains a flow chart illustrating a process of correlated double sampling (CDS), which can be carried out, for example, in a CMOS image sensor, according to an embodiment of the inventive concept. Referring to FIG. 23, a first counting is performed with respect to a first analog signal, which indicates a reset value, i.e., an offset value, in step 1180. The counting can be performed in accordance with the counting processes described herein with reference to FIG. 18 or 19. In step 1185, after the first counting is complete, the result of the first counting is used to select either an inverted clock signal or a noninverted clock signal to be used for the second counting. As described above, the selected clock signal is based on the value generated by the first counting. This is accomplished by using the ST signal, which indicates the state of the LSB at the end of the first counting, to control the selection of either the clock signal CLKc or the inverted clock signal /CLKc via the multiplexer in the clock MUX circuit. In step 1190, the second counting, with respect to a second analog signal, which can indicate a sensed value, is performed in step 1190, using the clock signal selected in step 1185. The second counting can also be performed in accordance with the counting processes described herein with reference to FIG. 18 or 19. In step 1200, a digital signal corresponding to a difference between the first and second analog signals is generated based on results of the counting of the first analog signal and the counting of the second analog signal.

Figure 24:
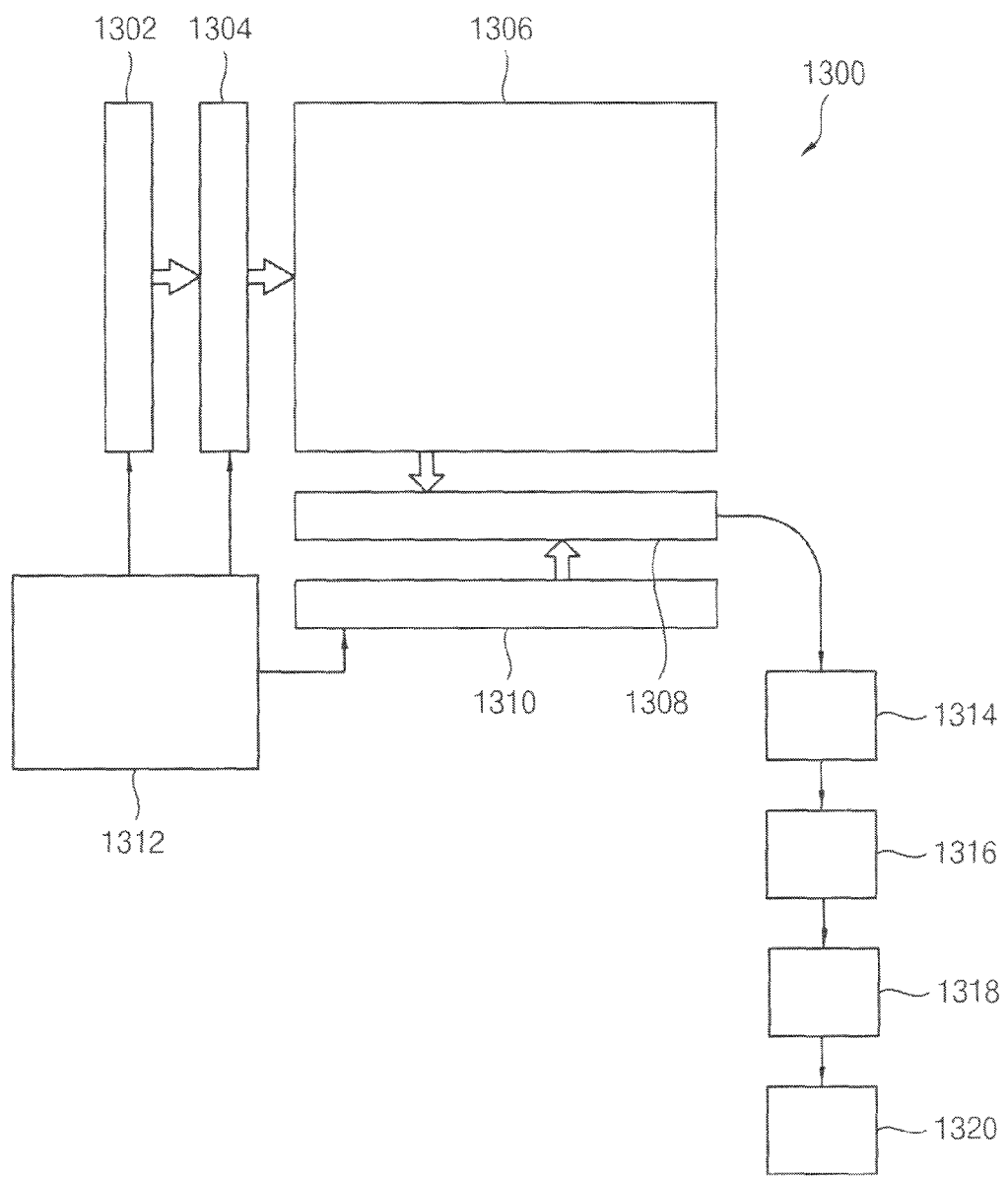
FIG. 24 is a schematic block diagram of an embodiment of a CMOS image sensor according to the inventive concept.

In another aspect, the inventive concept is directed to a CMOS image sensor using any of the embodiments of the DDR counters described herein. FIG. 24 is a schematic block diagram of an embodiment of a CMOS image sensor according to the inventive concept. Referring to FIG. 24, the CMOS image sensor 1300 includes a pixel array 1306 for storing pixel data for an image in a two-dimensional array or matrix of rows and columns. The sensor 1300 is controlled by a control circuit 1312, which controls pixel row and column addressing. To that end, the control circuit 1312 is coupled to a row address decoder 1302 and a column address decoder 1310. The control circuit 1312 controls the address decoders for selecting the appropriate row and column lines for pixel readout and the row and column driver circuitry 1304 and 1308, which apply driving voltages to the drive transistor of the selected row and column lines. The row address decoder 1302 decodes pixel row addresses from the control circuit 1312 and addresses the decoded array rows via the row driver 1304. The column address decoder 1310 decodes pixel column addresses from the control circuit 1312 and addresses the decoded array columns via the column driver 1308. Pixels in each row in the array can all turn on at the same time by a row select line, and the pixel of each column can be selectively output by a column select line. The row lines are selectively activated by the row driver 1304 in response to the row address decoder 1302, and the column select lines are selectively activated by the column driver 1308 in response to the column address decoder 1310. Analog pixel image data signals are forwarded by the column driver 1308 to sample/hold circuitry 1314. The sampled and held analog image data signal is forwarded to the analog-to-digital converter (ADC)

1316 where the analog image data is converted to digital format. The ADC 1316 may include any of the embodiments of DDR counters of the inventive concept described herein in using correlated double sampling (CDS) to perform the analog-to-digital conversion. The converted digital data signal is forwarded by the ADC 1316 to image signal processing (ISP) circuitry 1318 and then to a serializer 1320. The signal can then be output to peripheral devices.

Figure 25:
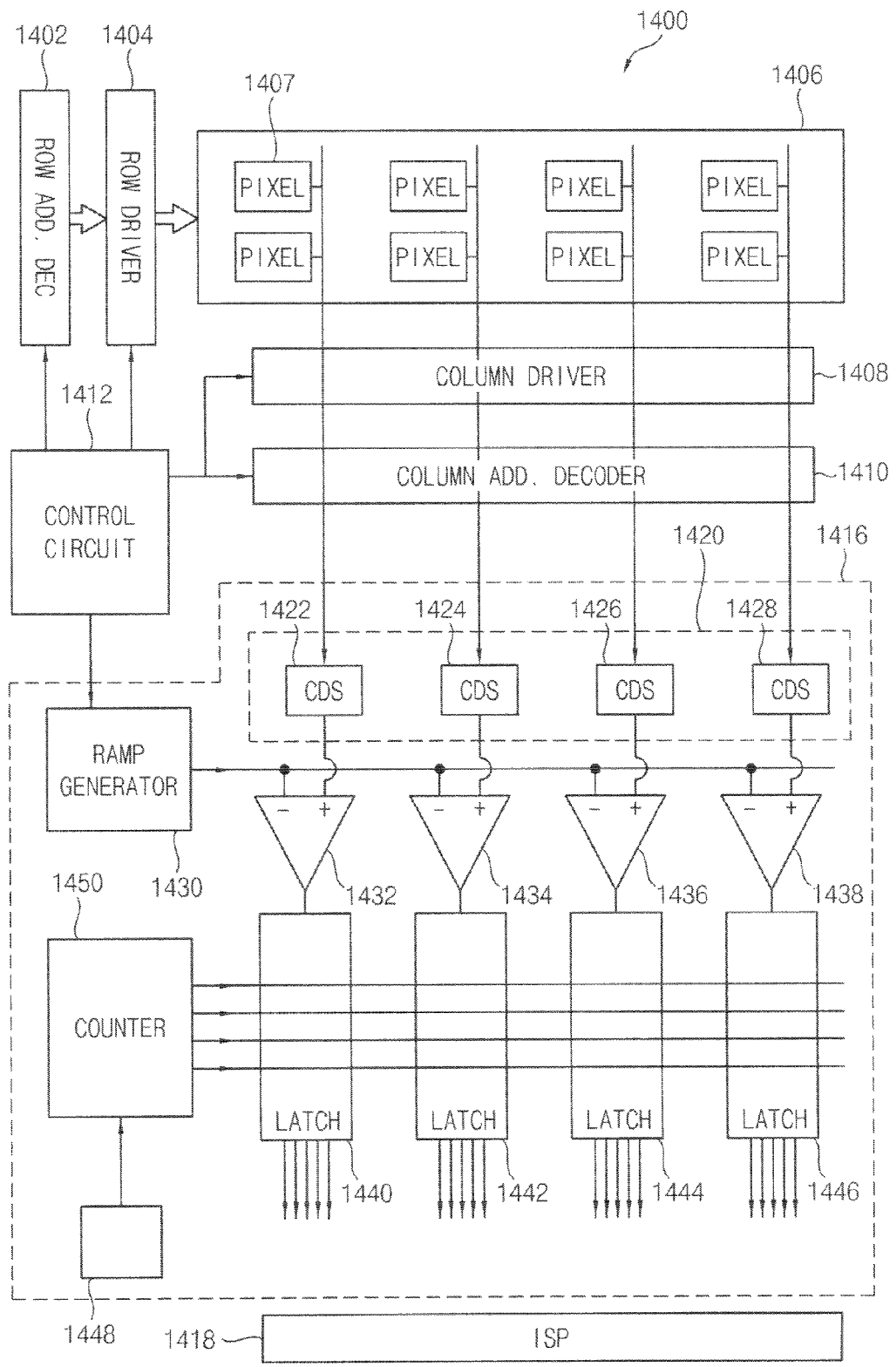
FIG. 25 is a schematic block diagram of a CMOS image sensor using column analog-to-digital conversion, according to another embodiment of the inventive concept.

FIG. 25 is a schematic block diagram of a CMOS image sensor using column analog-to-digital conversion, according to another embodiment of the inventive concept. Referring to FIG. 25, the CMOS image sensor 1400 includes a pixel array 1406 for storing pixel data for an image in a two-dimensional array or matrix of rows and columns of pixels 1407. The sensor 1400 is controlled by a control circuit 1412, which controls pixel row and column addressing. To that end, the control circuit 1412 is coupled to a row address decoder 1402 and a column address decoder 1410. The control circuit 1412 controls the address decoders for selecting the appropriate row and column lines for pixel readout and the row and column driver circuitry 1404 and 1408, which apply driving voltages to the drive transistor of the selected row and column lines. The row address decoder 1402 decodes pixel row addresses from the control circuit 1412 and addresses the decoded array rows via the row driver 1404. The column address decoder 1410 decodes pixel column addresses from the control circuit 1412 and addresses the decoded array columns via the column driver 1408. Pixels in each row in the array can all turn on at the same time by a row select line, and the pixel of each column are selectively output by a column select line. The row lines are selectively activated by the row driver 1404 in response to the row address decoder 1402, and the column select lines are selectively activated by the column driver 1408 in response to the column address decoder 1410. Analog pixel image data signals are forwarded by the column driver 1408 to sample/hold circuitry in the form of CDS circuitry 1420 in the analog-to-digital converter (ADC) circuitry 1416 where the analog image data is converted to digital format. The ADC 1416 includes, for each column, CDS circuitry 1422, 1424, 1426, 1428, which provide the sampled and held analog image data signal to the noninverting inputs of comparators 1432, 1434, 1436, 1438, respectively. A ramp generator circuit 1430 provides the ramp signal of the analog-to-digital conversion to the inverting inputs of the comparators 1432, 1434, 1436, 1438. Under the control of a counter enable or counter control circuit 1448, the counter 1450 performs the analog-to-digital conversion counting while the ramp voltage signal and the analog image data signal from the CDS circuits 1422, 1424, 14226, 1428 are compared by the comparators 1432, 1434, 1436, 1438, respectively. Each column is provided with its own counter 1450, and the counter 1450 can be any of the embodiments of DDR counters described herein in connection with the inventive concept. When the analog-to-digital conversion using CDS is complete, the digital value in the counter 1450 representing the conversion value is stored for each column in latches or buffers 1440, 1442, 1444, 1446. The converted digital data signal is forwarded by the ADC 1416 to image signal processing (ISP) circuitry 1418 and then to a serializer. The signal can then be output to peripheral devices.

Figure 26A:
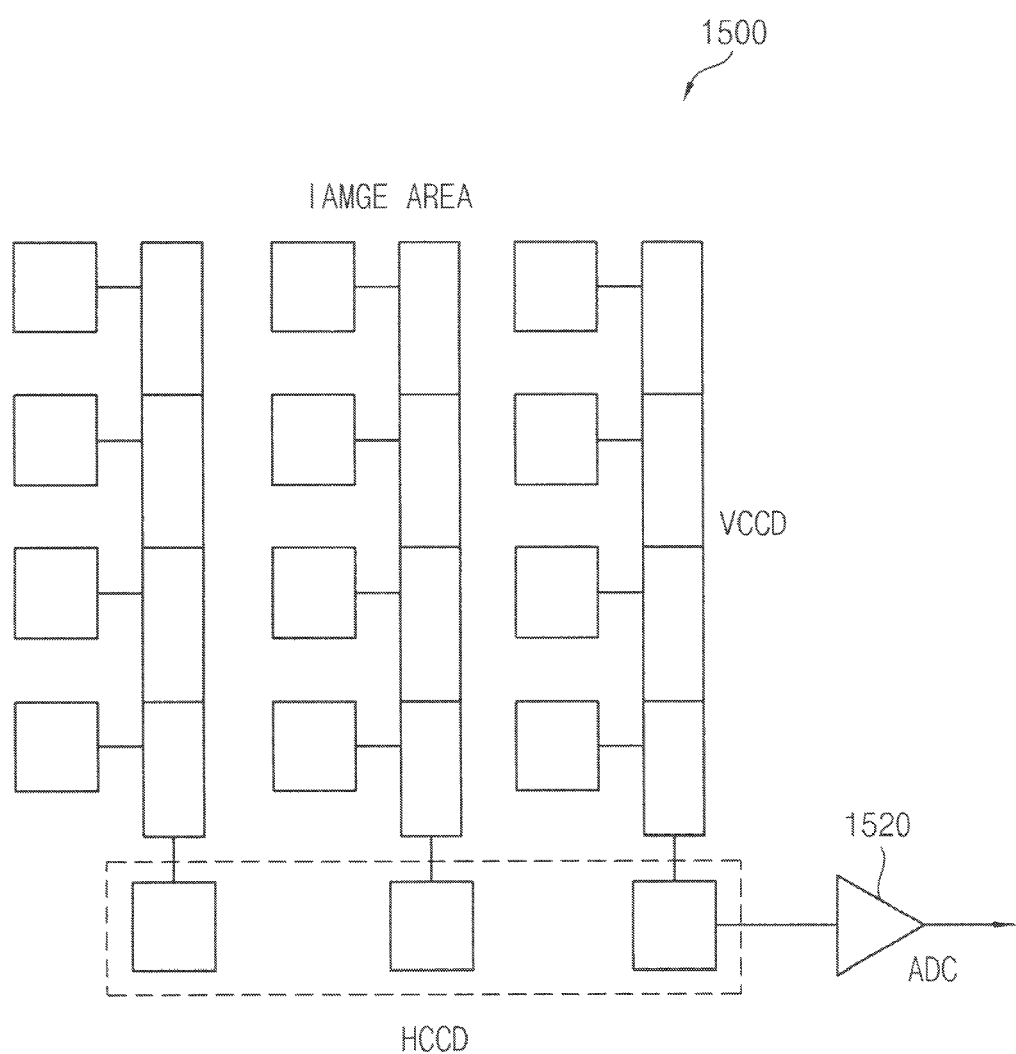
FIGS. 26A-26C include schematic functional block diagrams of CCD systems using the analog-to-digital conversion and DDR counting of the inventive concept.
Figure 26B:
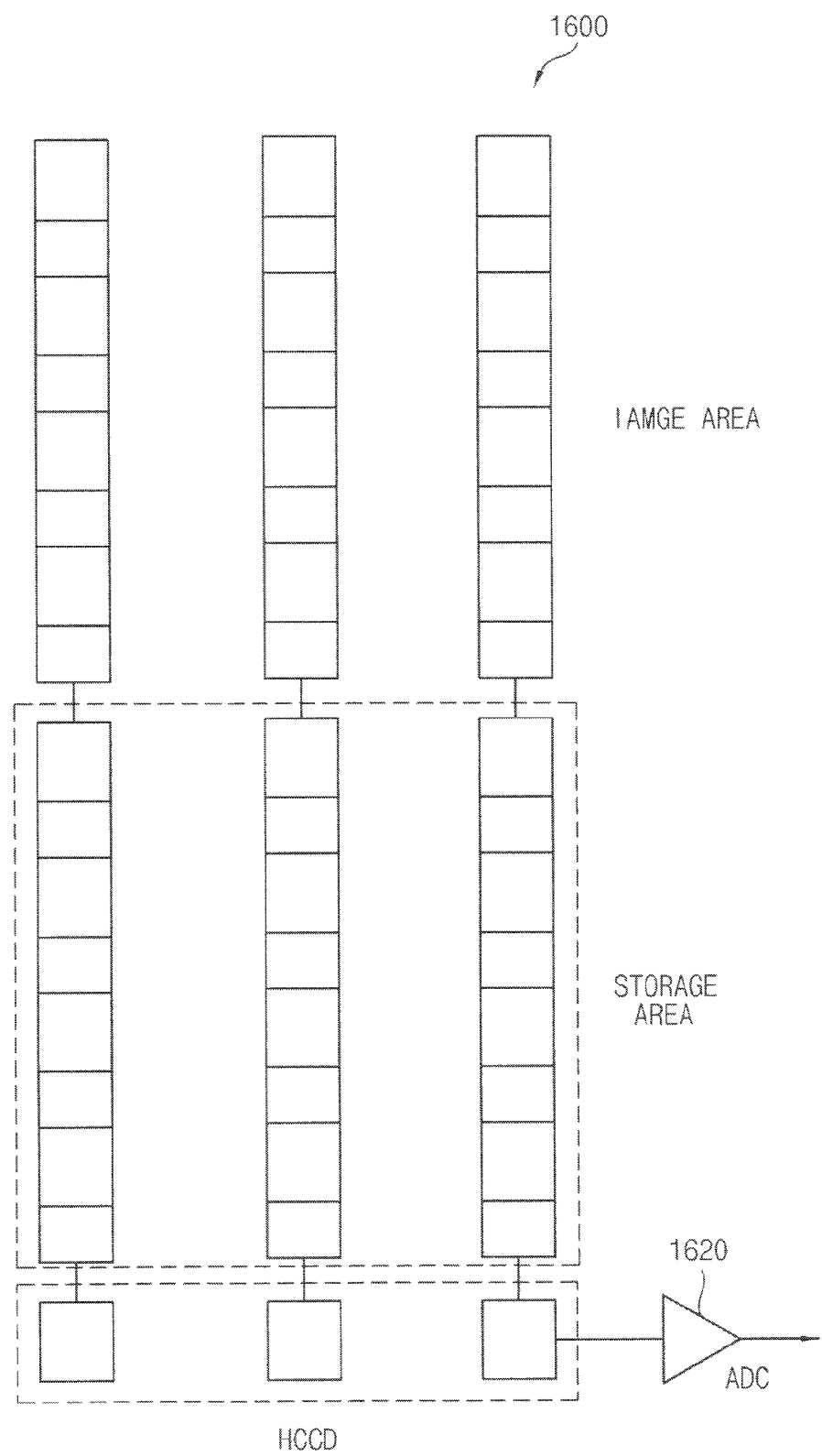
Figure 26C:
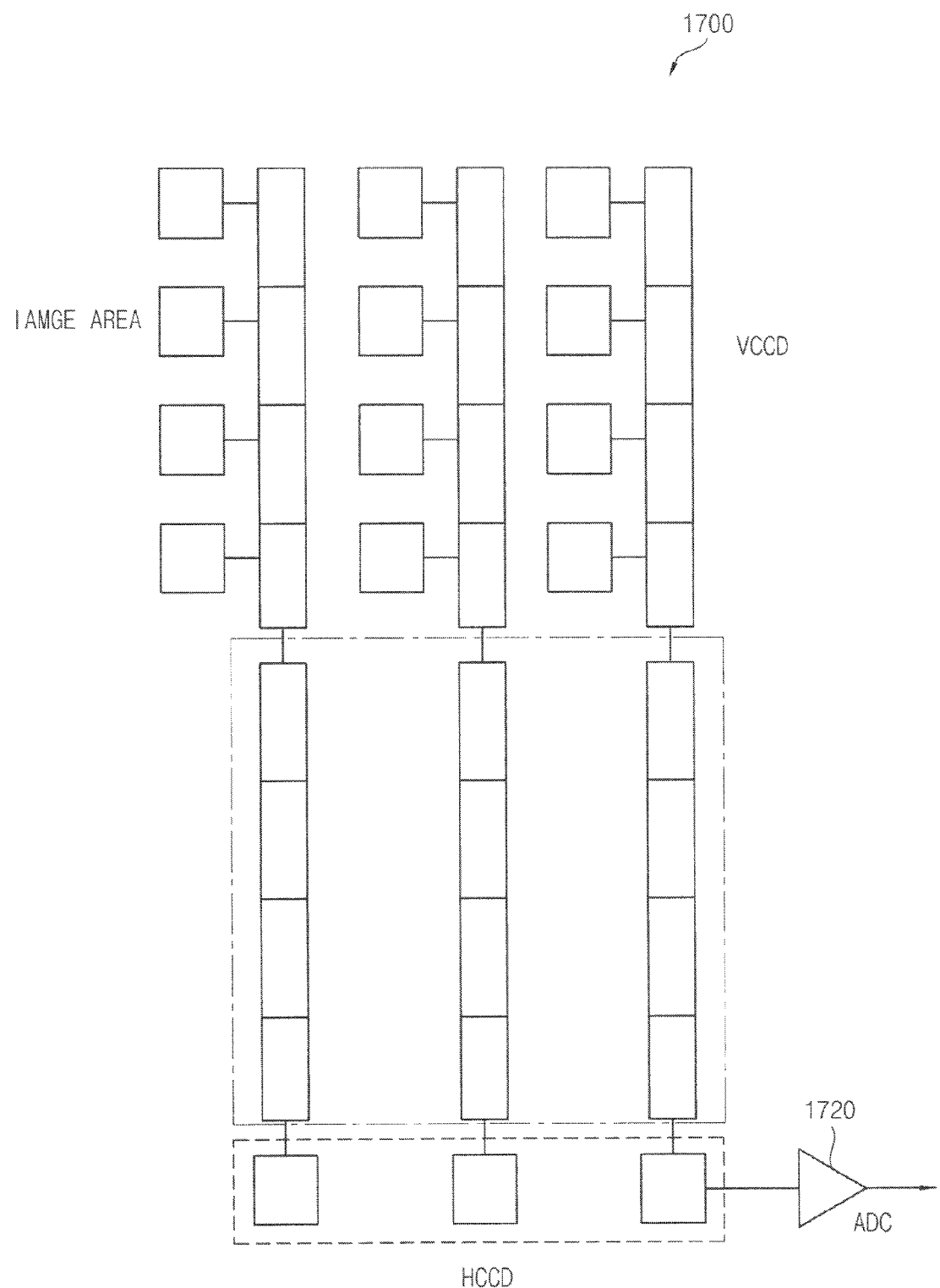

The DDR counters and analog-to-digital conversion using CDS according to the inventive concept are also applicable to charge-coupled devices (CCDs). FIGS. 26A-26C include schematic functional block diagrams of CCD systems using the analog-to-digital conversion and DDR counting of the inventive concept. It should be noted that any of the embodiments of DDR counters described herein are applicable to the CCD systems of FIGS. 26A-26C. The various CCD systems of FIGS. 26A-26C are distinguished by their methods of transferring charge. The system 1500 of FIG. 26A utilizes interline transfer; the system of FIG. 26B utilizes frame transfer; and the system 1700 of FIG. 26C utilizes frame interline transfer. Each of the systems includes an array of CCDs, referred to in the figures as "image areas" 1510, 1610, 1710. The analog image data from the image areas is read out and transferred for processing to ADCs 1520, 1620, 1720. The ADC circuitry and processes 1520, 1620, 1720 shown in FIGS. 1500, 1600, 1700 can be of the type described herein in connection with the various embodiments of ADC using CDS, and are applicable to single ADC, as opposed to column ADC. The counters used in the ADC circuits and processes can be any of the DDR counters described herein in connection with the various embodiments.

Figure 27:
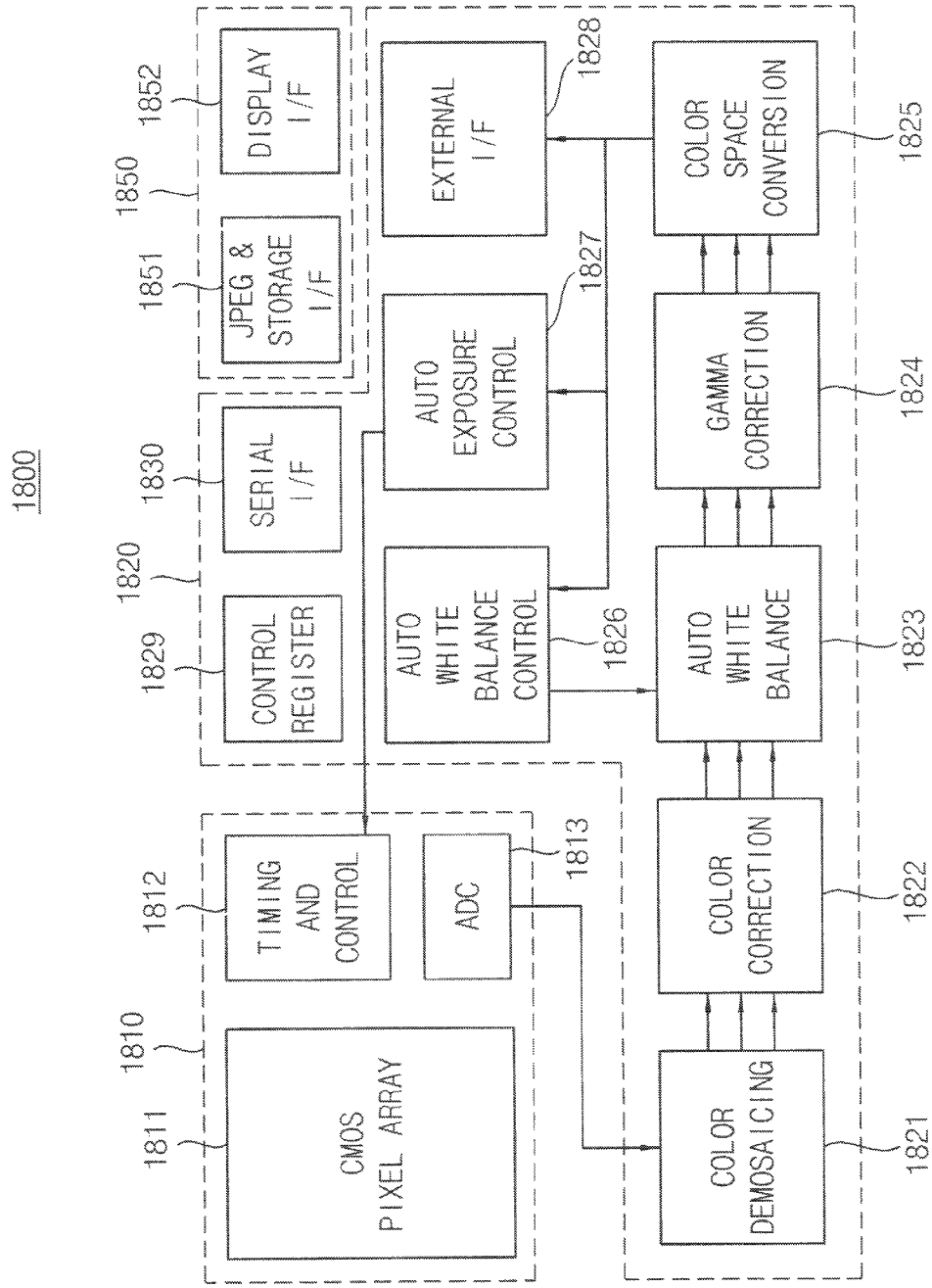
FIG. 27 contains a schematic block diagram of an image signal processing system according to embodiments of the inventive concept.

FIG. 27 contains a schematic block diagram of an image signal processing system 1800 according to embodiments of the inventive concept. Referring to FIG. 27, the image signal processing system 1800 includes an image sensor block 1810, an image processor 1820 and external devices 1850. The image sensor block 1810 includes a CMOS pixel array 1811, timing and control circuitry 1812 and ADC circuitry 1813. The ADC 1813 can be any of the embodiments of ADC circuitry described herein in connection with the various embodiments of the inventive concept. The ADC 1813 can include any of the embodiments of DDR counters used in analog-to-digital conversion performing CDS described herein.

The external devices can include JPEG and storage interface 1851 and display interface 1852.

The image processor 1820 can include various functional components such as color demosaicing 1821, color correction 1822, auto white balance 1823, gamma correction 1824, color space conversion 1825, auto white balance control 1826, auto exposure control 1827, a control register 1829, a serial interface 1830 and an external interface 1828. The output of the ADC 1813, generated in accordance with the inventive concept as described herein, is forwarded to the image processor 1830, specifically, the color demosaicing 1821, for example, for further processing.

Figure 28:
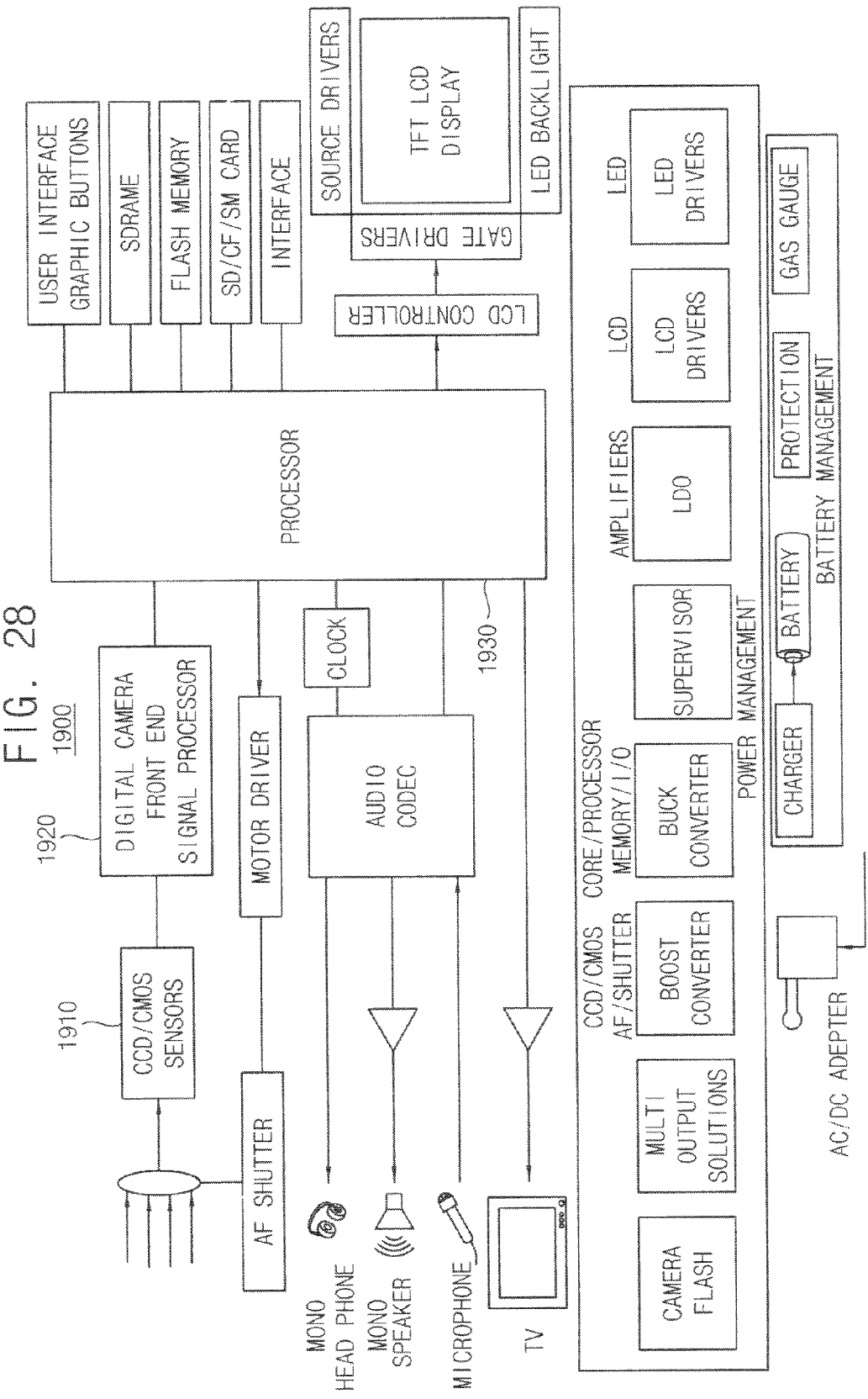
FIG. 28 contains a schematic block diagram of a digital still camera according to embodiments of the inventive concept.

FIG. 28 contains a schematic block diagram of a digital still camera according to embodiments of the inventive concept. Referring to FIG. 28, the digital still camera 1900 includes an array of CCD or CMOS sensors or pixels 1910, which are connected to a digital camera front end signal processor 1920. The front end signal processor 1920 is connected to a processor 1930. The digital still camera 1900 includes various other components as illustrated in FIG. 28. The front end signal processor 1920 and/or the processor 1930 contain the ADC circuitry performing the analog-to-digital conversion using dual CDS using any of the various embodiments of DDR counters described herein in connection with the inventive concept.

Figure 29:
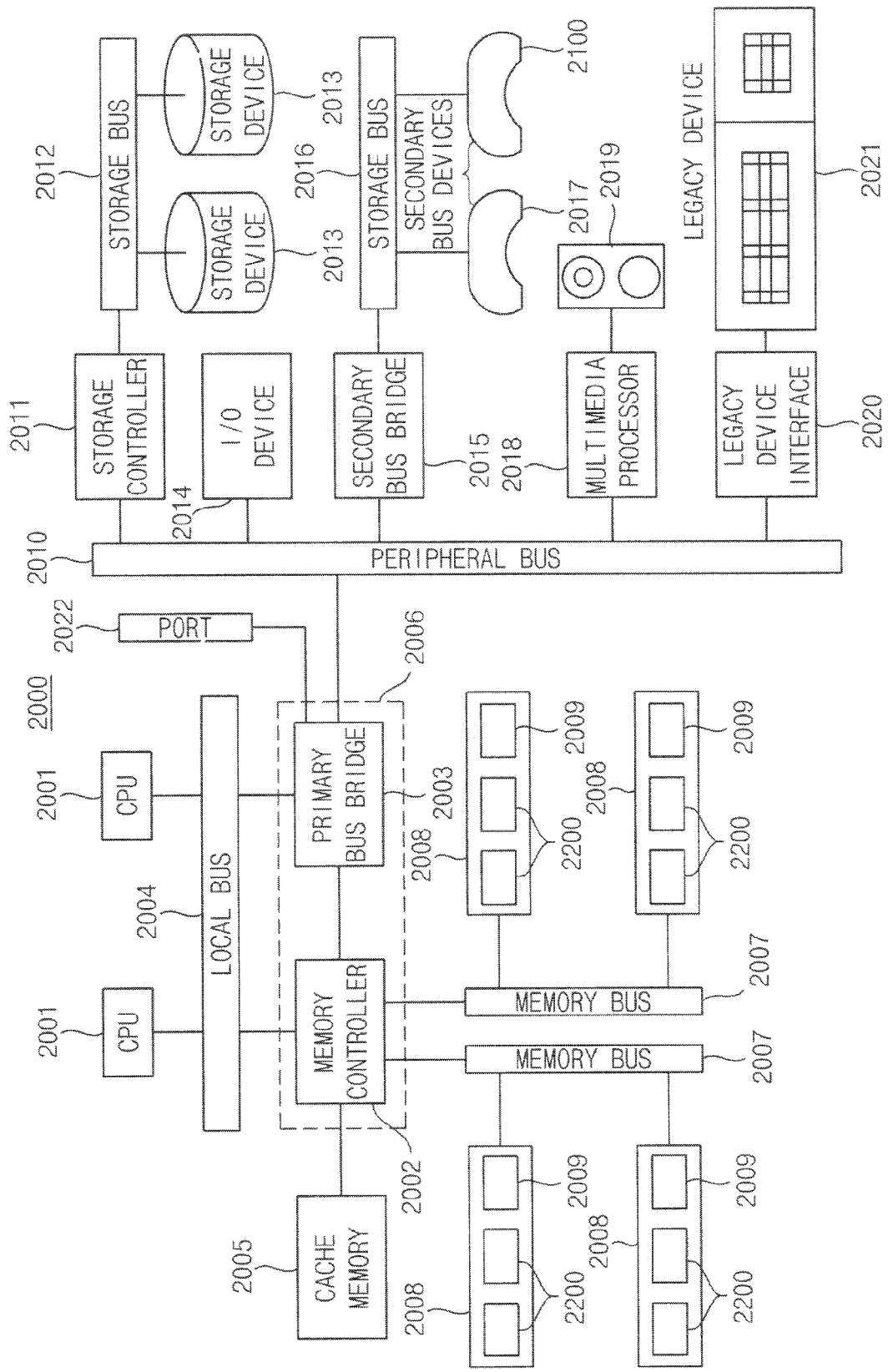
FIG. 29 contains a schematic block diagram of a general processing system according to embodiments of the inventive concept.

FIG. 29 contains a schematic block diagram of a general processing system according to embodiments of the inventive concept. The general processing system 2000 of FIG. 29 may be, or may be used in, for example, a computer system, a camera system, a scanning system, a machine vision system, a vehicle navigation system, a video telephone system, a surveillance camera system, and auto focus system, a star tracker system, a motion detection system, an image stabilization system, a medical imaging device or system, a data compression system for high-definition television, or other such system. All of these systems can be configured to include or use the present inventive concept as described herein.

Referring to FIG. 29, the processing system 2000 includes one or more CPUs 2001 connected to a local bus 2004. Also connected to the local bus 2004 is a device 2006 which can include one or more memory controllers 2002 and/or one or more primary bus bridges 2003, which can be integrated as a single device 2006 as shown or can be separate devices. A cache memory 2005 interfaces with the memory controller 2002, and can be the only cache memory in the system 2000. Alternatively, other devices, for example, CPUs 2001, may also include cache memories, which may form a cache hierarchy with cache memory 2005. Where the processing system 2000 includes peripherals or controllers which are bus masters or which support direct memory access (DMA), the memory controller 2002 may implement a cache coherency protocol. The memory controller 2002 is also interfaced with one or more memory buses 2007, which interface with one or more memory components 2008, which may include one or more memory devices 2200 and 2009. The plurality of memory buses 2007 may be operated in parallel, or different address ranges may be mapped to different memory buses 2007. The memory components may be, for example, memory cards and/or memory modules. The memory modules can be, for example, single inline memory modules (SIMMs) and/or dual inline memory modules (DIMMs). In the case of SIMM or DIMM, the additional devices 2009 may be a configuration memory, such as a serial presence detect (SPD) memory.

The primary bus bridge 2003 is connected to at least one peripheral bus 2010. Various devices, such as peripherals or additional bus bridges, may be coupled to the peripheral bus 2010. These other devices may include a storage controller 2011, a miscellaneous I/O device 2014, a secondary bus bridge 2015, a multimedia processor 2018, and/or a legacy device interface 2020. The primary bus bridge 2003 may also be connected to one or more special purpose high-speed ports 2022. In a personal computer, for example, the special purpose port might be an accelerated graphics port (AGP), used to couple a high-performance video card to the processing system 2000.

The storage controller 2011 can couple one or more storage devices 2013, via a storage bus 2012, to the peripheral bus 2010. For example, the storage controller 2011 may be a SCSI controller and storage devices 2013 may be SCSI discs.

The I/O device 2014 can be any sort of peripheral. For example, the IO device 2014 may be a local area network interface, such as an Ethernet card.

The secondary bus bridge 2015 may be used to interface additional devices via another bus to the processing system 2000. For example, the secondary bus bridge 2015 may be a universal serial port (USB) controller used to couple USB devices 2017, 2100, including, for example, an image pick-up device, such as a CCD, CMOS image sensor, digital still camera according to embodiments of the inventive concept, to the processing system 2000.

The multimedia processor 2018 may be a sound card, a video capture card, or any other type of media interface, which may be coupled to additional deices, such as speakers 2019.

The legacy device interface 2020 can be used to couple legacy devices 2021 to the system 2000. For example, older-style keyboards and mice can be coupled to the system 2000 via the legacy device interface 2020.

The processing system 2000 illustrated in FIG. 29 is only an exemplary processing system with which the inventive concept may be used. While FIG. 29 illustrates a processing architecture especially suitable for a general purpose computer, such as a personal computer or a workstation, it should be recognized that well-known modifications can be made to configure the processing system 2000 to become more suitable for use in a variety of applications. For example, many electronic devices that require processing may be implemented using a simpler architecture, which relies on a CPU 2001, coupled to memory components 2008 and/or memory devices 2200. These electronic devices may include, but are not limited to, audio/video processors and recorders, gaming consoles, digital television sets, wired or wireless telephones, navigation devices (including systems based on the global positioning system (GPS) and/or inertial navigation), and digital cameras and/or recorders. The modifications may include, for example, elimination of unnecessary components, addition of specialized devices or circuits, and/or integration of a plurality of devices.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A double data rate (DDR) counter, comprising:
a first stage for generating a least significant bit (LSB) of a plurality of bits of the counter;
at least one second stage for generating another bit of the plurality of bits of the counter; and
an input clock signal applied to a data input of the first stage and a clock input of the second stage.

2. The DDR counter of claim 1, wherein the stages of the counter are edge-triggered on one of the rising edge and the falling edge of a signal applied to respective clock inputs of the stages.

3. The DDR counter of claim 2, wherein the stages are positive edge-triggered or negative edge-triggered.

4. The DDR counter of claim 1, further comprising a plurality of second stages for generating a plurality of other bits of the counter.

5. The DDR counter of claim 1, further comprising a circuit for determining a value of a count in the counter and selecting one of a plurality of clock signals for a second counting process of the counter.

6. The DDR counter of claim 5, wherein the plurality of clock signals includes an inverted clock signal and a non-inverted clock signal.

7. The DDR counter of claim 1, wherein the counter is a ripple counter.

8. The DDR counter of claim 1, further comprising a count stop circuit for stopping counting of the counter.

9. The DDR counter of claim 8, wherein the count stop circuit comprises a multiplexer for selecting one of the positive and negative outputs of the second stage to be used in generating the LSB of the plurality of bits.

10. The DDR counter of claim 9, wherein the selection by the multiplexer is made in response to an input signal.

11. The DDR counter of claim 10, wherein the input signal can have one of two possible states, the selection by the multiplexer being made in response to the input signal changing states.

12. The DDR counter of claim 1, wherein the counter is one of a bit-wise inversion counter and an up/down counter.

13. The DDR counter of claim 12, wherein the counter comprises a storage circuit for storing a status of the LSB of the plurality of bits.

14. An analog-to-digital converter (ADC) using correlated double sampling, the ADC comprising:
 an input for receiving an input signal; and
 a double data rate (DDR) counter comprising:
 a first stage for generating a least significant bit (LSB) of a plurality of bits of the counter;
 at least one second stage for generating another bit of the plurality of bits of the counter; and
 an input clock signal applied to a data input of the first stage and a clock input of the second stage; wherein
 a value in the DDR counter is related to an analog-to-digital conversion of the input signal.

15. The ADC of claim 14, wherein the stages of the counter are edge-triggered an one of the rising edge and the falling edge of a signal applied to respective clock inputs of the stages.

16. The ADC of claim 15, wherein the stages are positive edge-triggered or negative edge-triggered.

17. The ADC of claim 14, wherein the counter further comprises a plurality of second stages for generating a plurality of other bits of the counter.

18. The ADC of claim 14, wherein the counter further comprises a circuit for determining a value of a count in the counter and selecting one of a plurality of clock signals for a second counting process of the counter.

19. A CMOS image sensor, comprising:
 a pixel array; and
 an analog-to-digital converter (ADC) comprising a double data rate (DDR) counter, the DDR counter comprising:
 a first stage for generating a least significant bit (LSB) of a plurality of bits of the counter;
 at least one second stage for generating another bit of the plurality of bits of the counter; and
 an input clock signal applied to a data input of the first stage and a clock input of the second stage.

20. The CMOS image sensor of claim 19, wherein the stages of the counter are edge-triggered on one of the rising edge and the falling edge of a signal applied to respective clock inputs of the stages.

21. The CMOS image sensor of claim 20, wherein the stages are positive edge-triggered or negative edge-triggered.

22. The CMOS image sensor of claim 19, wherein the counter further comprises a plurality of second stages for generating a plurality of other bits of the counter.

23. The CMOS image sensor of claim 22, wherein the counter further comprises a circuit for determining a value of a count in the counter and selecting one of a plurality of clock signals for a second counting process of the counter.

24. A method of counting in a double data rate (DDR) counter, comprising:
 generating a least significant bit (LSB) of a plurality of bits of the counter in a first stage of the counter;
 generating another bit of the plurality of bits of the counter in at least one second stage of the counter; and
 applying an input clock signal to a data input of the first stage and a clock input of the second stage.

25. The method of claim 24, wherein the stages of the counter are edge-triggered on one of the rising edge and the falling edge of a signal applied to respective clock inputs of the stages.

26. The method of claim 25, wherein the stages are positive edge-triggered or negative edge-triggered.

27. The method of claim 24, further comprising generating a plurality of other bits of the counter in a plurality of second stages of the counter.

28. The method of claim 24, further comprising determining a value of a count in the counter and selecting one of a plurality of clock signals for a second counting process of the counter.

29. The method of claim 24, further comprising filtering a glitch using the counter.

30. The DDR counter of claim 1, wherein the first stage latches a logic level of the input clock signal at an end of counting to generate the LSB such that the LSB does not toggle during the counting.

* * * * *